United States Patent
O'Brien et al.

(10) Patent No.: US 11,768,438 B2
(45) Date of Patent: *Sep. 26, 2023

(54) SPECTRAL FEATURE SELECTION AND PULSE TIMING CONTROL OF A PULSED LIGHT BEAM

(71) Applicant: Cymer, LLC, San Diego, CA (US)

(72) Inventors: Kevin Michael O'Brien, San Diego, CA (US); Thomas Patrick Duffey, San Diego, CA (US); Joshua Jon Thornes, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/971,103

(22) Filed: Oct. 21, 2022

(65) Prior Publication Data

US 2023/0040812 A1 Feb. 9, 2023

Related U.S. Application Data

(63) Continuation of application No. 16/980,467, filed as application No. PCT/US2019/020415 on Mar. 1, 2019, now Pat. No. 11,526,083.

(Continued)

(51) Int. Cl.
*G03F 7/20* (2006.01)
*G03F 7/00* (2006.01)
(Continued)

(52) U.S. Cl.
CPC ...... *G03F 7/70041* (2013.01); *G03F 7/70575* (2013.01); *H01S 3/073* (2013.01);
(Continued)

(58) Field of Classification Search
CPC .... G03F 7/70; G03F 7/70025; G03F 7/70041; G03F 7/70191; G03F 7/70483–70541;
(Continued)

(56) References Cited

U.S. PATENT DOCUMENTS

| 4,601,036 A | 7/1986 | Faxvog et al. |
| 6,671,294 B2 | 12/2003 | Kroyan et al. |

(Continued)

FOREIGN PATENT DOCUMENTS

| CN | 102334249 A | 1/2012 |
| CN | 106462081 A | 2/2017 |

(Continued)

OTHER PUBLICATIONS

Lee W. Young, U.S. International Searching Authority, International Search Report and Written Opinion, corresponding PCT Application No. PCT/US2019/020415, dated May 16, 2019, 14 pages total.

(Continued)

*Primary Examiner* — Christina A Riddle
(74) *Attorney, Agent, or Firm* — DiBerardino McGovern IP Group LLC

(57) ABSTRACT

A method includes driving, while producing a burst of pulses at a pulse repetition rate, a spectral feature adjuster among a set of discrete states at a frequency correlated with the pulse repetition rate; and in between the production of the bursts of pulses (while no pulses are being produced), driving the spectral feature adjuster according to a driving signal defined by a set of parameters. Each discrete state corresponds to a discrete value of a spectral feature. The method includes ensuring that the spectral feature adjuster is in one of the discrete states that corresponds to a discrete value of the spectral feature of the amplified light beam when a pulse in the next burst is produced by adjusting one or more of: an instruction to the lithography exposure apparatus, the driving signal to the spectral feature adjuster, and/or the instruction to the optical source.

20 Claims, 21 Drawing Sheets

Related U.S. Application Data

(60) Provisional application No. 62/663,308, filed on Apr. 27, 2018, provisional application No. 62/650,896, filed on Mar. 30, 2018.

(51) Int. Cl.
  *H01S 3/07* (2006.01)
  *H01S 3/08* (2023.01)
  *H01S 3/11* (2023.01)
  *H01S 3/13* (2006.01)
  *H01S 3/137* (2006.01)
  *H01S 3/23* (2006.01)

(52) U.S. Cl.
  CPC ............ *H01S 3/08009* (2013.01); *H01S 3/11* (2013.01); *H01S 3/1305* (2013.01); *H01S 3/137* (2013.01); *H01S 3/2308* (2013.01)

(58) Field of Classification Search
  CPC ... G03F 7/7055–70583; G03F 7/70008; G03F 7/70575; G03F 7/7085; H01S 3/005; H01S 3/0057; H01S 3/0078; H01S 3/0085; H01S 3/10; H01S 3/10046; H01S 3/073; H01S 3/08009; H01S 3/11; H01S 3/1305; H01S 3/137; H01S 3/2308; H01S 3/036; H01S 3/106; H01S 3/225; H01S 3/08004; H01S 3/10038
  USPC ........ 355/30, 52–55, 67–77; 372/20, 25, 28, 372/32
  See application file for complete search history.

(56) References Cited

U.S. PATENT DOCUMENTS

| | | | |
|---|---|---|---|
| 6,735,225 B2 | 5/2004 | Albrecht et al. | |
| 6,829,040 B1 | 12/2004 | Kye et al. | |
| 6,853,653 B2 | 2/2005 | Spangler et al. | |
| 7,039,086 B2 | 5/2006 | Fallon et al. | |
| 7,088,758 B2 | 8/2006 | Sandstrom et al. | |
| 7,154,928 B2 | 12/2006 | Sandstrom et al. | |
| 7,158,553 B2 | 1/2007 | Govorkov et al. | |
| 7,256,870 B2 | 8/2007 | Finders | |
| 7,286,207 B2 | 10/2007 | Nölscher et al. | |
| 7,525,638 B2 | 4/2009 | Buurman et al. | |
| 7,534,552 B2 | 5/2009 | De Kruif et al. | |
| 7,612,868 B2 | 11/2009 | Tsuchiya | |
| 7,965,387 B2 | 6/2011 | Hagiwara | |
| 8,309,885 B2 | 11/2012 | Peng et al. | |
| 8,705,004 B2 | 4/2014 | Butler et al. | |
| 8,938,694 B2 | 1/2015 | Liu et al. | |
| 8,989,225 B2 | 3/2015 | Kakizaki et al. | |
| 9,207,119 B2 | 12/2015 | Rokitski et al. | |
| 9,235,136 B2 | 1/2016 | Epple | |
| 9,599,510 B2 | 3/2017 | Duffey et al. | |
| 9,989,866 B2 | 6/2018 | Mason et al. | |
| 11,526,083 B2* | 12/2022 | O'Brien | H01S 3/2308 |
| 2002/0167975 A1 | 11/2002 | Spangler et al. | |
| 2003/0016708 A1 | 1/2003 | Albrecht et al. | |
| 2003/0178583 A1 | 9/2003 | Kampherbeek et al. | |
| 2004/0057489 A1 | 3/2004 | Fallon et al. | |
| 2005/0078292 A1 | 4/2005 | Bruebach | |
| 2005/0083983 A1* | 4/2005 | Sandstrom | H01S 3/005 372/55 |
| 2005/0286598 A1 | 12/2005 | Sandstrom et al. | |
| 2006/0114956 A1 | 6/2006 | Sandstrom et al. | |
| 2006/0261050 A1 | 11/2006 | Krishnan et al. | |
| 2007/0013889 A1 | 1/2007 | Jorritsma et al. | |
| 2007/0260419 A1 | 11/2007 | Hagiwara | |
| 2009/0002666 A1 | 1/2009 | Tsuchiya | |
| 2010/0177794 A1 | 7/2010 | Peng et al. | |
| 2014/0195993 A1 | 7/2014 | Liu et al. | |
| 2014/0319388 A1* | 10/2014 | Moriya | H01S 3/2316 359/349 |
| 2015/0308893 A1 | 10/2015 | Walters | |
| 2016/0380402 A1 | 12/2016 | O'Brien et al. | |
| 2017/0176879 A1 | 6/2017 | Witte et al. | |
| 2017/0187160 A1 | 6/2017 | Lowder et al. | |
| 2018/0109068 A1 | 4/2018 | Conley et al. | |
| 2018/0123312 A1* | 5/2018 | Furusato | H01S 3/11 |
| 2018/0254600 A1 | 9/2018 | Kumazaki et al. | |

FOREIGN PATENT DOCUMENTS

| | | |
|---|---|---|
| CN | 107735913 A | 2/2018 |
| JP | S5984487 A | 5/1984 |
| JP | H02307285 A | 12/1990 |
| JP | 2005501399 A | 1/2005 |
| JP | 2011249832 A | 12/2011 |
| TW | 200512546 A | 4/2005 |
| TW | 201725355 A | 7/2017 |
| WO | 2003096492 A2 | 11/2003 |
| WO | 2008052153 A2 | 5/2008 |
| WO | 2009018664 A2 | 2/2009 |
| WO | 2016209669 A1 | 12/2016 |
| WO | 2017026000 A1 | 2/2017 |
| WO | 2017098625 A1 | 6/2017 |
| WO | 2019079010 A1 | 4/2019 |

OTHER PUBLICATIONS

Bruno Olshausen, "Aliasing," Psychology 129—Sensory Processes, The University of California, Davis, available at http://www.rctn.org/bruno/psc129/handouts/aliasing.pdf, Oct. 10, 2000.
Office Action, counterpart Japanese Patent Application No. 2020-545695, dated Nov. 11, 2021, 4 pages total (including English translation of 2 pages).
Office Action and Search Report, counterpart Chinese Patent Application No. 201980023674.4, dated Feb. 11, 2023, 9 pages total (including partial English translation of 3 pages).

\* cited by examiner

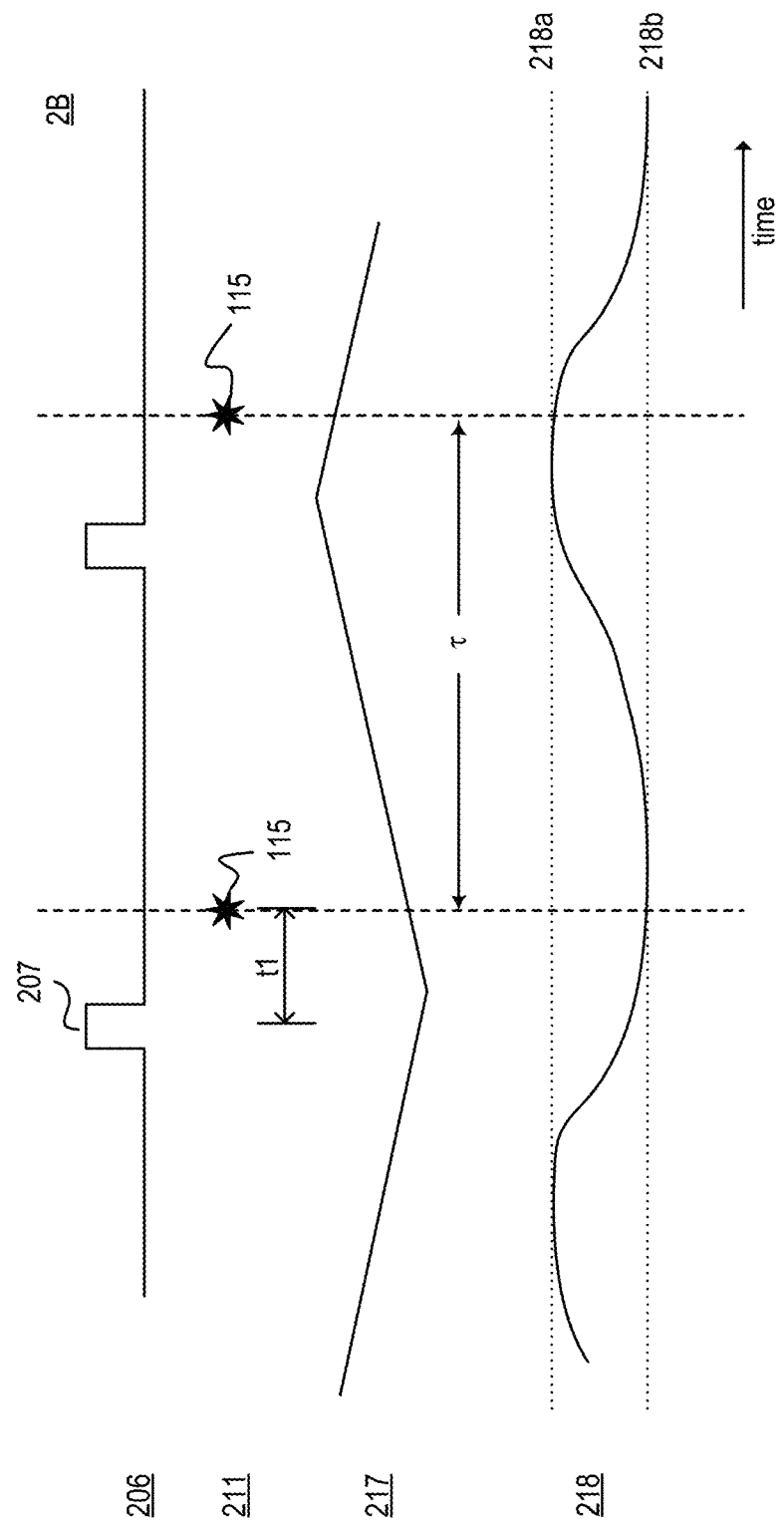

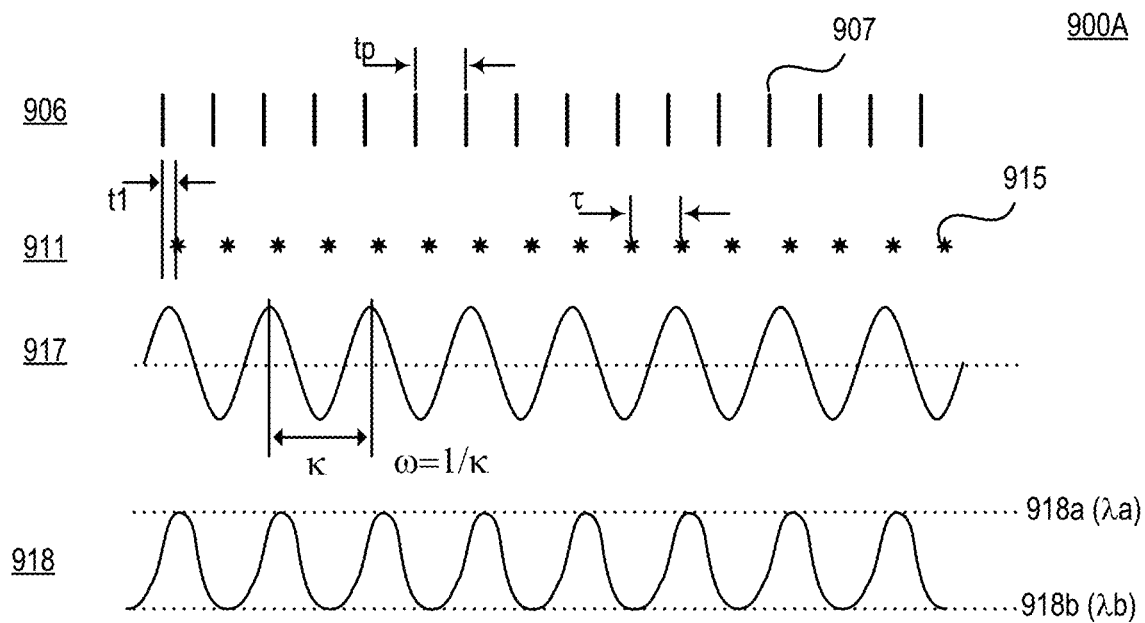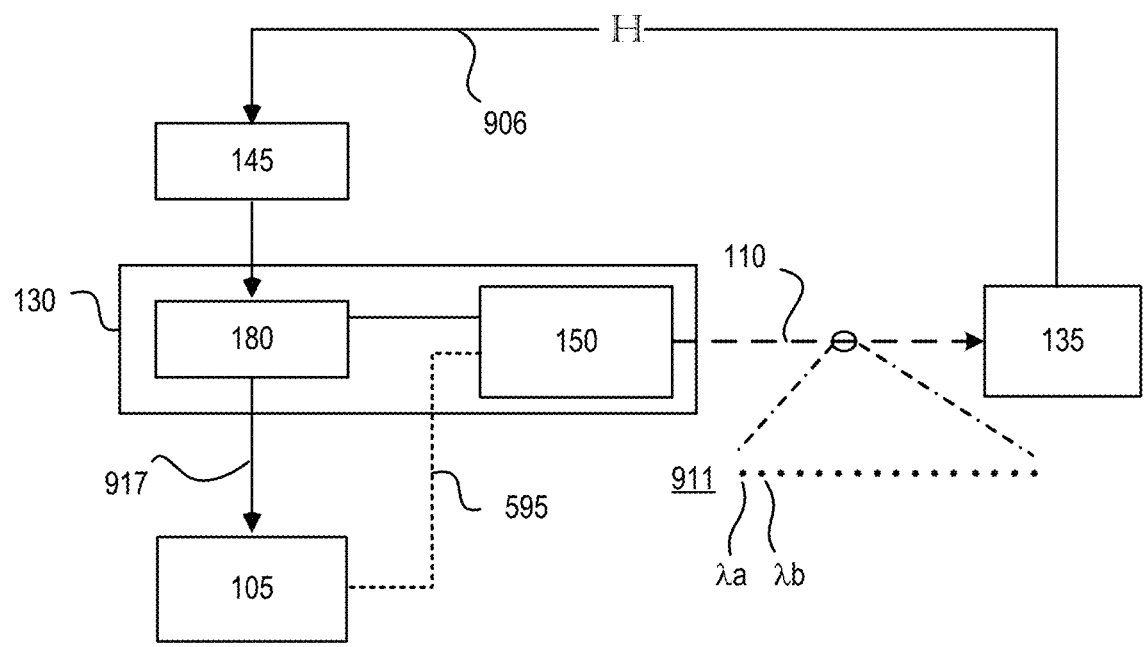
Fig. 9

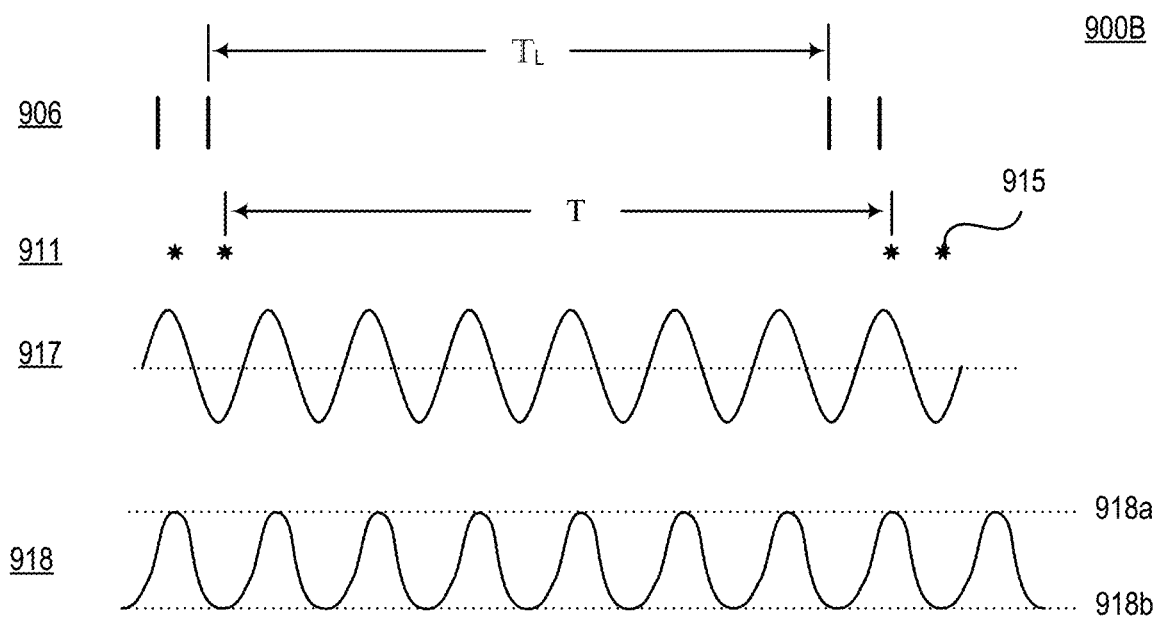
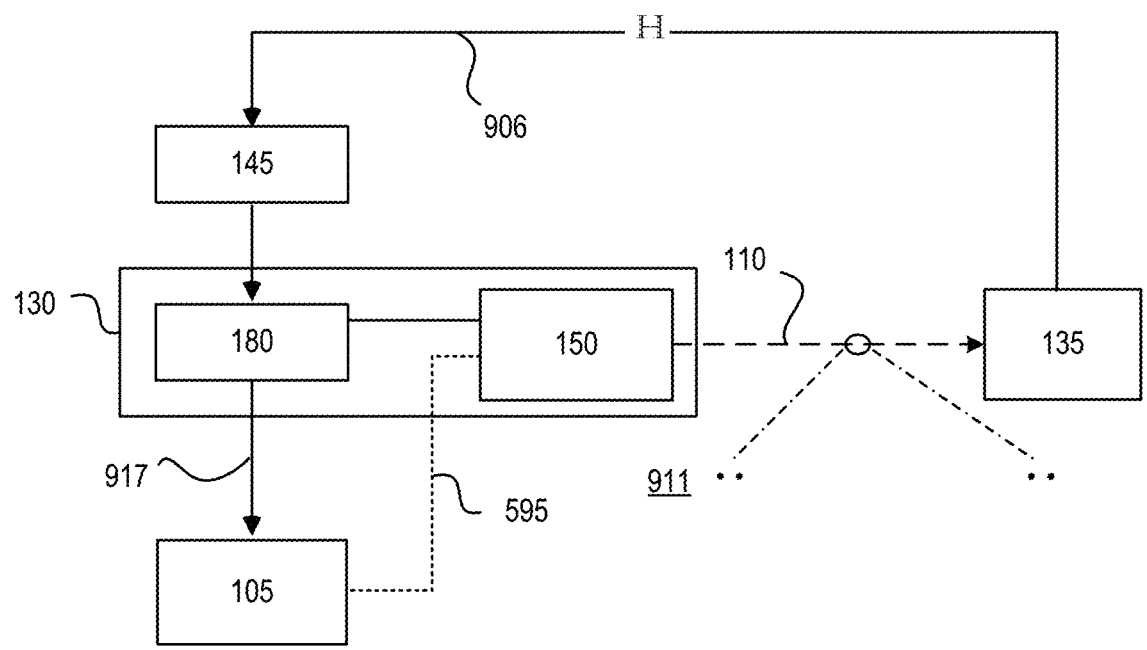
Fig. 10

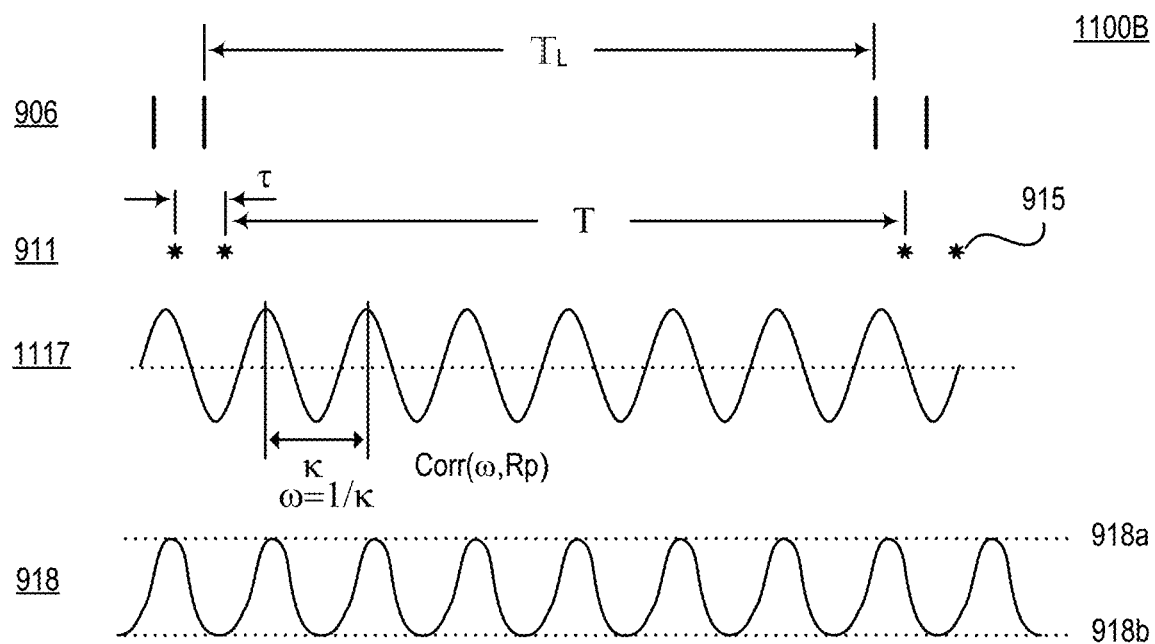
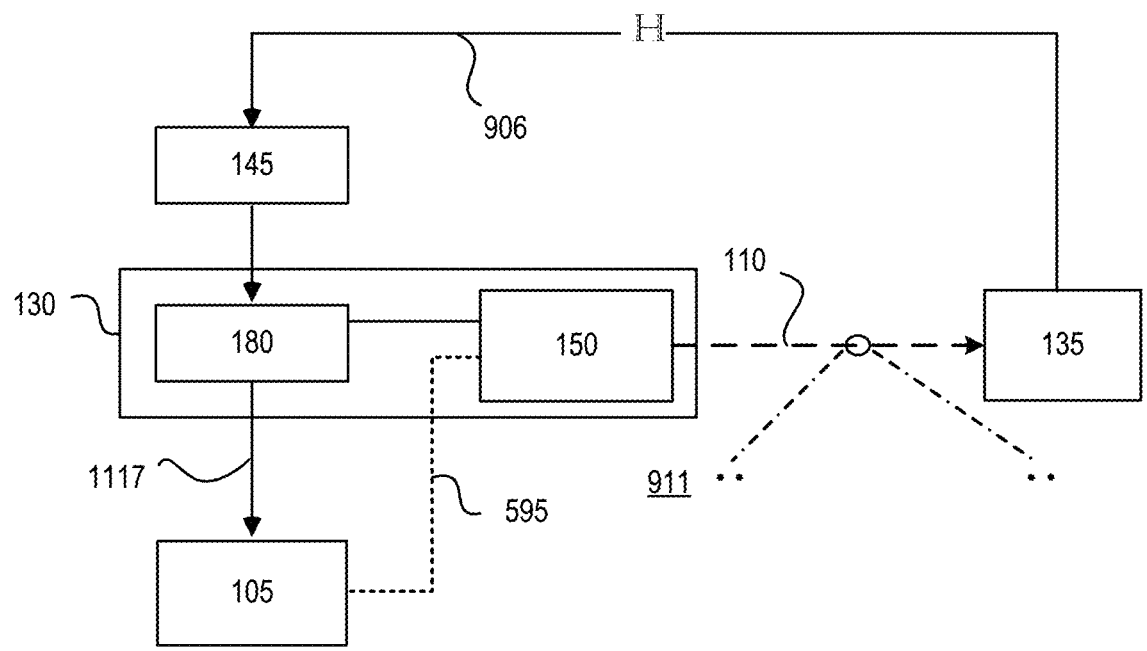
Fig. 11

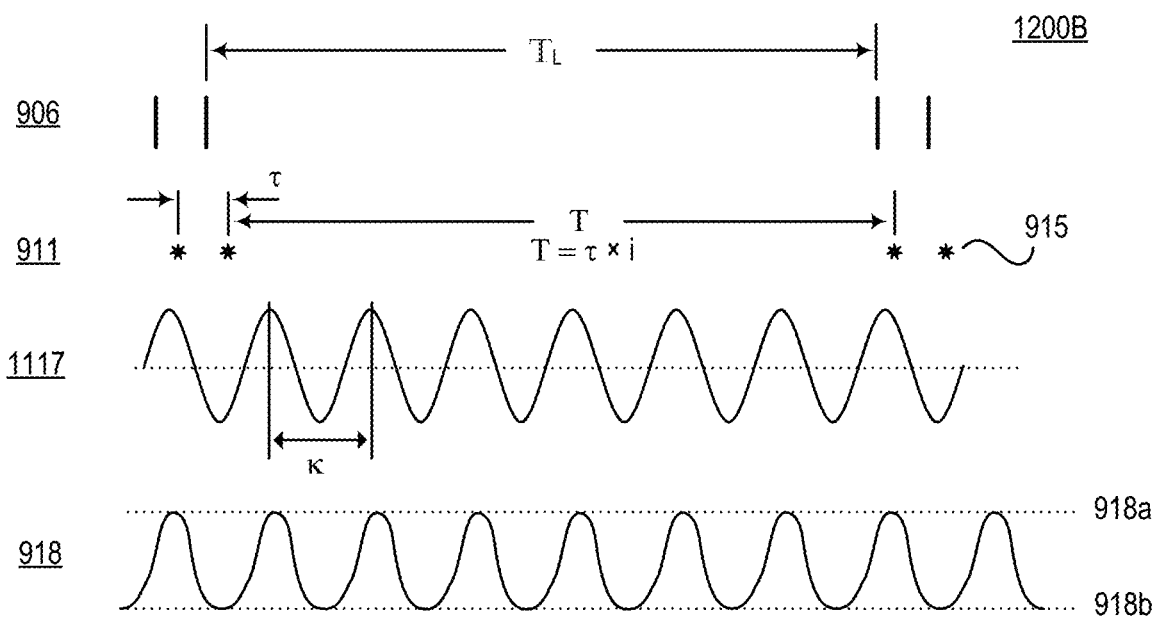
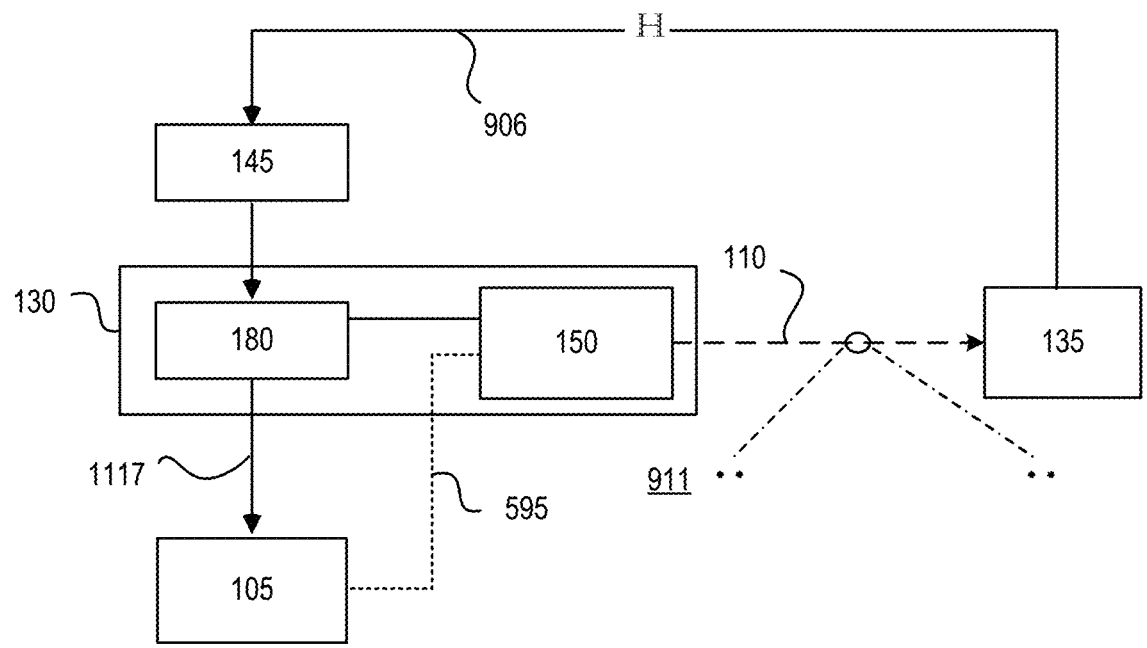
Fig. 12

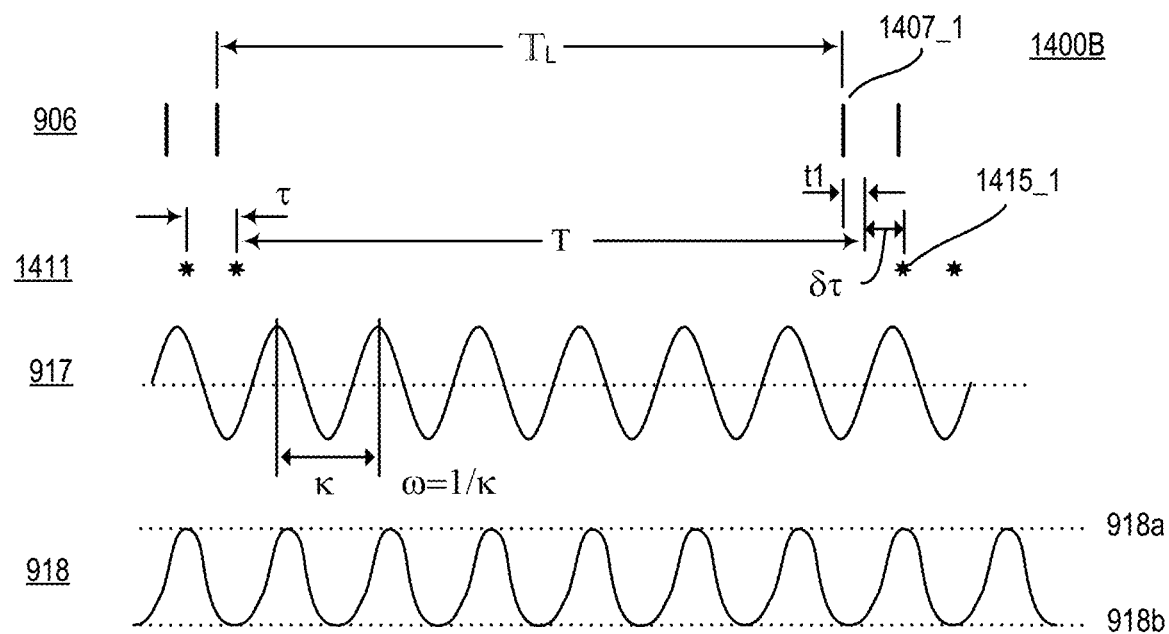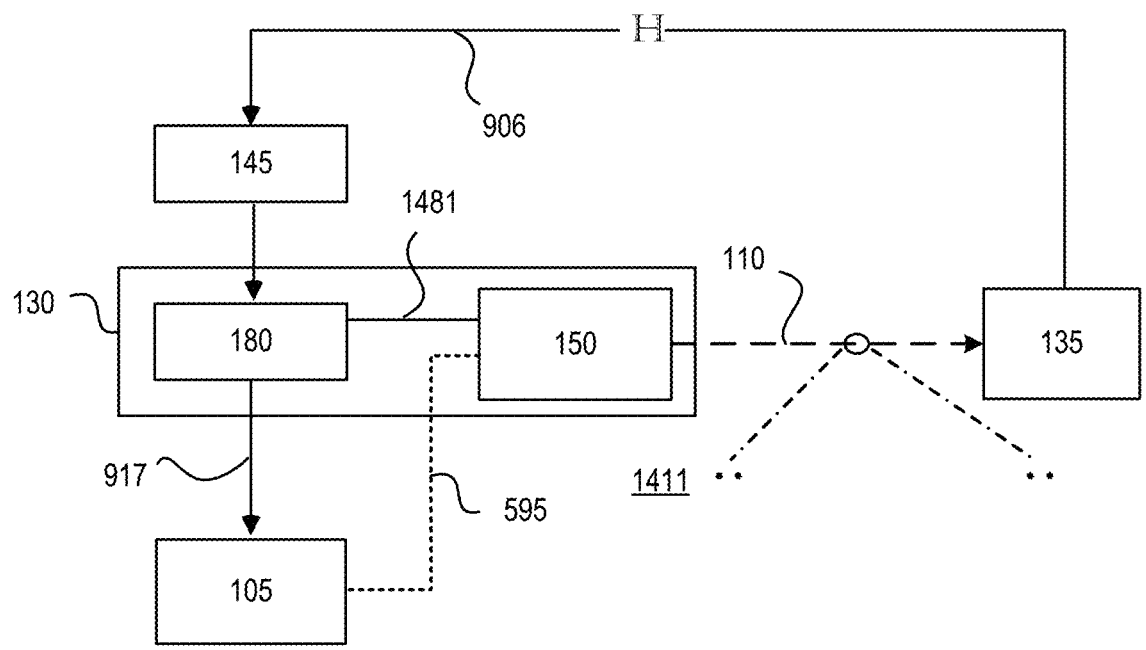
Fig. 14

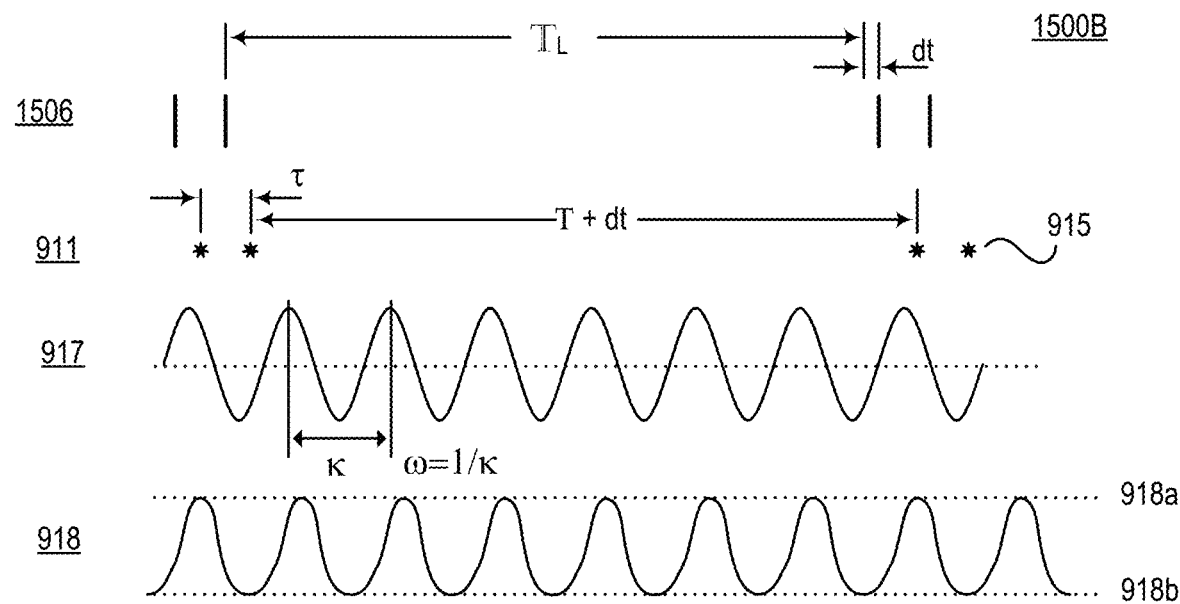
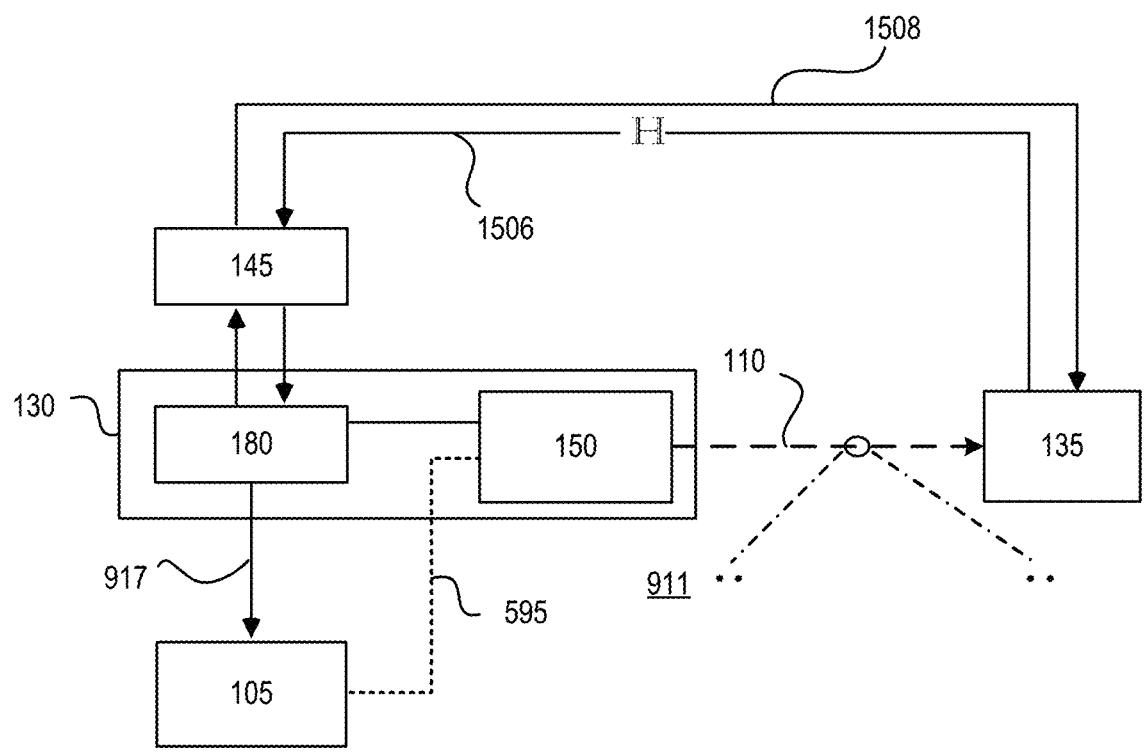
Fig. 15

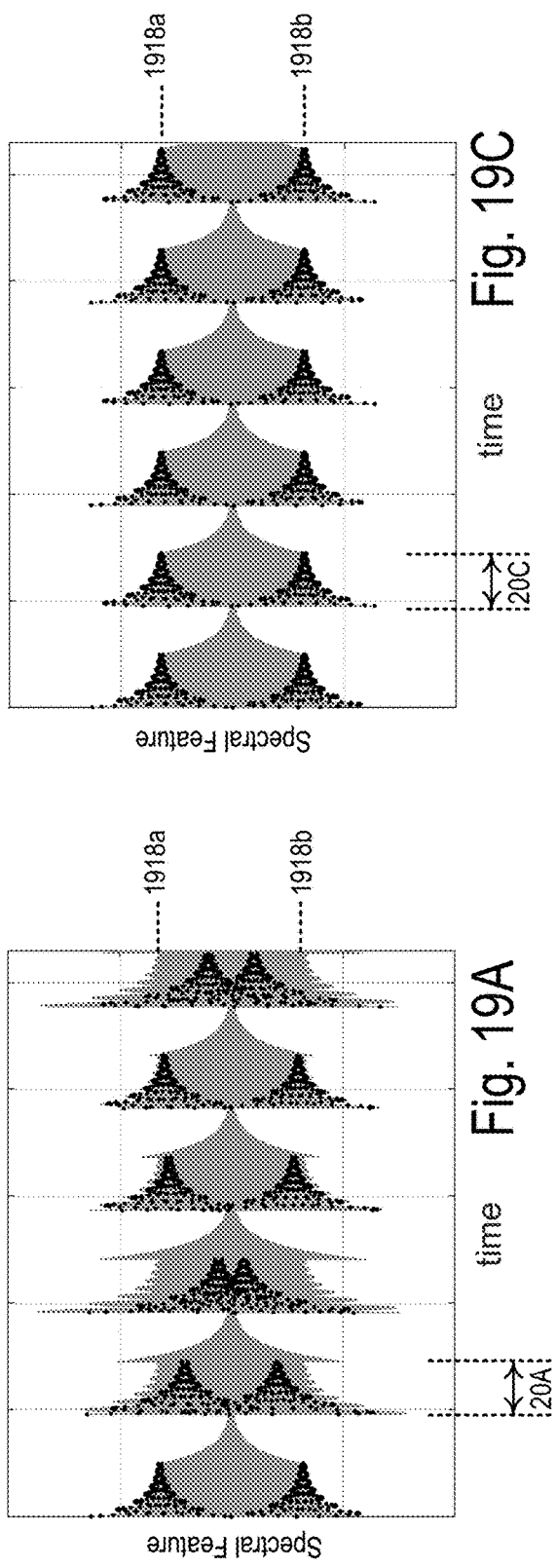
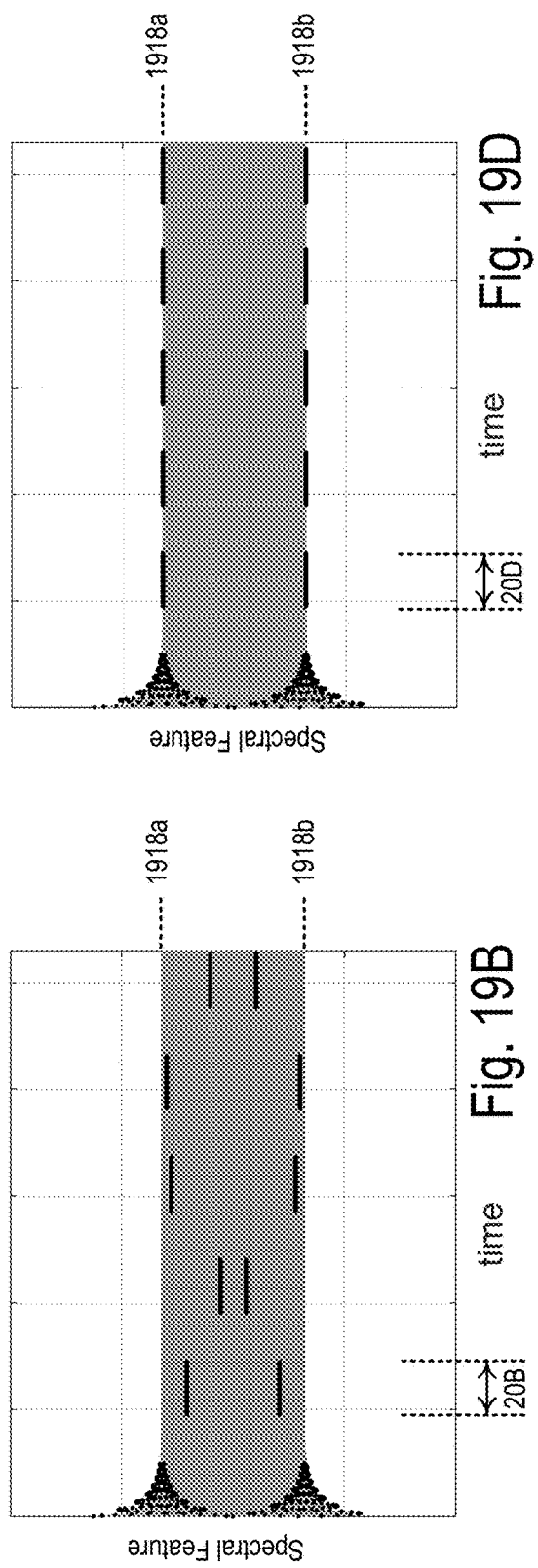

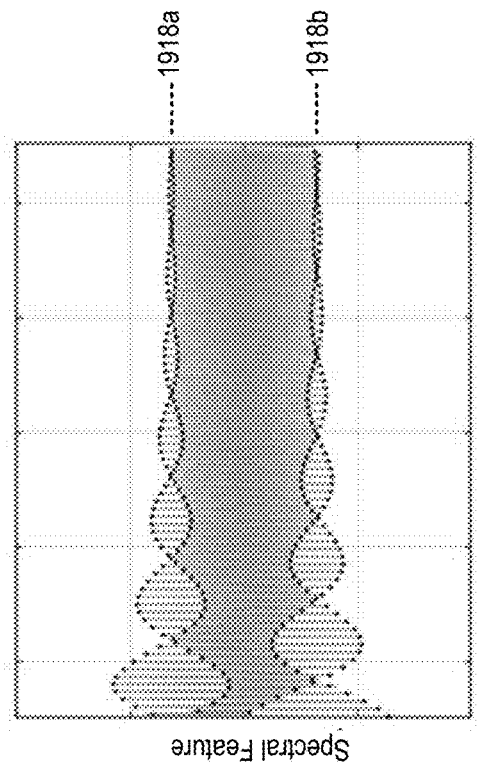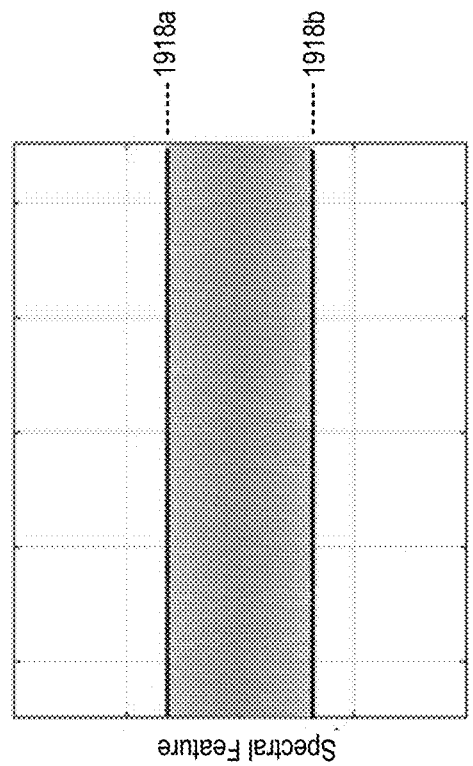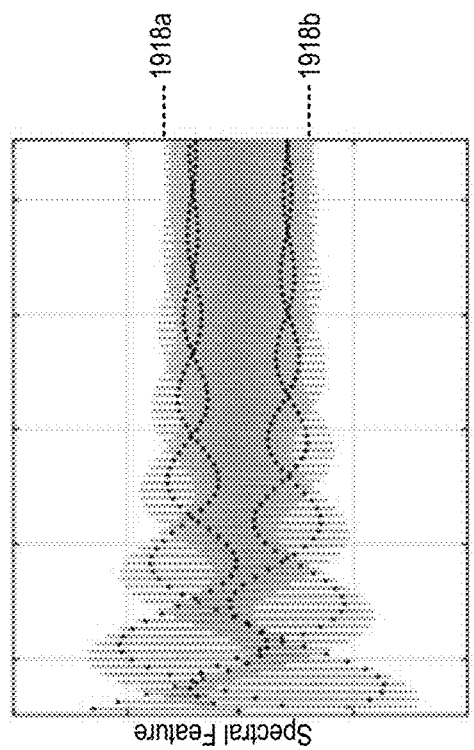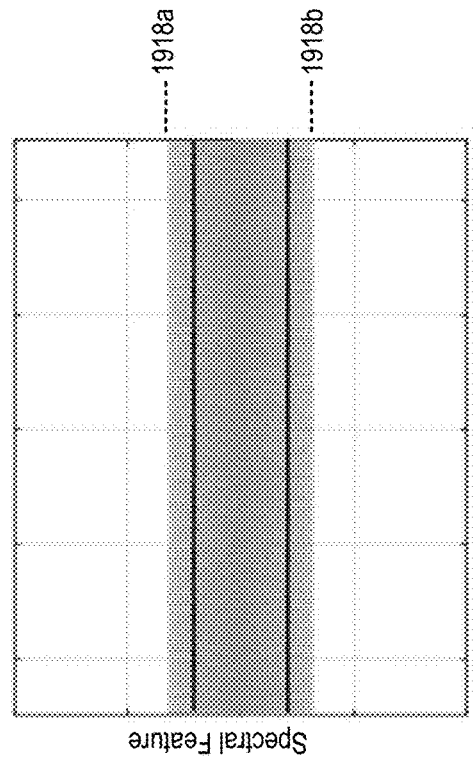

SPECTRAL FEATURE SELECTION AND PULSE TIMING CONTROL OF A PULSED LIGHT BEAM

CROSS REFERENCE TO RELATED APPLICATIONS

This application is a continuation of U.S. application Ser. No. 16/980,467, which is the national phase of International Application No. PCT/US2019/020415, filed Mar. 1, 2019 and titled SPECTRAL FEATURE SELECTION AND PULSE TIMING CONTROL OF A PULSED LIGHT BEAM, which claims priority to U.S. Application No. 62/650,896, filed Mar. 30, 2018 and titled Spectral Feature Selection and Pulse Timing Control of a Pulsed Light Beam, and U.S. Application No. 62/663,308, filed Apr. 27, 2018 and titled Spectral Feature Selection and Pulse Timing Control of a Pulsed Light Beam. Each of these patent applications is incorporated herein by reference in its entirety.

TECHNICAL FIELD

The disclosed subject matter relates to controlling a spectral feature, such as, for example, bandwidth or wavelength, of a light beam output from an optical source that supplies light to a lithography exposure apparatus.

BACKGROUND

In semiconductor lithography (or photolithography), the fabrication of an integrated circuit (IC) requires a variety of physical and chemical processes performed on a semiconductor (for example, silicon) substrate (which is also referred to as a wafer). A lithography exposure apparatus (which is also referred to as a scanner) is a machine that applies a desired pattern onto a target region of the substrate. The wafer is fixed to a stage so that the wafer generally extends along an image plane defined by orthogonal $X_L$ and $Y_L$ directions of the scanner. The wafer is irradiated by a light beam, which has a wavelength in the ultraviolet range, somewhere between visible light and x-rays, and thus has a wavelength between about 10 nanometers (nm) to about 400 nm. Thus, the light beam can have a wavelength in the deep ultraviolet (DUV) range, for example, with a wavelength that can fall from about 100 nm to about 400 nm or a wavelength in the extreme ultraviolet (EUV) range, with a wavelength between about 10 nm and about 100 nm. These wavelength ranges are not exact, and there can be overlap between whether light is considered as being DUV or EUV.

The light beam travels along an axial direction, which corresponds with the $Z_L$ direction of the scanner. The $Z_L$ direction of the scanner is orthogonal to the image plane $(X_L$-$Y_L)$. The light beam is passed through a beam delivery unit, filtered through a reticle (or mask), and then projected onto a prepared wafer. The relative position between the wafer and the light beam is moved in the image plane and the process is repeated at each target region of the wafer. In this way, a chip design is patterned onto a photoresist that is then etched and cleaned, and then the process repeats.

An accurate knowledge of spectral features or properties (for example, a bandwidth or a wavelength) of a light beam output from an optical source such as a laser is important in many scientific and industrial applications. For example, accurate knowledge of the optical source bandwidth is used to enable control of a minimum feature size or critical dimension (CD) in deep ultraviolet (DUV) optical lithography. The critical dimension is the feature size that is printed on a semiconductor substrate (also referred to as a wafer) and therefore the CD can require fine size control.

SUMMARY

In some general aspects, a method includes: producing a burst of pulses of an amplified light beam at a pulse repetition rate and directing the pulses to a lithography exposure apparatus. The method includes, while producing the pulse burst, driving a spectral feature adjuster among a set of discrete states at a frequency correlated with the pulse repetition rate. Each discrete state corresponds to a discrete value of the spectral feature of the amplified light beam out of a plurality of pre-set discrete values of the spectral feature, such that, each time a pulse in the burst is being produced, the spectral feature adjuster is in one of the discrete states and the amplified light beam pulse has a spectral feature that corresponds to that discrete state. The method includes, in between the production of the bursts of pulses and while no pulses are being produced, driving the spectral feature adjuster in a manner that is related to information received from the lithography exposure apparatus. Moreover, the method includes ensuring that the spectral feature adjuster is in one of the discrete states that corresponds to a discrete value of the spectral feature of the amplified light beam when a pulse in the next burst is produced.

Implementations can include one or more of the following features. For example, the spectral feature adjuster can be driven in the manner that is related to information received from the lithography exposure apparatus by driving the spectral feature adjuster at a frequency correlated with the pulse repetition rate. The method can ensure that the spectral feature adjuster is in the discrete state when the pulse in the next burst is produced by adjusting an inter-burst time interval so that the inter-burst time interval is an integer multiple of the time interval between pulses for the pulse repetition rate. The inter-burst time interval can be the time interval between the last pulse in the burst and the first pulse in the next burst.

The method can ensure that the spectral feature adjuster is in the discrete state when the pulse in the next burst is produced by receiving an indication from the lithography exposure apparatus about the time at which it will request the production of the next burst; and, if the received indication indicates a mismatch in time between the production of the first pulse in the next burst and the time at which the spectral feature adjuster is in the discrete state, then modifying one or more parameters associated with driving the spectral feature adjuster based on the received indication. The one or more parameters associated with driving the spectral feature adjuster can be modified by modifying one or more of a frequency and a phase of a driving signal associated with the spectral feature adjuster. The method can also include, if the frequency at which the spectral feature adjuster is driven was modified due to a mismatch, then changing the frequency at which the spectral feature adjuster is driven at the start of the next burst to be correlated with the pulse repetition rate.

The spectral feature of the amplified light beam can be a wavelength of the amplified light beam. The wavelength of the amplified light beam can be in the deep ultraviolet range. The spectral feature adjuster can be driven among the set of discrete states at the frequency correlated with the pulse repetition rate by driving the spectral feature adjuster so that the wavelength of the amplified light beam changes for each pulse of the amplified light beam between two distinct wavelengths.

The spectral feature adjuster can be driven among the set of discrete states at the frequency correlated with the pulse repetition rate by driving the spectral feature adjuster so that the wavelength of the amplified light beam changes for every other pulse of the amplified light beam between two distinct wavelengths.

The spectral feature adjuster can be driven among the set of discrete states by driving the spectral feature adjuster according to a sinusoidal drive signal.

The spectral feature adjuster can be driven by moving an optic that interacts with a pre-cursor light beam between discrete locations. Each discrete location of the optic corresponds to a discrete state, and the amplified light beam is formed from the pre-cursor light beam. The optic that interacts with the light beam can be moved by rotating a prism through which the pre-cursor light beam travels.

The frequency at which the spectral feature adjuster is driven can be one half of the pulse repetition rate. The frequency at which the spectral feature adjuster is driven can be one fourth of the pulse repetition rate.

The method can ensure that the spectral feature adjuster is in one of the discrete states when the pulse in the next burst is produced by ensuring that the spectral feature adjuster is in one of the discrete states when the initial pulse in the next burst is produced.

The spectral feature adjuster can be driven in the manner that is related to information received from the lithography exposure apparatus by driving the spectral feature adjuster according to one or more fixed parameters and receiving a request from the lithography exposure apparatus to produce the next burst of pulses. The method can ensure that the spectral feature adjuster is in a discrete state when the pulse in the next burst is produced by delaying, for a period of time greater than zero, the production of the next burst of pulses relative to the receipt of the request from the lithography exposure apparatus to produce the next burst of pulses. The production of the next burst of pulses can be delayed for the period of time by delaying the next burst of pulses until the spectral feature adjuster can be driven to one of the discrete states that corresponds to a discrete value of the spectral feature of the amplified light beam when a pulse in the next burst of pulses is produced.

The information from the lithography exposure apparatus that is related to the manner in which the spectral feature adjuster is driven in between the production of the bursts of pulses and while no bursts of pulses are being produced can be received prior to the end of the burst. The information from the lithography exposure apparatus that is related to the manner in which the spectral feature adjuster is driven in between the production of the bursts of pulses and while no bursts of pulses are being produced can be received in between the production of the bursts of pulses.

The method can ensure that the spectral feature adjuster is in one of the discrete states when a pulse in the next burst is produced by sending a signal to the lithography exposure apparatus. The signal includes information related to how the spectral feature adjuster is being driven in between the production of the bursts of pulses and while no pulses are being produced.

In other general aspects, an apparatus includes: an interface configured to communicate with a lithography exposure apparatus, and to receive information from the lithography exposure apparatus; a spectral feature adjuster; and an optical apparatus in communication with the interface and the spectral feature adjuster. The optical apparatus is configured to: produce a burst of pulses of the amplified light beam at a pulse repetition rate for use by the lithography exposure apparatus for patterning a substrate; while producing the pulse burst, drive the spectral feature adjuster among a set of discrete states at a frequency correlated with the pulse repetition rate, with each discrete state corresponding to a discrete value of the spectral feature of the amplified light beam out of a plurality of pre-set discrete values of the spectral feature, such that, each time a pulse in the burst is being produced, the spectral feature adjuster is in one of the discrete states and the amplified light beam pulse has a spectral feature that corresponds to that discrete state; in between the production of the bursts of pulses and while no pulses are being produced, drive the spectral feature adjuster in a manner that is related to information received from the lithography exposure apparatus at the interface; and ensure that the spectral feature adjuster is in one of the discrete states that corresponds to a discrete value of the spectral feature of the amplified light beam when a pulse in the next burst is produced.

Implementations can include one or more of the following features. For example, the spectral feature of the amplified light beam can be a wavelength of the amplified light beam.

The spectral feature adjuster can include a drive actuator in communication with the optical apparatus and configured to drive the spectral feature adjuster among the set of discrete states. The optical apparatus can include a control apparatus in communication with the interface and the drive actuator. The control apparatus can be configured to: receive indications from the interface regarding the requests from the lithography exposure apparatus that include the pulse repetition rate from the lithography exposure apparatus; and send a driving signal to the drive actuator, wherein the driving signal is based on information received from the lithography exposure apparatus. The driving signal sent to the drive actuator can be a sinusoidal driving signal.

The spectral feature adjuster can include an optical device that optically interacts with a pre-cursor light beam, and each discrete state of the optical device can correspond to a discrete state of the spectral feature adjuster. A discrete state of the optical device can be a discrete location at which the optical device interacts with the pre-cursor light beam. The optical device can include a prism through which the pre-cursor light beam passes. The optical device can be physically coupled to the drive actuator.

The optical apparatus can include: a first gas discharge stage configured to generate a first pulsed light beam; and a second gas discharge stage configured to receive the first pulsed light beam and to amplify the first pulsed light beam to thereby produce the amplified light beam from the optical apparatus.

The first gas discharge stage can include a first gas discharge chamber housing an energy source and containing a gas mixture that includes a first gain medium; and the second gas discharge stage can include a second gas discharge chamber housing an energy source and containing a gas mixture that includes a second gain medium.

The optical apparatus can be configured to drive the spectral feature adjuster in the manner that is related to information received from the lithography exposure apparatus at the interface by driving the spectral feature adjuster at the frequency correlated with the pulse repetition rate. The optical apparatus can be configured to ensure that the spectral feature adjuster is in a discrete state when the pulse in the next burst is produced by adjusting an inter-burst time interval so that the inter-burst time interval is an integer multiple of the time interval between pulses for the pulse repetition rate, wherein the inter-burst time interval is the time interval between the last pulse and the pulse in the next burst.

The optical apparatus can be configured to ensure that the spectral feature adjuster is in a discrete state when the pulse in the next burst is produced by: receiving an indication from the interface regarding the time at which the lithography exposure apparatus will request the production of the next burst; and, if the received indication indicates a mismatch in time between the production of the pulse in the next burst and the time at which the spectral feature adjuster is in the discrete state, then modifying one or more parameters associated with a driving signal that is sent to the spectral feature adjuster based on the received indication. The one or more parameters that are modified can include one or more of a frequency and/or a phase of the driving signal supplied to a drive actuator of the spectral feature adjuster. The optical apparatus can be configured to change the frequency of the driving signal at the start of the next burst to be correlated with the pulse repetition rate if the frequency was modified due to a mismatch.

The optical apparatus can be configured to drive the spectral feature adjuster in the manner that is related to information received from the lithography exposure apparatus at the interface by driving the spectral feature adjuster according to one or more fixed parameters and receiving a request from the lithography exposure apparatus to produce the next burst of pulses. The optical apparatus can be configured to ensure that the spectral feature adjuster is in a discrete state when the pulse in the next burst is produced by delaying, for a period of time greater than zero, the production of the next burst of pulses relative to a receipt of a request received at the interface from the lithography exposure apparatus to produce the next burst of pulses.

The optical apparatus can be configured to delay the production of the next burst of pulses by delaying the production of the next burst of pulses until the spectral feature adjuster can be driven to one of the discrete states that corresponds to a discrete value of the spectral feature of the amplified light beam when a pulse in the next burst of pulses is produced.

The optical apparatus can include an optical source having at least one amplification stage configured to output the amplified light beam. The spectral feature adjuster can be a part of a spectral feature selection apparatus, the spectral feature selection apparatus receiving a pre-cursor light beam from the optical source. The spectral feature selection apparatus includes: a dispersive optical element arranged to interact with the pre-cursor light beam, and a plurality of prisms arranged in the path of the pre-cursor light beam between the dispersive optical element and the optical source. The spectral feature adjuster can be one of the prisms in the plurality of prisms and the set of discrete states of the spectral feature adjuster is a set of discrete positions of the prism at which the pre-cursor light beam interacts with the prism. The prism can be driven among the set of discrete positions by being rotated about a prism axis to a set of discrete angles.

In some general aspects, a method includes: instructing an optical source to produce a burst of pulses of an amplified light beam at a pulse repetition rate, and directing the produced pulses to a lithography exposure apparatus. The method includes, while producing the pulse burst, driving a spectral feature adjuster among a set of discrete states at a frequency correlated with the pulse repetition rate, with each discrete state corresponding to a discrete value of the spectral feature of the amplified light beam out of a plurality of pre-set discrete values of the spectral feature. The method includes, in between the production of the bursts of pulses and while no pulses are being produced, driving the spectral feature adjuster according to a driving signal defined by a set of parameters. The method also includes ensuring that the spectral feature adjuster is in one of the discrete states that corresponds to a discrete value of the spectral feature of the amplified light beam when a pulse in the next burst is produced by adjusting one or more of: an instruction to the lithography exposure apparatus, the driving signal to the spectral feature adjuster, and/or the instruction to the optical source.

Implementations can include one or more of the following features. For example, the method can ensure that the spectral feature adjuster is in one of the discrete states that corresponds to the discrete value of the spectral feature of the amplified light beam when the pulse in the next burst is produced by adjusting the driving signal to the spectral feature adjuster. The method can include receiving an indication from the lithography exposure apparatus about the time at which it will request the production of the next burst. The driving signal to the spectral feature adjuster can be adjusted by modifying one or more of the parameters of the driving signal sent to the spectral feature adjuster based on the received indication from the lithography exposure apparatus. The one or more parameters of the driving signal sent to the spectral feature adjuster can be modified by modifying one or more of a frequency and a phase of the driving signal sent to the spectral feature adjuster. The request received for the production of the next burst from the lithography exposure apparatus can be delayed by enough time from the indication received from the lithography exposure apparatus in order to enable the modification of the one or more parameters so that the spectral feature adjuster is in one of the discrete states when the pulse in the next burst is produced. The delay can be about 25-35 milliseconds (ms).

The method can ensure that the spectral feature adjuster is in one of the discrete states that corresponds to the discrete value of the spectral feature of the amplified light beam when the pulse in the next burst is produced by adjusting the instruction to the optical source. The instruction to the optical source can be adjusted by delaying, for a period of time greater than zero, the production of the next burst of pulses relative to the receipt of the request from the lithography exposure apparatus to produce the next burst of pulses so that the spectral feature adjuster is in one of the discrete states when the pulse in the next burst is produced. The production of the next burst of pulses can be delayed by delaying the next burst of pulses until the spectral feature adjuster can be driven to one of the discrete states that corresponds to a discrete value of the spectral feature of the amplified light beam when a pulse in the next burst of pulses is produced. The method includes continuing to drive the spectral feature adjuster in accordance with the driving signal defined by the set of parameters while adjusting the instruction to the optical source.

The method can ensure that the spectral feature adjuster is in one of the discrete states that corresponds to the discrete value of the spectral feature of the amplified light beam when the pulse in the next burst is produced by adjusting an instruction to the lithography exposure apparatus. The instruction to the lithography exposure apparatus can be adjusted by sending a signal to the lithography exposure apparatus, the signal including information related to how the spectral feature adjuster is being driven in between the production of the bursts of pulses and while no pulses are being produced. The method can include receiving a trigger request for the production of the next burst from the lithography exposure apparatus. The trigger request is based on the adjusted instruction to the lithography exposure apparatus and ensures that the time at which the pulse in the next burst of pulses is produced is synchronized with the moment at which the spectral feature adjuster reaches one of the discrete states. The trigger request can be adjusted to thereby delay an electrical pulse in the instruction to the optical source.

The spectral feature of the amplified light beam can be a wavelength of the amplified light beam.

Each time a pulse in the burst is being produced, the spectral feature adjuster can be in one of the discrete states and the amplified light beam pulse can have a spectral feature that corresponds to that discrete state.

The spectral feature adjuster can be driven among the set of discrete states at the frequency correlated with the pulse repetition rate by driving the spectral feature adjuster so that the wavelength of the amplified light beam changes for each pulse of the amplified light beam between two distinct wavelengths. The spectral feature adjuster can be driven among the set of discrete states at the frequency correlated with the pulse repetition rate by driving the spectral feature adjuster so that the wavelength of the amplified light beam changes for every other pulse of the amplified light beam between two distinct wavelengths.

The spectral feature adjuster can be driven among the set of discrete states by driving the spectral feature adjuster according to a sinusoidal driving signal.

The spectral feature adjuster can be driven by moving an optic that interacts with a pre-cursor light beam between discrete locations, each discrete location of the optic corresponding to a discrete state, and the amplified light beam is formed from the pre-cursor light beam.

The method can ensure that the spectral feature adjuster is in one of the discrete states when the pulse in the next burst is produced by ensuring that the spectral feature adjuster is in one of the discrete states when the initial pulse in the next burst is produced.

In other general aspects, an apparatus includes: an interface configured to communicate with a lithography exposure apparatus; a spectral feature adjuster; an optical source; and a control apparatus in communication with the interface, the spectral feature adjuster, and the optical source. The control apparatus is configured to: instruct the optical source to produce a burst of pulses of the amplified light beam at a pulse repetition rate for use by the lithography exposure apparatus for patterning a substrate; while producing the pulse burst, drive the spectral feature adjuster among a set of discrete states at a frequency correlated with the pulse repetition rate, with each discrete state corresponding to a discrete value of the spectral feature of the amplified light beam out of a plurality of pre-set discrete values of the spectral feature; in between the production of the bursts of pulses and while no pulses are being produced, drive the spectral feature adjuster according to a driving signal defined by a set of parameters; and ensure that the spectral feature adjuster is in one of the discrete states that corresponds to a discrete value of the spectral feature of the amplified light beam when a pulse in the next burst is produced by adjusting one or more of: an instruction to the lithography exposure apparatus, the driving signal to the spectral feature adjuster, and/or the instruction to the optical source.

Implementations can include one or more of the following features. For example, the control apparatus can be configured to ensure that the spectral feature adjuster is in one of the discrete states that corresponds to the discrete value of the spectral feature of the amplified light beam when the pulse in the next burst is produced by adjusting the driving signal to the spectral feature adjuster. The control apparatus can be configured to receive an indication from the lithography exposure apparatus about the time at which it will request the production of the next burst by way of the interface; and the control apparatus can adjust the driving signal to the spectral feature adjuster by modifying one or more of the parameters of the driving signal sent to the spectral feature adjuster based on the received indication from the lithography exposure apparatus. The control apparatus can be configured to modify the one or more parameters of the driving signal sent to the spectral feature adjuster by modifying one or more of a frequency and a phase of the driving signal sent to the spectral feature adjuster.

The control apparatus can be configured to ensure that the spectral feature adjuster is in one of the discrete states that corresponds to the discrete value of the spectral feature of the amplified light beam when the pulse in the next burst is produced by adjusting the instruction to the optical source. The control apparatus can adjust the instruction to the optical source by delaying, for a period of time greater than zero, the production of the next burst of pulses relative to the receipt of the request from the lithography exposure apparatus to produce the next burst of pulses so that the spectral feature adjuster is in one of the discrete states when the pulse in the next burst is produced. The control apparatus can delay for the period of time the production of the next burst of pulses by delaying the next burst of pulses until the spectral feature adjuster can be driven to one of the discrete states that corresponds to a discrete value of the spectral feature of the amplified light beam when a pulse in the next burst of pulses is produced. The control apparatus can continue to drive the spectral feature adjuster according to the driving signal defined by the set of parameters.

The control apparatus can be configured to ensure that the spectral feature adjuster is in one of the discrete states that corresponds to the discrete value of the spectral feature of the amplified light beam when the pulse in the next burst is produced by adjusting an instruction to the lithography exposure apparatus. The control apparatus can adjust the instruction to the lithography exposure apparatus by sending a signal to the lithography exposure apparatus, the signal including information related to how the spectral feature adjuster is being driven in between the production of the bursts of pulses and while no pulses are being produced. The control apparatus can be configured to receive a trigger request for the production of the next burst from the lithography exposure apparatus, the trigger request being based on the adjusted instruction to the lithography exposure apparatus, and ensure that the time at which the pulse in the next burst of pulses is produced is synchronized with the moment at which the spectral feature adjuster reaches one of the discrete states.

The spectral feature of the amplified light beam can be the wavelength of the amplified light beam.

The spectral feature adjuster can include a drive actuator in communication with the control apparatus and configured to drive the spectral feature adjuster among the set of discrete states. The spectral feature adjuster can include an optical device that optically interacts with a pre-cursor light beam, and each discrete state of the optical device can correspond to a discrete state of the spectral feature adjuster. A discrete state of the optical device can be a discrete location at which the optical device interacts with the pre-cursor light beam. The optical device can include a prism through which the pre-cursor light beam passes.

The optical device can be physically coupled to the drive actuator.

The optical source can include: a first gas discharge stage configured to generate a first pulsed light beam; and a second gas discharge stage configured to receive the first pulsed light beam and to amplify the first pulsed light beam to thereby produce the amplified light beam from the optical source.

The optical source can include at least one amplification stage configured to output the amplified light beam.

The spectral feature adjuster can be a part of a spectral feature selection apparatus, the spectral feature selection apparatus receiving a pre-cursor light beam from the optical source. The spectral feature selection apparatus can include: a dispersive optical element arranged to interact with the pre-cursor light beam, and a plurality of prisms arranged in the path of the pre-cursor light beam between the dispersive optical element and the optical source. The spectral feature adjuster can be one of the prisms in the plurality of prisms and the set of discrete states of the spectral feature adjuster is a set of discrete positions of the prism at which the pre-cursor light beam interacts with the prism. The prism can be driven among the set of discrete positions by being rotated about a prism axis to a set of discrete angles.

DESCRIPTION OF DRAWINGS

FIG. 2B is a close-up view of the timing diagram of FIG. 2A;

FIG. 9 is a timing diagram of an implementation of the apparatus of FIG. 1 operating during the production of a burst of pulses, and a block diagram of the apparatus is shown in connection with a discussion of the timing diagram;

FIG. 10 is a timing diagram of an implementation of the apparatus of FIG. 1 operating in between the production of bursts of pulses, and a block diagram of the apparatus is shown in connection with a discussion of the timing diagram;

FIG. 11 is a timing diagram of an implementation of the apparatus of FIG. 1 operating in a manner in which the spectral feature adjuster is driven in between the production of bursts of pulses at a frequency that is correlated with the pulse repetition rate, and also a corresponding block diagram of the apparatus that relates to the timing diagram;

FIG. 12 is a timing diagram of an implementation of the apparatus of FIG. 1 operating in a manner that removes the mismatch in time between the pulse in the next burst of pulses that follows an inter-burst time interval and the moment at which the spectral feature adjuster reaches one of the discrete states, and also a corresponding block diagram of the apparatus that corresponds to the timing diagram;

FIG. 14 is a timing diagram of an implementation of the apparatus of FIG. 1 operating in a manner that removes the mismatch in time between the pulse in the next burst of pulses that follows an inter-burst time interval and the moment at which the spectral feature adjuster reaches one of the discrete states, and also a corresponding block diagram of the apparatus that corresponds to the timing diagram;

FIG. 15 is a timing diagram of an implementation of the apparatus of FIG. 1 operating in a manner that removes the mismatch in time between the pulse in the next burst of pulses that follows an inter-burst time interval and the moment at which the spectral feature adjuster reaches one of the discrete states, and also a corresponding block diagram of the apparatus that corresponds to the timing diagram;

FIGS. 19A-19D are graphs showing a simulation of four different modes of operation of the apparatus through six bursts of pulses in which the production of the pulses from the apparatus are superimposed on a waveform of the spectral feature adjuster;

FIGS. 20A-20D are close-up views of the respective graphs of FIGS. 19A-19D through the second burst of pulses.

DESCRIPTION

Figure 1:
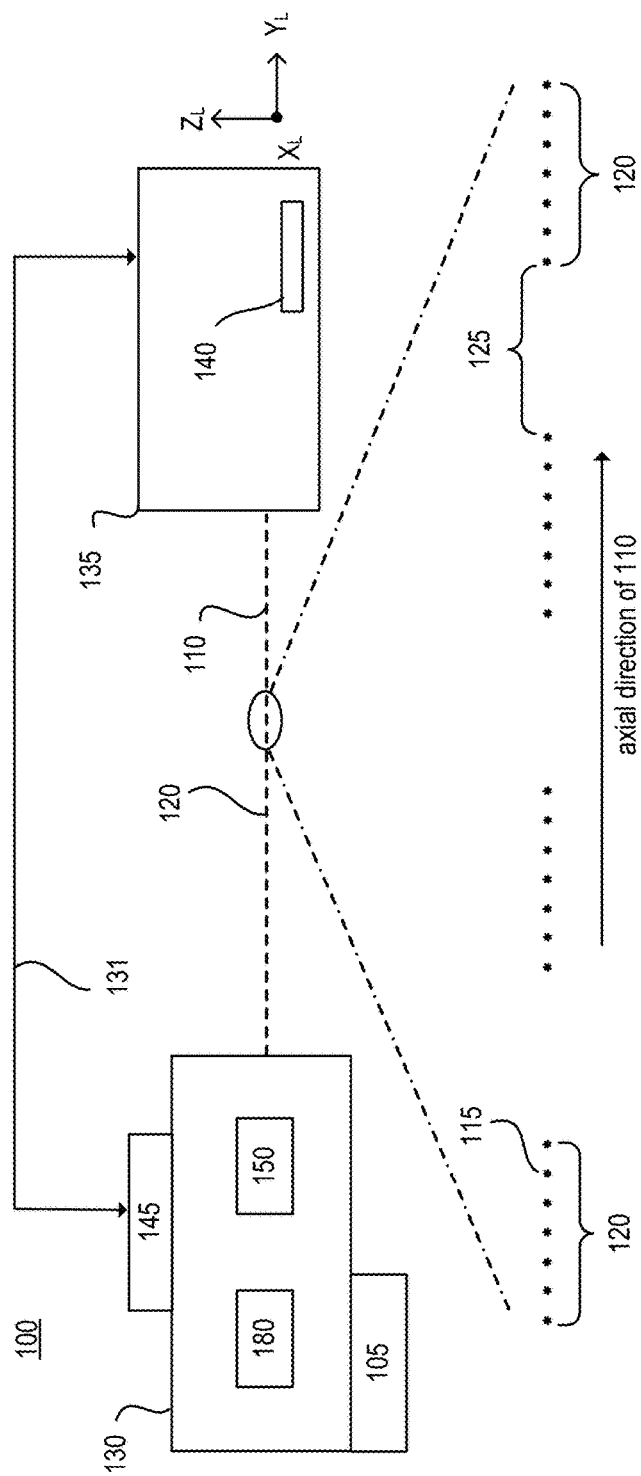
FIG. 1 is a block diagram of an apparatus that includes an optical apparatus for supplying an amplified light beam of pulses to a lithography exposure apparatus and a spectral feature adjuster that adjusts a spectral feature of the amplified light beam.

Referring to FIG. 1, an apparatus 100 is designed to ensure that a spectral feature adjuster 105 is in a discrete state when a pulse 115 in a burst 120 of pulses of an amplified light beam 110 is produced after an inter-burst gap 125 in which no pulses are produced. The spectral feature adjuster 105 is a device or apparatus that adjusts at least one spectral feature (such as the wavelength or bandwidth) of the amplified light beam 110. The spectral feature adjuster 105 can be any apparatus that is configured to control or adjust one or more spectral features of the amplified light beam 110. A discrete state of the spectral feature adjuster 105 corresponds to a discrete value of a spectral feature of an amplified light beam 110. The amplified light beam 110 is produced by an optical apparatus 130, and the amplified light beam 110 is supplied to a lithography exposure apparatus 135, which uses the amplified light beam 110 for patterning a substrate 140. The discrete value of the spectral feature is one of a set of discrete values of the spectral feature that is desired from the lithography exposure apparatus 135. It is possible for there to be a narrow range of discrete states of the spectral feature adjuster 105 that corresponds to or produces a particular value of the spectral feature of the amplified light beam 110. Thus, the term "discrete state of the spectral feature adjuster" includes a narrow range of discrete states of the spectral feature adjuster 105 that corresponds to the particular desired value of the spectral feature of the amplified light beam 110.

The lithography exposure apparatus 135 sets requirements for the value of one or more spectral features of the amplified light beam 110 so as to produce a desired patterning or lithographic result on the substrate 140. The lithography exposure apparatus 135 requires a particular spectral feature or set of spectral features from the amplified light beam 110 depending on the patterning of the substrate 140.

In one example, the lithography exposure apparatus 135 requires that each pulse of the amplified light beam 110 have a spectral feature that is selected from among a plurality of discrete spectral features when used to pattern the substrate 140. It may be desirable for the wavelength of the amplified light beam 110 to change among a set of discrete and distinct values on a pulse-to-pulse basis. This can mean that the wavelength changes for each adjacent and consecutive pulse. Alternatively, the wavelength changes for every other pulse (thus, the wavelength remains at one discrete value for two consecutive pulses and another discrete value for two consecutive pulses, and so forth).

Changing the wavelength can yield a valuable result, for example, from the standpoint of the lithography exposure apparatus 135. In particular, chromatic aberration on the amplified light beam 110 as it traverses the lithography exposure apparatus 135 can cause a correlation between the wavelength of the amplified light beam 110 and the location of the focal plane (along the axial direction, which is orthogonal to the image plane $X_L$-$Y_L$ of the substrate 140) of the pulse of the amplified light beam 110 at the substrate 140. And, it may be desirable to change the focal plane of the amplified light beam 110 when it interacts with or impinges upon the substrate 140. Accordingly, by changing the wavelength of the amplified light beam 110, the focal plane of the amplified light beam 110 can be adjusted. In this example, the lithography exposure apparatus 135 instructs the optical apparatus 130 to adjust the wavelength in the manner required for such patterning of the substrate 140.

Additionally, the size of the microelectronic features patterned on the substrate 140 depends on the wavelength of the amplified light beam 110, with a lower wavelength resulting in a small minimum feature size or critical dimension. When the wavelength of the amplified light beam 110 is 248 nm or 193 nm, the minimum size of the microelectronic features can be, for example, 50 nm or less. Because it is often desirable to pattern smaller and smaller features on the substrate 140, the wavelength of the pulses of the amplified light beam 110 is centered around a wavelength that is in the deep ultraviolet (DUV) range, for example, with a wavelength that can fall from about 10 nanometers (nm) to about 400 nm. The wavelength of the amplified light beam 110 is determined from the makeup of the gain medium within the optical apparatus 130 that produces the amplified light beam 110, as discussed below.

The apparatus 100 includes an interface 145 that enables a communication channel (which can be wired or wireless) 131 between the lithography exposure apparatus 135 and the optical apparatus 130. For example, information is conveyed from the lithography exposure apparatus 135 to the optical apparatus 130 through the interface 145. The information that the optical apparatus 130 receives from the lithography exposure apparatus 135 can include requests from the lithography exposure apparatus 135 to the optical apparatus 130 to alter one or more characteristics of the amplified light beam 110. The interface 145 can additionally provide information to the lithography exposure apparatus 135 from the optical apparatus 130. The optical apparatus 130 also includes an optical source 150 that produces the amplified light beam 110, and a control apparatus 180 that is in communication with the interface 145, the optical source 150, and the spectral feature adjuster 105. The optical apparatus 130 could include other components not shown in FIG. 1.

Figure 2A:
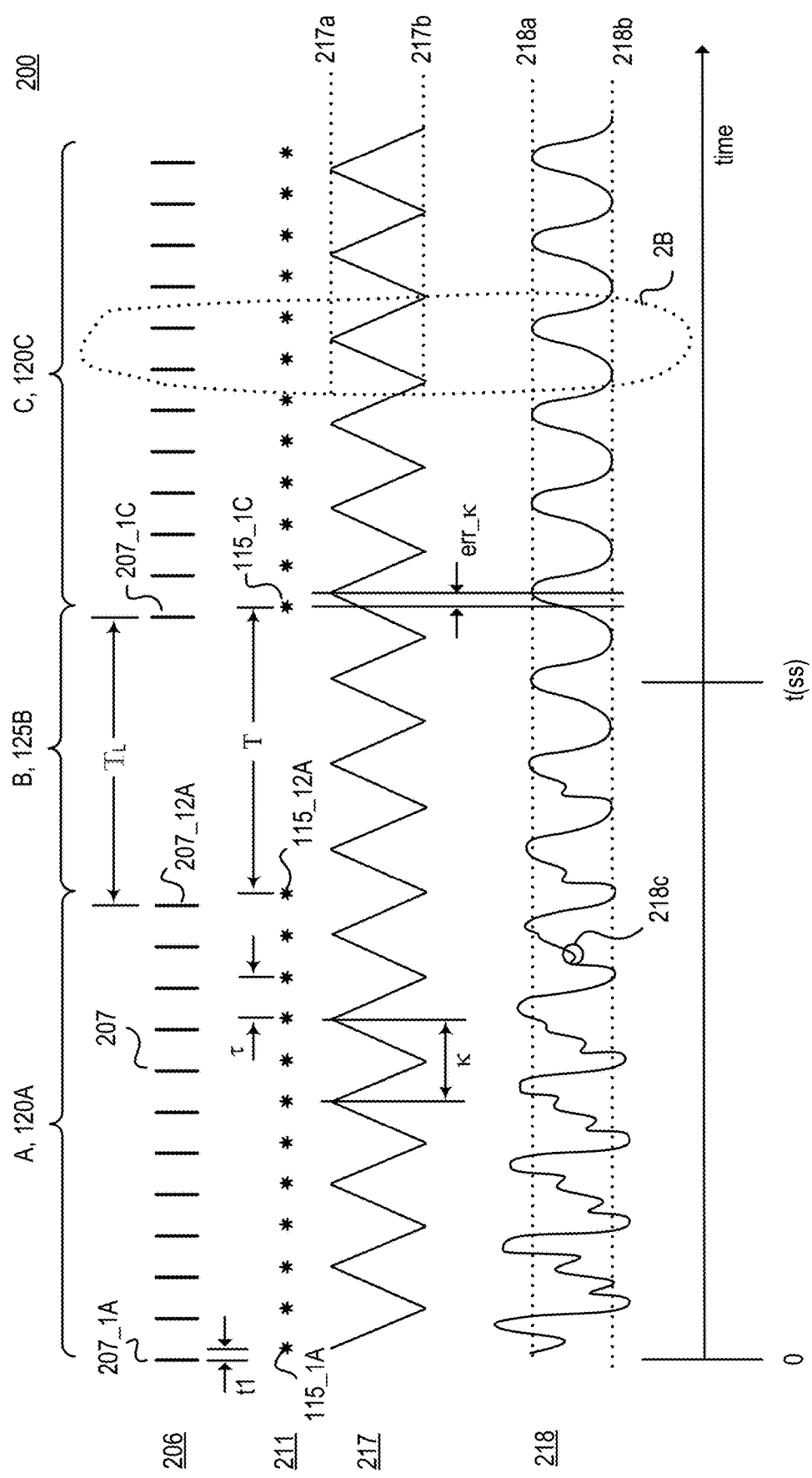
FIG. 2A is a timing diagram showing the operation of the optical apparatus and the spectral feature adjuster of FIG. 1 through two bursts of pulses of the amplified light beam and one inter-burst gap.

In order to visualize the operation of the apparatus 100, reference is made to an example of a timing diagram 200 in FIG. 2A along with a close-up view 2B of the diagram 200 shown in FIG. 2B. The timing diagram 200 only shows two bursts 120 of pulses 115 of the amplified light beam 110 as well as one inter-burst gap 125. In this example, the lithography exposure apparatus 135 sends a trigger signal 206 to the interface 145, this trigger signal 206 is conveyed to the optical apparatus 130, and in response, the optical apparatus 130 sends a driving signal 217 to the spectral feature adjuster 105. The actual state of the spectral feature adjuster 105 (which changes based on the driving signal 217) is represented by the waveform 218. The spectral feature adjuster 105 is driven from a rest state at time equal to 0 on the diagram 200 to a steady state at a time equal to t(ss) on the diagram 200.

In this example, region A of the timing diagram 200 corresponds to a first burst 120A that begins at time 0 and occurs after an inter-burst gap 125 (not shown), followed by an inter-burst gap 125B that occurs in region B, which is followed by a second burst 120C that occurs in region C of the timing diagram 200. The example of FIGS. 2A and 2B is a schematic diagram meant to show basic principles and it may not be drawn to scale. For example, in FIGS. 2A and 2B, each burst 120 includes 12 pulses 115. Nevertheless, it is possible for a burst 120 of pulses 115 to include anywhere from tens to several hundreds or thousands of pulses and for the inter-burst gap 125B to be longer or shorter than what is represented by the timing diagram 200. The timing diagram 200 is merely provided as one example to show basic principles.

The trigger signal 206 can be in the form of a train of electrical pulses 207, with adjacent pulses 207 being separated in time by a spacing (which can be a constant spacing for certain time frames). Each electrical pulse 207 in the train of the trigger signal 206 instructs the optical apparatus 130 to produce a pulse 115 of the amplified light beam 110 to be provided to the lithography exposure apparatus 135. The timing diagram 200 shows one example of the relationship between the trigger signal 206, a train 211 of the pulses 115 of the amplified light beam 110, the driving signal 217 that the optical apparatus 130 provides to the spectral feature adjuster 105, and the waveform 218 of the actual state of the spectral feature adjuster 105. The control apparatus 180 is in communication with the interface 145 and also a drive actuator (such as drive actuator 570 shown in FIG. 5) associated with the spectral feature adjuster 105. The control apparatus 180 is configured to receive indications from the interface 145 regarding the requests from the lithography exposure apparatus 135, such requests include information relating to a pulse repetition rate. The driving signal 217 sent to the drive actuator 570 is based on this information received from the lithography exposure apparatus 135.

The driving signal 217 shown in this example has a triangular, continuous, and periodic form. However, the driving signal 217 is not limited to being a triangular form. Other shapes are possible, such as a sinusoidal driving signal or a square shape driving signal, as discussed in detail later. The driving signal 217 is any signal shape that drives or modifies the spectral feature adjuster 105 in a continuous manner through various positions or states to cause the spectral feature adjuster 105 to exist at various moments in one of a plurality of targeted discrete states (for example, at first state 218a and at second state 218b). While only two targeted discrete states 218a and 218b are shown in FIG. 2A, it is possible for there to be more than two targeted or desired discrete states. For example, it is possible for an intermediate state (such as a state between the states 218a and 218b) to be a targeted or desired state.

While this is not shown in FIGS. 2A and 2B, when operating properly, for example, during a steady state and when the signals (such as the pulse train 211, the driving signal 217, and the waveform 218) are properly aligned, each targeted discrete state 218a and 218b in the plurality corresponds to a discrete and targeted value of the spectral feature of the amplified light beam 110. Additionally, the driving signal 217 also drives the spectral feature adjuster 105 along all of the states on the waveform 218 in between the targeted discrete states 218a and 218b. Thus, if a pulse 115 is produced while the spectral feature adjuster 105 exists in an intermediate state (for example, at moment 218c in region A), then that pulse 115 would have a spectral feature that is not one of the spectral features that is targeted or desired by the lithography exposure apparatus 135. This is discussed in more detail below with reference to region C.

The actual state of the spectral feature adjuster 105 in represented by the waveform 218. The state of the spectral feature adjuster 105 can be a position of the spectral feature adjuster 105. Moreover, because each position of the spectral feature adjuster 105 corresponds to a specific value of the spectral feature, the value at the waveform 218 when a pulse 115 is produced provides the actual spectral feature of the pulse 115.

A pulse 115 of the amplified light beam 110 that is produced simultaneously with the spectral feature adjuster 105 being in the first state 218a has a first targets spectral feature (for example, a first wavelength). A pulse 115 of the amplified light beam 110 that is produced simultaneously with the spectral feature adjuster 105 being in the second state 218b has a second targeted spectral feature (for example, a second wavelength). The first and second spectral features are targeted or desired spectral features for use by the lithography exposure apparatus 135. The lithography exposure apparatus 135 requires that the spectral feature adjuster 105 be in one of the discrete states (218a or 218b) that corresponds to a discrete and targeted value of the spectral feature of the amplified light beam 110 when each pulse 115 is produced.

As shown in region A, at the beginning of the burst 120A, the first trigger pulse 207_1A is received at the optical apparatus 130 (via the interface 145). However, the optical apparatus 130 produces the first pulse 115_1A of the amplified light beam 110 after a time delay t1 (measured relative to the first trigger pulse 207_1A). This time delay t1 is inherent in the design of the optical apparatus 130 because the optical apparatus 130 requires some amount of time to react to the first trigger pulse 207_1A. For example, the optical apparatus 130 processes (receives and analyzes) the first trigger pulse 207_1A, and then provides a signal to the optical source 150 to produce the first pulse 115_1A. The time it takes between the receipt of the first trigger pulse 207_1A and the production of the first pulse 115_1A of the amplified light beam 110 corresponds to this time delay t1. Moreover, this time delay t1 is passed on to each pulse 115 in the train 211 of pulses 115 in that burst 120A. This means that each pulse 115 in the train 211 is delayed relative to the electrical trigger pulse 207 that instructs the optical apparatus 130 to produce that particular pulse. Moreover, in general, this time delay t1 is the same for each pulse 115 in the train 211 because the time it takes from the moment of receipt of the electrical trigger pulse 207 and the production of the corresponding pulse 115 usually does not change.

In region A (and also in regions B and C), a pulse repetition rate Rp of the amplified light beam 110 remains constant. The pulse repetition rate Rp of the amplified light beam 110 is the rate at which the pulses 115 of the amplified light beam 110 are produced by the optical apparatus 130. The pulse repetition rate Rp of the amplified light beam 110 is $1/\tau$, where $\tau$ is the time between the production of adjacent pulses 115. Moreover, this time t between the production of adjacent pulses 115 is also the time between the production of adjacent electrical trigger pulses 207. In some implementations, the pulse repetition rate Rp is on the order of kilohertz (kHz), such as, for example, 6 kHz and the time $\tau$ between the production of adjacent pulses 115 in this example is 167 microseconds (µs). The pulse repetition rate Rp of the amplified light beam 110 is set by the lithography exposure apparatus 135. Thus, the pulse repetition rate Rp is a part of the information that is conveyed from the lithography exposure apparatus 135 to the interface 145. Often, the lithography exposure apparatus 135 requires that the repetition rate Rp remain constant (or within a particular range) for a particular burst 120 of pulses 115 of the amplified light beam 110.

Moreover, the duration of each pulse 115 (which is not conveyed in FIGS. 2A and 2B) is much smaller than the time $\tau$ between adjacent pulses. The duration of a pulse 115 can be the time during which an intensity of the pulse 115 exceeds a minimum intensity. In some implementations, the duration of a pulse 115 is at least an order of magnitude smaller than the time $\tau$. For example, the duration of a pulse 115 can be on the order of tens or hundreds (for example, 100) nanoseconds (ns), and the time $\tau$ between adjacent pulses 115 can be around 167 µs.

While not shown in FIGS. 2A and 2B, it is alternatively possible for lithography exposure apparatus 135 to request that the optical apparatus 130 change the pulse repetition rate Rp of the amplified light beam 110. Such a change could be conveyed to the optical apparatus 130 outside of (that is, before) the time that the burst 120 is being produced. Or, such a change could be conveyed by a change in the rate at which electrical trigger pulses 207 in the trigger signal 206 are received. In some implementations, the lithography exposure apparatus 135 communicates an intended, target, or planned repetition rate before the next burst begins, as a way to help the optical apparatus 130 to prepare the spectral feature adjuster 105. Although this communication alone does not affect a change in the repetition rate as the actual change would be conveyed by the change in the trigger signal 206. A change in the pulse repetition rate Rp shows up in the timing diagram 200 as a change in the time between adjacent trigger pulses 206, which leads to a change in τ, the time between the production of adjacent pulses 115.

The driving signal 217 has a form or shape that is defined by a set of parameters that govern the shape of the driving signal 217. One parameter is a frequency ω, or the number of occurrences of a cycle of the driving signal 217 per unit of time. The frequency ω is inversely proportional to the time κ it takes to complete one cycle (for example, the time it takes to go from the value 217a to the value 217b and back to the value 217a (one cycle). Another parameter of the driving signal 217 is the phase, which corresponds to the position of the form at a particular time. In some implementations the frequency ω of the driving signal 217 is equal to or is an integer multiple of the pulse repetition rate Rp of the amplified light beam 110 in order to ensure that the production of each pulse coincides with the spectral feature adjuster 105 being in one of the discrete states 218a or 218b. For example, if the pulse repetition rate Rp is 6000 Hz, then the frequency ω can be 6000 Hz or 12,000 Hz. In other implementations, frequency ω of the driving signal 217 is a fraction (for example, one half or one quarter) of the pulse repetition rate Rp of the amplified light beam 110. For example, if the pulse repetition rate Rp is 6000 Hz, then the frequency ω can be 3000 Hz or 1500 Hz.

The waveform 218 of the spectral feature adjuster 105 is determined by the driving signal 217. Thus, the start of the driving signal 217 at time 0 starts the operation of the spectral feature adjuster 105. In this example, in region A of the timing diagram 200, the spectral feature adjuster 105 is driven from a state of rest at the time 0. That is, prior to time 0, the state of the apparatus 100 could be such that no pulses 115 were being produced. For example, the apparatus 100 could be operating in an inter-burst gap 125 in which no pulses are produced prior to time 0 in the diagram 200. It is not necessary, from the standpoint of pulse production, to continue to drive the spectral feature adjuster 105 during the inter-burst gap 125 because no pulses 115 need to be produced at this time. Thus, in this particular example of a timing diagram 200, the driving signal 217 is halted prior to time 0, and because of this, the spectral feature adjuster 105 is effectively halted prior to time 0. For example, a rotation or a translation of an optical element within the spectral feature adjuster 105 that interacts with an amplified light beam (that forms the amplified light beam 110) is halted prior to time 0 (the start of the timing diagram 200) and during the inter-burst gap 125. In this scenario, the driving signal 217 sent to the spectral feature adjuster 105 is re-started at time 0 (once it receives the first pulse 207 of the trigger signal 206). The re-start of the driving signal 217 in the burst 120A causes the spectral feature adjuster 105 to be driven once again. For example, the driving signal 217 starts the rotation or translation of the optical element within the spectral feature adjuster 105. However, as evident from the timing diagram 200, this re-start from being halted at time 0 causes several problems that can lead to a mis-match between the timing of the pulse 115 and the moment when the spectral feature adjuster 105 is in one of the two states 218a and 218b.

Figure 5:
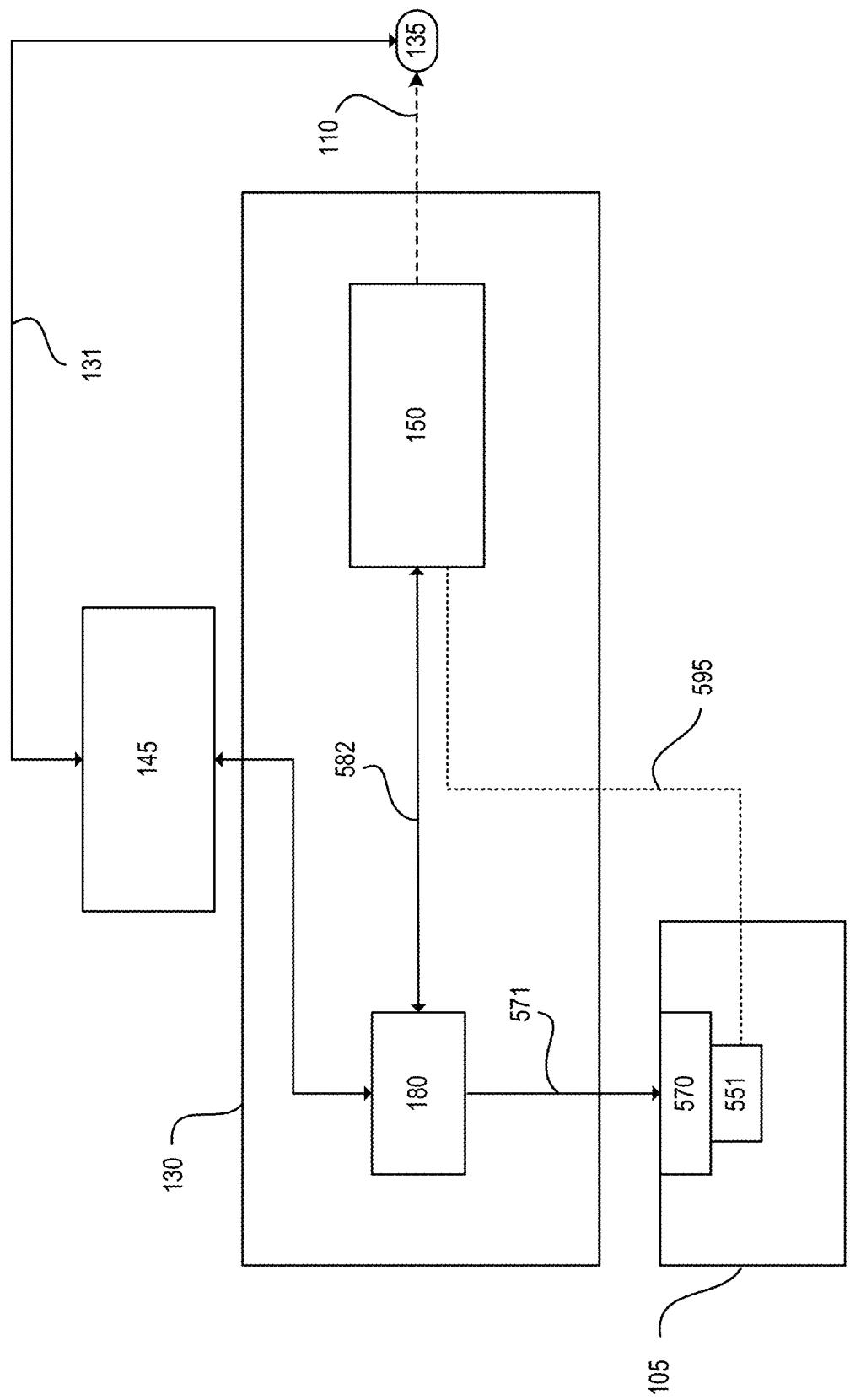
FIG. 5 is a block diagram of an implementation of the apparatus of FIG. 1.

First, the spectral feature adjuster 105 is a physical apparatus that undergoes dynamic positional transients and its phase response to such a re-start, that is, how long it takes to transition from a halted or rest state to a steady state at time t(ss), is a function of its response to these transients. Transients are temporary oscillations or changes (for example, ringing, premature reversals of direction, higher frequency periods) that occur in the system (and specifically in the operation of the spectral feature adjuster 105) because of the sudden change of voltage or of a load in the system. This is because the spectral feature adjuster 105 is a part of a dynamic system and includes components (such as drive actuator 570, as shown in FIG. 5, and analog circuitry) whose phase response is a function of the frequency at which it is driven. In particular, the spectral feature adjuster 105 undergoes positional transients that modulate or affect the correct timing of how the spectral feature adjuster 105 is driven and in a complex manner. These transients are evident in the shape of the waveform 218, which is not regular and moreover is not aligning properly the states 218a and 218b with the production of each pulse 115. The spectral feature adjuster 105 does not have an instantaneous response to its input signal (the driving signal 217). As evident from the shape of the waveform 218, the spectral feature adjuster 105 is driven in a transient or intermediate state for quite a while before it settles into the steady state operation somewhere around time t(ss).

Moreover, the time t(ss) at which the spectral feature adjuster 105 enters its steady state operation may or may not occur in the current burst 120A or even in the next inter-burst gap 125B. The moment at which the steady state operation of the spectral feature adjuster 105 begins is determined by the number of pulses in a particular burst 120A, and the amount of time in the inter-burst gap 125B and it is even possible that the spectral feature adjuster 105 can require several cycles of bursts before it enters its steady state operation.

Second, the optical apparatus 130 does not know when the lithography exposure apparatus 135 will request another burst 120 of pulses 115. Thus, it is not possible to predict when the spectral feature adjuster 105 should reach a steady state, and thus, is also not possible to predict when the spectral feature adjuster 105 should exist in one of the two states 218a or 218b.

At the end of the burst 120A (at the end of region A in the timing diagram 200), the lithography exposure apparatus 135 halts the production of the trigger signal 206, which leads to the stoppage of the train 211 of pulses 115 from the amplified light beam 110. During this time in which no pulses are being produced, which corresponds to region B of the timing diagram 200 and schematically to an inter-burst gap 125B, the lithography exposure apparatus 135 usually takes other actions outside of direct patterning of the substrate 140. For example, the lithography exposure apparatus 135 could use this time to move the substrate 140 to a new position for patterning a different area of the substrate 140, as discussed below in more detail.

Once the lithography exposure apparatus 135 is ready to resume patterning on the substrate 140, for example, once the lithography exposure apparatus 135 has completed all of the other actions, the lithography exposure apparatus 135 sends another trigger pulse 207_1C to the interface 145 to thereby request that the optical apparatus 130 begin producing the next burst 120C of pulses 115 of the amplified light beam 110. The time between the last trigger pulse 207_12A in region A and the first trigger pulse 206_1C in region C is a trigger inter-burst time interval $T_L$. The optical apparatus 130 cannot predict when the lithography exposure apparatus 135 will be ready to resume patterning and request the next burst 120C of pulses 115. Thus, the optical apparatus 130 does not know the trigger inter-burst time interval $T_L$ in advance.

During the trigger inter-burst time interval $T_L$, the last pulse 115_12A of the burst 120A is produced and then an inter-burst time interval T transpires between the last pulse 115_12A of the burst 120A and the first pulse 115_1C of the burst 120C. The inter-burst time interval T of the pulse production is shifted in time by the time t1 from the trigger inter-burst time interval $T_L$. Moreover, the inter-burst time interval T is equal to the trigger inter-burst time interval $T_L$.

As discussed above, it is not necessary, from the standpoint of pulse production during the inter-burst time interval T, to continue to drive the spectral feature adjuster 105 during the inter-burst time interval T because no pulses 115 are being produced at this time. However, as discussed above, the spectral feature adjuster 105 requires a substantial amount of time to go from a rest state to a steady state (for example, at time t(ss)) and during this intermediate state, the spectral feature adjuster 105 is not a regular shape and it is not easy to predict when the spectral feature adjuster 105 will be in one of the discrete states 218a or 218b.

A first step in addressing these issues is to continue to drive the spectral feature adjuster 105 with the driving signal 217 during the inter-burst time interval T, that is, between the production of the burst 120A of pulses 115 and the burst 120C of pulses 115. To put it another way, there is no stoppage of the driving signal 217 during the inter-burst time interval T. Because of this, the spectral feature adjuster 105 does not enter a rest state nor does it need to transition from the rest state to a steady state of operation and thus the intermediate state (such as between time 0 and t(ss)) is avoided, as shown in FIG. 2A.

The spectral feature adjuster 105 is driven during the inter-burst time interval T in a manner that is related to information that the optical apparatus 130 has received from the lithography exposure apparatus 135. Such information received from the lithography exposure apparatus 135 can be received before the end of the burst 120A of pulses 115. Or, the information received from the lithography exposure apparatus 135 can be received during the inter-burst time interval T.

Nevertheless, even if the spectral feature adjuster 105 continues to be driven during the inter-burst time interval T without any other changes, it is still not possible to predict when the lithography exposure apparatus 135 will request the next burst 120C of pulses 115. The first pulse 115_1C in the next burst 120C of pulses will be delayed by the time t1 relative to the first trigger pulse 207_1C after the trigger inter-burst time interval $T_L$. Such a time t1 is generally known. However, there is a timing mismatch err_κ between the production of the first pulse 115_1C and the moment when the spectral feature adjuster 105 is in the first state 218a.

The apparatus 100 is designed and operated to ensure that the spectral feature adjuster 105 is in one of the states 218a or 218b when the pulse 115_iC (which may or may not be the first or initial pulse 115_1C) in the burst 120C is produced. A general description of the structure and operation of the apparatus 100 is provided before discussing the design and operation of the apparatus 100 that relates to ensuring that the spectral feature adjuster 105 is in a discrete state 218a or 218b when a pulse 115 in the burst 120 of pulses of the amplified light beam 110 is produced after the inter-burst gap 125 in which no pulses are produced.

Figure 3:
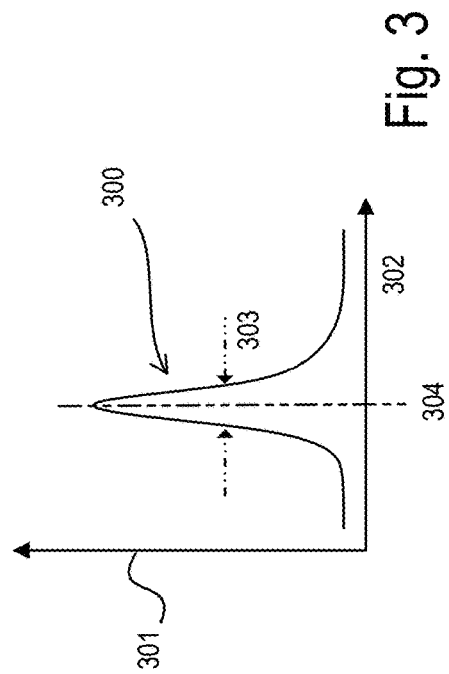
FIG. 3 is a graph of optical spectrum of the amplified light beam.

Referring to FIG. 3, the spectral feature of the amplified light beam 110 is any aspect or representation of an optical spectrum 300 of the amplified light beam 110. The optical spectrum 300 can be referred to as an emission spectrum. The optical spectrum 300 contains information on how the optical energy, spectral intensity, or power is distributed over different wavelengths. The optical spectrum 300 of the amplified light beam 110 is depicted in the form of a diagram or graph in which the spectral intensity 301 (not necessarily with an absolute calibration) is plotted as a function of the wavelength (or optical frequency, which is inversely proportional to the wavelength) 302.

One example of a spectral feature is a bandwidth, which is a measure of a width 303 of optical spectrum 300. This width can be given in terms of wavelength or frequency of the laser light. Any suitable mathematical construction (that is, metric) related to the details of the optical spectrum 300 can be used to estimate a value that characterizes the bandwidth of the amplified light beam 110. For example, the full width of the optical spectrum at a fraction (X) of the maximum peak intensity of the optical spectrum 300 (referred to as FWXM) can be used to characterize the bandwidth of the amplified light beam 110. As another example, the width of the optical spectrum 300 that contains a fraction (Y) of the integrated spectral intensity (referred to as EY) can be used to characterize the bandwidth of the amplified light beam 110.

Another example of a spectral feature is a wavelength, which can be a wavelength value 304 of the optical spectrum 300 at a particular (such as a maximum) spectral intensity.

Figure 4:
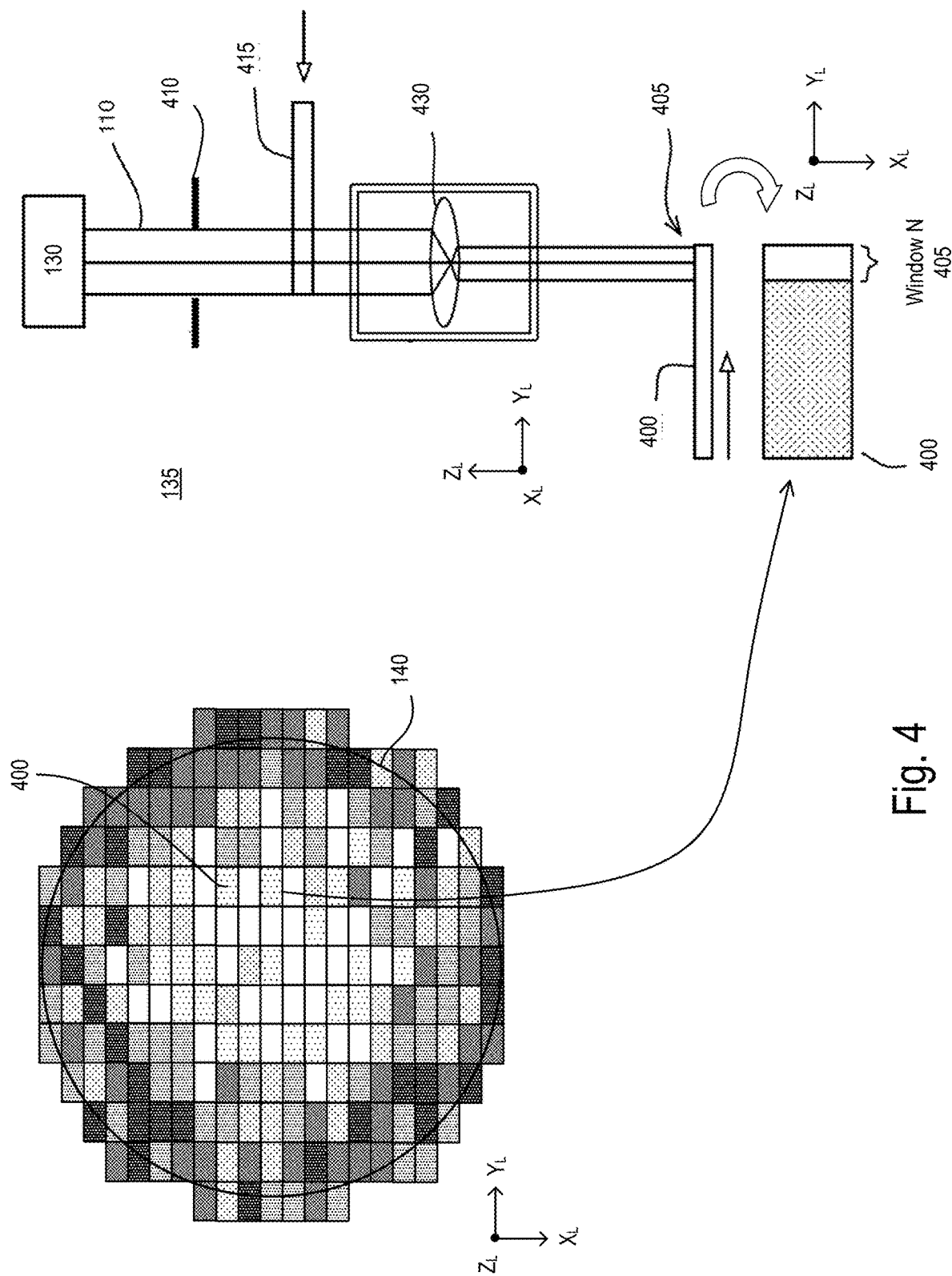
FIG. 4 is a block diagram of an implementation of the lithography exposure apparatus of FIG. 1.

Referring to FIG. 4, a burst 120 of pulses 115 of the amplified light beam 110 can correspond to an exposure field 400 on the substrate 140 that is being patterned in the lithography exposure apparatus 135. The exposure field 400 is the area of the substrate 140 that is exposed in one scan of an exposure window 405, and the exposure window 405 is the illuminated area of the substrate 140 that is exposed in one illumination dose. During lithography, a plurality of the pulses 115 of the amplified light beam 110 illuminate the same area of the substrate 140 to form the illumination dose. The number N of pulses 115 of the amplified light beam 110 that illuminate the exposure window 405 and the size of the exposure window 405 can be controlled by an exposure slit 410 placed before a mask 415 within the lithography exposure apparatus 135. In some implementations, the value of N is in the tens, for example, from 10-100 pulses. In other implementations, the value of N is greater than 100 pulses, for example, from 100-1000 pulses. The number of pulses in a burst 120 can be equal to the number N of pulses 115 that form the illumination dose.

The lithography exposure apparatus 135 includes, among other features, one or more condenser lenses and an objective arrangement 430. The mask 415 is movable along one or more directions, such as along a $Z_L$ direction (which generally corresponds to the axial direction of the light beam 110) or in an $X_L$-$Y_L$ plane that is perpendicular to the $Z_L$ direction. The objective arrangement 430 includes a projection lens and enables the image transfer to occur from the mask 415 to the photoresist on the substrate 140. The lithography exposure apparatus 135 can also include a beam homogenizer (not shown) configured to homogenize (makes uniform) the intensity distribution of the light beam 110 across the mask 415. The lithography exposure apparatus 135 can include a lithography controller, air conditioning devices, and power supplies for the various electrical components. The lithography controller controls how layers are printed on the substrate 140 and also communicates with the interface 145.

In some implementations, an immersion medium can be supplied to cover the substrate 140. The immersion medium can be a liquid (such as water) for liquid immersion lithography. In other implementations in which the lithography is a dry system, the immersion medium can be a gas such as dry nitrogen, dry air, or clean air. In other implementations, the substrate 140 can be exposed within a pressure-controlled environment (such as a vacuum or partial vacuum).

Referring also to FIG. 5, an implementation of the optical apparatus 130 is shown. In this implementation, the spectral feature adjuster 105 includes at least one optical device 551 that optically interacts with a pre-cursor light beam 595 from the optical source 150. The pre-cursor light beam 595 can be a light beam that eventually forms the amplified light beam 110. For example, the pre-cursor light beam 595 can be a light beam that has not yet been amplified.

The spectral feature adjuster 105 includes a drive actuator 570 having mechanical or electromagnetic features that are physically coupled to the optical device 551. The drive actuator 570 is in communication with the control apparatus 180 by way of a communication channel 571, which can be wired or wireless. For example, a driving signal is provided from the optical apparatus 130 (via the control apparatus 180) to the drive actuator 570 by way of the communication channel 571. The drive actuator 570 causes the optical device 551 to be driven, that is, to be modified, moved, or changed so that the optical device 551 is changed among a set of discrete states. For example, the optical device 551 can be driven to move continuously along a path, and while moving along the path, the optical device 551 can come to rest at or pass through a set of discrete positions or locations. Each discrete position corresponds to a discrete state of the spectral feature adjuster 105. At each discrete position, the optical device 551 interacts with the pre-cursor light beam 595 so that the optical device 551 selects a particular pre-set, targeted, or desired spectral feature of the pre-cursor light beam 595 at each discrete position.

The control apparatus 180 is in communication with the optical source 150 by way of a communication channel 582, which can be wired or wireless. A control signal can be provided from the control apparatus 180 to the optical source 150 along the communication channel 582 to control the production of the pulses of the amplified light beam 110 produced by the optical source 150.

Figure 6A:
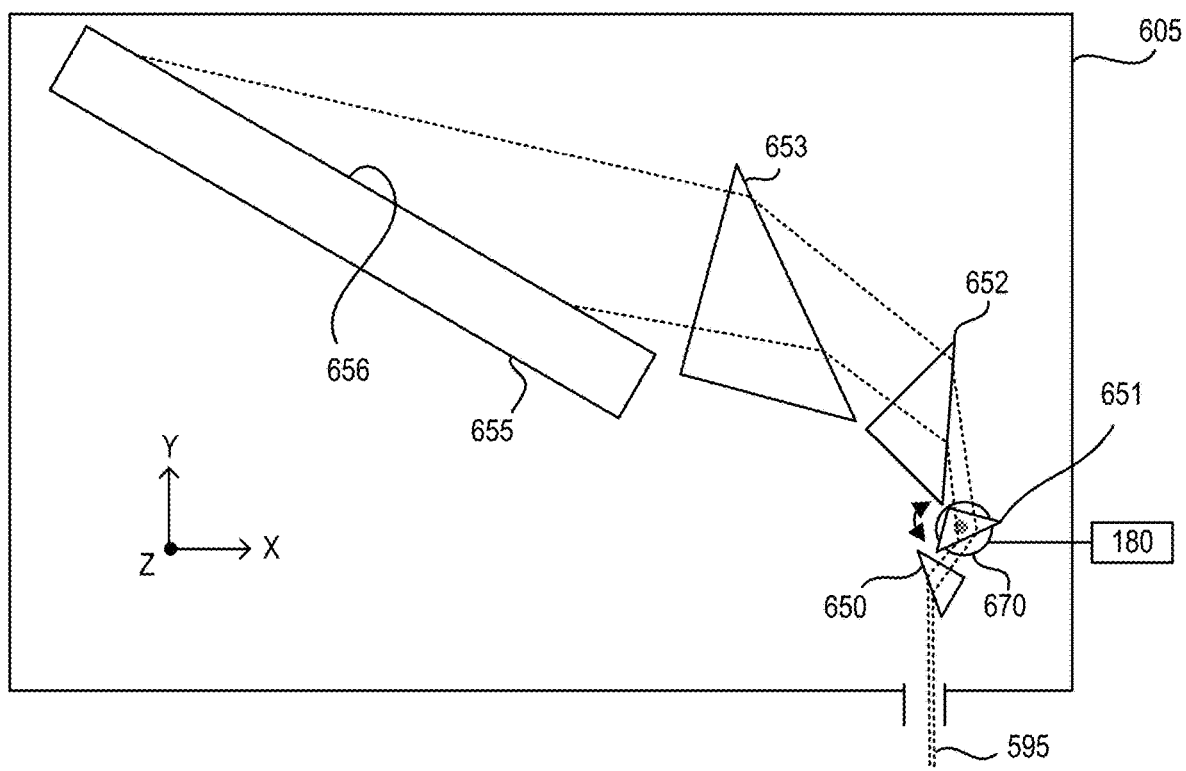
FIG. 6A is a schematic diagram of an implementation of a spectral feature adjuster including at least one optical device.

Referring to FIG. 6A, an implementation of a spectral feature adjuster 605 including at least one optical device is shown. In this implementation, the spectral feature adjuster 605 includes a set of refractive optical elements or prisms 650, 651, 652, 653 and a diffractive optical element or grating 655. Any one or more of the prisms and the grating can be used to adjust a wavelength of the pre-cursor light beam 595 and any one or more of the prisms and the grating can be used to adjust a bandwidth of the pre-cursor light beam 595. The prisms and grating can be configured to provide a coarse control for one or more spectral features, which means that the changes to the spectral features are of a relatively larger step and take place in a relatively slower time frame. The prisms and grating can be configured to provide a fine control for one or more spectral features, which means that the changes to the spectral features are of a relatively smaller step and take place in a relatively faster time frame.

Each of the prisms is a transmissive prism that acts to disperse and redirect the pre-cursor light beam 595 as it passes through the body of the prism. Each of the prisms can be made of a material (such as, for example, calcium fluoride) that permits the transmission of light having the wavelength of the pre-cursor light beam 595. Moreover, although four prisms are shown, it is possible for fewer than four or more than four to be used in the spectral feature adjuster 605.

The grating 655 can be a reflective grating that is designed to disperse and reflect the pre-cursor light beam 595; accordingly, the grating 655 is made of a material that is suitable for interacting with the pre-cursor light beam 595 having a wavelength in the DUV range. The grating 655 can be a high blaze angle Echelle grating, and the pre-cursor light beam 595 incident on the grating 655 at any angle of incidence that satisfies a grating equation will be reflected (diffracted). The grating equation provides the relationship between the spectral order of the grating 655, the wavelength of the diffracted light beam, the angle of incidence of the pre-cursor light beam onto the grating 655, the angle of exit of the pre-cursor light beam diffracted off the grating 655, the vertical divergence of the pre-cursor light beam incident onto the grating 655, and the groove spacing of the diffractive surface of the grating 655. Moreover, if the grating 655 is used such that the angle of incidence of the pre-cursor light beam 595 onto the grating 655 is equal to the angle of exit of the pre-cursor light beam 595 from the grating 655, then the grating 655 and set of prisms 650, 651, 652, 653 are arranged in a Littrow configuration and the wavelength of the pre-cursor light beam 595 from the grating 655 is the Littrow wavelength.

Figure 6B:
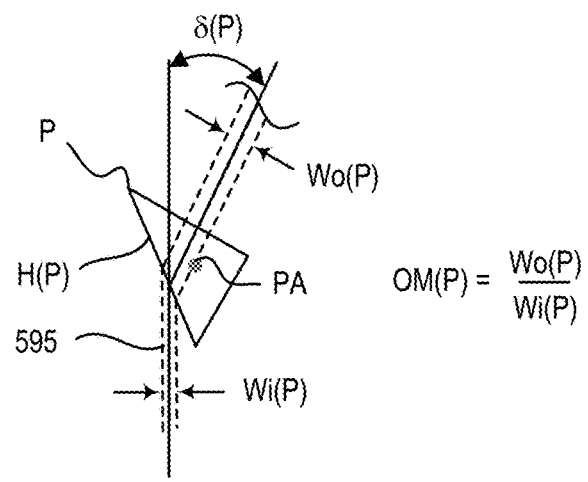
FIG. 6B is a schematic diagram showing an implementation of the operation of one of the prisms of FIG. 6A.

The wavelength of the pre-cursor light beam 595 can be adjusted by changing an angle of incidence at which the pre-cursor light beam 595 impinges upon a diffractive surface 656 of the grating 655. The bandwidth of the pre-cursor light beam 595 can be adjusted by changing the optical magnification of the pre-cursor light beam 595. The rotation of any one of the prisms 650, 651, 652, 653 impacts one or more of this angle of incidence and the optical magnification. In particular, with reference to FIG. 6B, the rotation of a particular prism P (which can be any one of 650, 651, 652, 653) changes the angle of incidence at which the pre-cursor light beam 595 impinges upon the entrance surface H(P) of that rotated prism P. Moreover, two optical qualities that are local to that rotated prism P are functions of the angle of incidence at which the pre-cursor light beam 595 impinges upon the entrance surface of that rotated prism P. These two local optical qualities are the local optical magnification OM(P) and the local beam refraction angle $\delta(P)$. The optical magnification OM(P) of the pre-cursor light beam 595 through the prism P is the ratio of a transverse width Wo(P) of the pre-cursor light beam 595 exiting that prism P to a transverse width Wi(P) of the pre-cursor light beam 595 entering that prism P. A change in the local optical magnification OM(P) of the pre-cursor light beam 595 at one or more of the prisms 650, 651, 652, 653 causes an overall change in the optical magnification of the pre-cursor light beam 595, which causes a change in the bandwidth of the pre-cursor light beam 595. And, a change in the local beam refraction angle $\delta(P)$ through one or more of the prisms 650, 651, 652, 653 causes an overall change in the angle of incidence of the pre-cursor light beam 595 on the surface 656 of the grating 655.

Because the rotation of a particular prism P causes a change in both the local beam refraction angle $\delta(P)$ and the local optical magnification OM(P) at that prism P, the control of wavelength and the control of the bandwidth is coupled in this design. Nevertheless, the rotation of a particular prism may have a greater impact on the control of a particular spectral feature than the rotation of another prism.

For example, in one implementation, the prism 651 is rotated about its prism axis (which is parallel with the Z axis) to change the wavelength of the pre-cursor light beam 595. In this implementation, the prism 651 can be considered as the optical device 551 that interacts with the pre-cursor light beam 595. A drive actuator 670 is physically coupled to the prism 651 and also in communication with the control apparatus 180 within the optical apparatus 130.

The drive actuator 670 is a mechanical device for moving (for example, translating or rotating) and controlling the position and/or orientation of the prism 651. The drive actuator 670 receives energy from the control apparatus 180 and converts that energy into some kind of motion that is imparted to the prism 651. For example, the drive actuator 670 can be a force device or a rotation stage. The drive actuator 670 can include, for example, a motor such as a stepper motor, valves, pressure-controlled devices, piezoelectric devices, linear motors, hydraulic actuators, or voice coils.

Figure 7A:
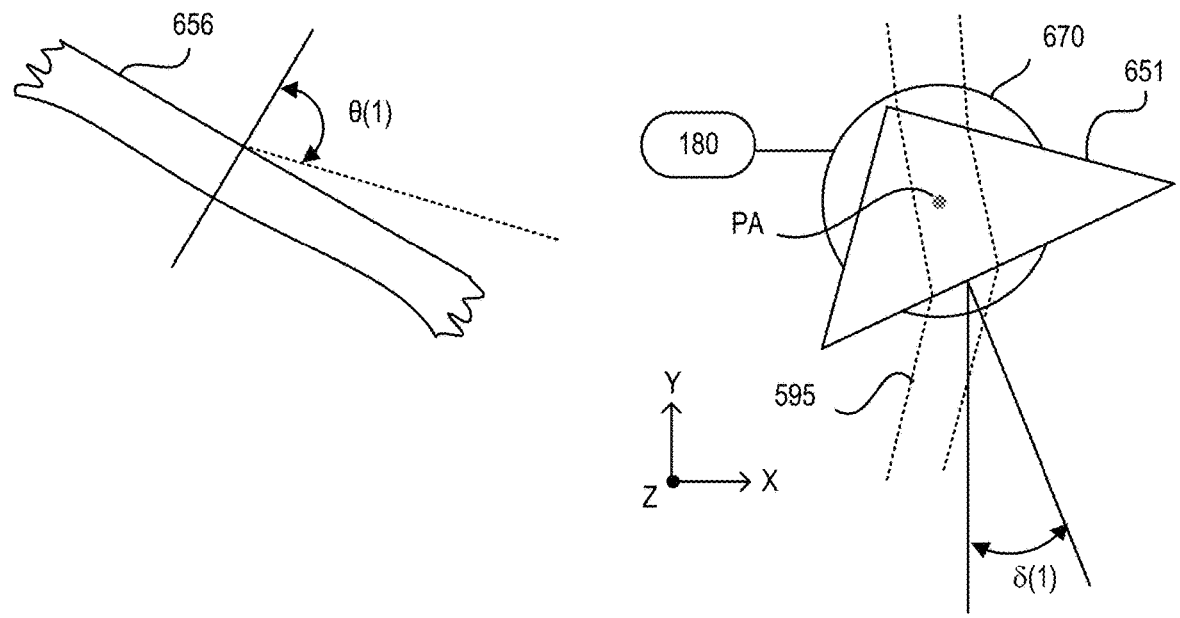
FIG. 7A is a schematic diagram showing a prism of FIG. 6A in a first state or position corresponding to a first spectral feature of the amplified light beam.
Figure 7B:
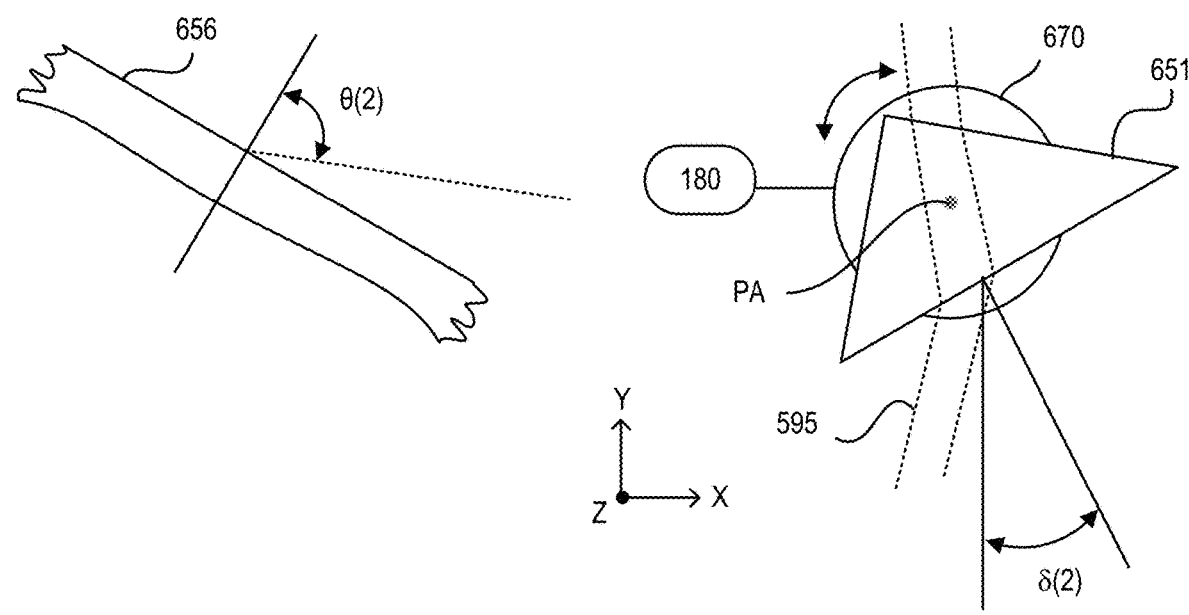
FIG. 7B is a schematic diagram showing the prism of FIG. 7A in a second state or position corresponding to a second spectral feature of the amplified light beam.

Referring to the example of FIGS. 7A and 7B, the prism 651 is driven by the drive actuator 670 among a set of discrete positions by being rotated about its prism axis PA (which is along the Z direction in FIGS. 6A, 6B, 7A, and 7B) to a set of discrete angles. In this particular example, in FIG. 7A, the prism 651 is positioned at a first local beam refraction angle $\delta(1)$. At the first local beam refraction angle $\delta(1)$, the pre-cursor light beam 595 impinges upon the surface 656 of the grating 655 at a first angle of incidence $\theta(1)$. In FIG. 7A, only the center line of the pre-cursor light beam 595 is shown for clarity. At this first angle of incidence $\theta(1)$, the grating 655 diffracts and reflects a first wavelength of the pre-cursor light beam 595. In FIG. 7B, the prism 651 has been rotated about the prism axis PA to a second local beam refraction angle $\delta(2)$. At the second local beam refraction angle $\delta(2)$, the pre-cursor light beam 595 impinges upon the surface 656 of the grating 655 at a second angle of incidence $\theta(2)$. In FIG. 7B, only the center line of the pre-cursor light beam 595 is shown for clarity. At this second angle of incidence $\theta(2)$, the grating 655 diffracts and reflects a second wavelength of the pre-cursor light beam 595. As noted above, rotation of the prism 651 can also affect the bandwidth of the pre-cursor light beam 595. If this happens, then it may be that the bandwidth is affected by an insignificant amount, or another prism (such as prism 650, 652, 653) is rotated to offset the change in the bandwidth.

Figure 8:
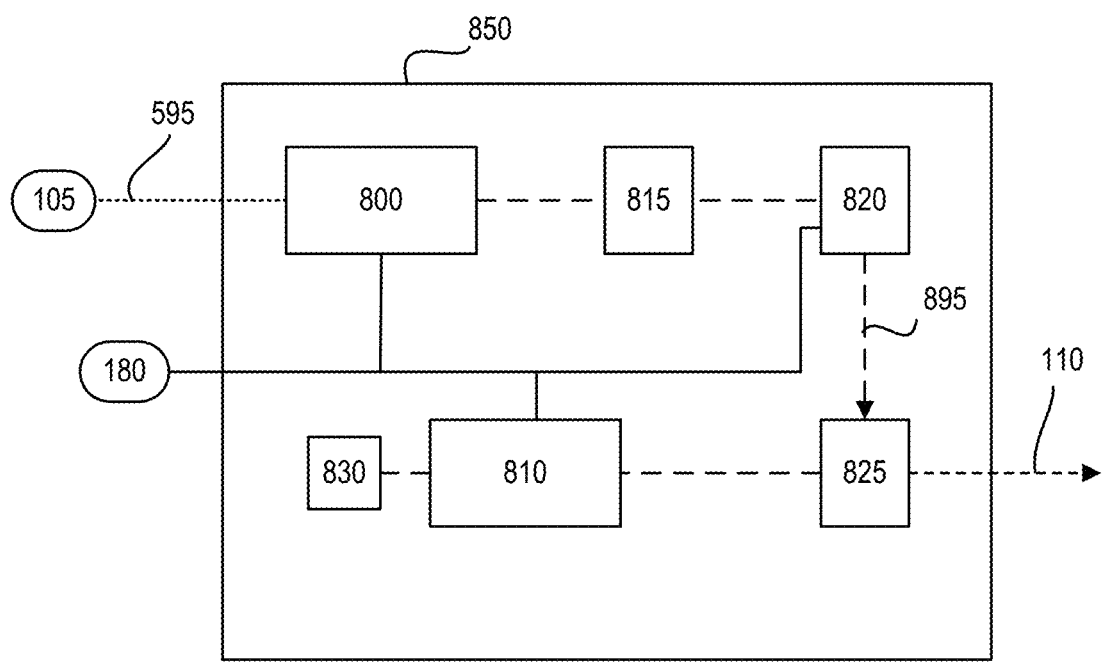
FIG. 8 is a block diagram of an implementation of an optical source of the optical apparatus of FIG. 1.

Referring to FIG. 8, in some implementations, the optical source 150 is a pulsed laser optical source 850 that produces a pulsed laser beam as the amplified light beam 110. The optical source 850 is a two-stage system that includes a first gas discharge stage and a second gas discharge stage. The first discharge stage includes a first gas discharge chamber housing an energy source and containing a gas mixture that includes a first gain medium. the second gas discharge stage includes a second gas discharge chamber housing an energy source and containing a gas mixture that includes a second gain medium.

The first gas discharge stage includes a master oscillator (MO) 800 and the second gas discharge stage includes a power amplifier (PA) 810. The MO 800 provides a seed light beam 895 to the PA 810. The master oscillator 800 typically includes a gain medium in which amplification occurs and an optical feedback mechanism such as an optical resonator. The power amplifier 810 typically includes a gain medium in which amplification occurs when seeded with the seed laser beam from the master oscillator 800. If the power amplifier 810 is designed as a regenerative ring resonator then it is described as a power ring amplifier (PRA) and in this case, enough optical feedback can be provided from the ring design. The spectral feature adjuster 105 receives the pre-cursor light beam 595 from the master oscillator 800 to enable fine tuning of spectral parameters such as the center wavelength and the bandwidth of the light beam 895 at relatively low output pulse energies. The power amplifier 810 receives the light beam 895 from the master oscillator 800 and amplifies this output to attain the necessary power for output to use in photolithography by the lithography exposure apparatus 135.

The master oscillator 800 includes a discharge chamber having two elongated electrodes, a laser gas that serves as the gain medium, and a fan circulating the gas between the electrodes. A laser resonator is formed between the spectral feature adjuster 105 on one side of the discharge chamber, and an output coupler 815 on a second side of the discharge chamber to output the seed light beam 895 to the power amplifier 810.

The optical source 850 can also include a line center analysis module (LAM) 820 that receives an output from the output coupler 815, and one or more beam modification optical systems 825 that modify the size and/or shape of the beam as needed. The line center analysis module 820 is an example of one type of measurement system that can be used to measure the wavelength (for example, the center wavelength) of the seed light beam 895. Another measurement system that can be included in the optical source 850 is a bandwidth analysis module (not shown in FIG. 8), which is configured to measure or estimate a bandwidth of amplified light beam 110.

The power amplifier 810 includes a power amplifier discharge chamber, and if it is a regenerative ring amplifier, the power amplifier also includes a beam reflector or beam turning device 830 that reflects the light beam back into the discharge chamber to form a circulating path. The power amplifier discharge chamber includes a pair of elongated electrodes, a laser gas that serves as the gain medium, and a fan for circulating the gas between the electrodes. The seed light beam 895 is amplified by repeatedly passing through the power amplifier 810. The beam modification optical system 825 provides a way (for example, a partially-reflecting mirror) to in-couple the seed light beam 895 and to out-couple a portion of the amplified radiation from the power amplifier to form the amplified light beam 110.

The laser gas used in the discharge chambers of the master oscillator 800 and the power amplifier 810 can be any suitable gas for producing a laser beam around the required wavelengths and bandwidth. For example, the laser gas can be argon fluoride (ArF), which emits light at a wavelength of about 193 nm, or krypton fluoride (KrF), which emits light at a wavelength of about 248 nm.

The line center analysis module 820 monitors the wavelength of the output (the seed light beam 895) of the master oscillator 800. The line center analysis module 820 can be placed at other locations within the optical source 850, or it can be placed at the output of the optical source 850.

In general, the control apparatus 180 includes one or more of digital electronic circuitry, computer hardware, firmware, and software. The control apparatus 180 includes memory, which can be read-only memory and/or random-access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks. The control apparatus 180 can also include one or more input devices (such as a keyboard, touch screen, microphone, mouse, hand-held input device, etc.) and one or more output devices (such as a speaker or a monitor).

The control apparatus 180 includes one or more programmable processors, and one or more computer program products tangibly embodied in a machine-readable storage device for execution by a programmable processor. The one or more programmable processors can each execute a program of instructions to perform desired functions by operating on input data and generating appropriate output. Generally, the processor receives instructions and data from memory. Any of the foregoing may be supplemented by, or incorporated in, specially designed ASICs (application-specific integrated circuits).

The control apparatus 180 includes a set of modules, with each module including a set of computer program products executed by one or more processors such as the processors. Moreover, any of the modules can access data stored within the memory. Each module can be in communication with a dedicated other component of the apparatus 100 (for example, the optical source 150, the interface 145, the spectral feature adjuster 105, or the lithography exposure apparatus 135). Each module can receive data from the other component and then analyze such data as needed. Each module can be in communication with one or more other modules.

Although the control apparatus 180 is represented as a box (in which all of its components can be co-located), it is possible for the control apparatus 180 to be made up of components that are physically remote from each other. For example, a particular module can be physically co-located with the optical source 150 or a particular module can be physically co-located with the spectral feature adjuster 105.

In general, the control apparatus 180 can perform functions not discussed herein. For example, the control apparatus 180 can receive at least some information about the amplified light beam 110 from a measurement system (not shown) in the optical apparatus 130, and an internal spectral feature analysis module performs an analysis on the information to determine how to adjust one or more spectral features (for example, the bandwidth) of the amplified light beam 110 supplied to the lithography exposure apparatus 135. Based on this determination, the control apparatus 180 sends signals to the spectral feature adjuster 105 and/or the optical source 150 to control operation of the optical source 150.

Referring to FIG. 9, a timing diagram 900A shows one implementation of how the apparatus 100 operates during the production of a burst 120 of pulses 115 and a block diagram of the apparatus 100 is shown in connection with a discussion of the timing diagram 900A. The timing diagram 900A only shows 16 pulses 915 of the amplified light beam 110. Nevertheless, the burst 120 can include fewer or greater than 16 pulses and the signals shown in FIG. 9 can extend in time beyond what is shown in FIG. 9. In this implementation, the information H provided from the lithography exposure apparatus 135 to the interface 145 (and conveyed to the control apparatus 180) includes a trigger signal 906. The trigger signal 906 is in the form of a train of electrical pulses 907, with adjacent electrical pulses 907 being separated in time tp by a generally constant spacing that is inversely proportional to the desired pulse repetition rate Rp of the amplified light beam 110. Each electrical pulse 907 instructs the optical apparatus 130 (via the control apparatus 180) to produce one pulse 915 of the amplified light beam 110 and the separation in time between adjacent pulses 915 in the pulse train 911 is τ (which is correlated with, or equal to, the separation time tp). In this way, the amplified light beam 110 is produced with the pulse repetition Rp defined by 1/τ.

In the implementation of FIG. 9, a driving signal 917 is provided from the optical apparatus 130 (via the control apparatus 180) to the spectral feature adjuster 105 by way of the communication channel 971. The actual state of the spectral feature adjuster 105 (which changes based on the driving signal 917) is represented by the waveform 918. The shape of the driving signal 917 is defined by a set of parameters. In this implementation, the driving signal 917 has a continuous sinusoidal (and therefore, periodic) shape that drives the spectral feature adjuster 105 between its two discrete states 918a and 918b, which are targeted or desired by the lithography exposure apparatus 135. Moreover, in this implementation, each time a pulse 915 in the burst is produced, the spectral feature adjuster 105 is in one of its discrete states 918a or 918b. In FIG. 9, there is an assumption that the spectral feature adjuster 105 has already reached a steady state and that the timing between the spectral feature adjuster 105 and the production of the pulses 915 is synchronized. Thus, at the discrete state 918a, the spectral feature adjuster 105 selects a discrete value of the spectral feature (for example, wavelength λa) of the pulse 915 that is produced at that time. And, at the discrete state 918b, the spectral feature adjuster 105 selects a discrete value of the spectral feature (for example, wavelength λb) of the pulse 915 that is produced at that time. For example, if the spectral feature adjuster 105 is designed as shown in FIGS. 6A-7B, then the spectral feature adjuster 605 includes a prism 651 that can be rotated between two distinct, and in this example, extreme, states about its prism axis PA. And, while in a first state (such as shown in FIG. 7A), the prism 651 is positioned at the first local beam refraction angle $\delta(1)$ while in a second state (such as shown in FIG. 7B), the prism 651 is positioned at the second local beam refraction angle $\delta(2)$.

Referring to FIG. 10, a timing diagram 900B shows one implementation of how the apparatus 100 operates in between the production of bursts 120 of pulses 115. Additionally, a block diagram of the apparatus 100 is shown in connection with a discussion of the timing diagram 900B. The timing diagram 900B shows only two pulses 915 of the amplified light beam 110 on either side of the region B (the inter-burst interval). The inter-burst interval can last longer or shorter than what is shown in FIG. 10, and the signals that are shown can extend in time beyond what is shown in FIG. 10. In this implementation, during the inter-burst interval, the electrical pulses 907 of the trigger signal 906 provided by the lithography exposure apparatus 135 to the interface 145 are halted (or stopped) so as to halt the production of the pulses 115 from the optical apparatus 130.

Nevertheless, even though there are no electrical pulses 907 provided to the interface 145, the optical apparatus 130 (via the control apparatus 180) continues to drive the spectral feature adjuster 105 according to the driving signal 917, which is defined by the set of parameters. By driving the spectral feature adjuster 105 during the inter-burst interval, the spectral feature adjuster 105 continues to be driven in a steady-state mode. There is no time during which the spectral feature adjuster 105 must transition from a resting mode (in which the spectral feature adjuster 105 is resting or immobile such as at time 0 in FIG. 2A) to the steady-state mode (such as at time t(ss) in FIG. 2A). As discussed above with respect to FIG. 2A, a transition from a resting mode to the steady-state mode results in a sudden change in voltage or load on the entire system that includes the spectral feature adjuster 105 and the control apparatus 180, and this causes unwanted transients to occur.

By driving the spectral feature adjuster 105 during the inter-burst interval, there is no time during which the spectral feature adjuster 105 must transition from a resting mode (in which the spectral feature adjuster 105 is resting or immobile) to the steady-state mode, and thus these unwanted transients are avoided. In effect, the spectral feature adjuster 105 is always controlled or operated at a steady state.

While not discussed in detail herein, transients can still occur each time the lithography exposure apparatus 135 requests a change in the pulse repetition rate Rp, because in this situation, the frequency of the driving signal 917 to the spectral feature adjuster 105 may need to be changed.

In some implementations, during the inter-burst interval, the optical apparatus 130 (via the control apparatus 180) continues to drive the spectral feature adjuster 105 in a manner that is related to information H received from the lithography exposure apparatus 135.

Moreover, unlike what is shown in FIG. 2A, the implementation of FIG. 10 ensures that the spectral feature adjuster 105 is in one of the discrete states 918a or 918b that corresponds to a discrete value of the spectral feature of the amplified light beam 110 when a pulse 915 in the next burst is produced. To put it another way, the apparatus 100 ensures that the pulse 915 that is fired after an inter-burst interval has a spectral feature (for example, wavelength) that is desired by the lithography exposure apparatus 135. There are different ways in which the apparatus 100 can ensure that the pulse 915 that is fired after an inter-burst interval has a spectral feature (for example, wavelength) that is desired by the lithography exposure apparatus 135. These different ways are discussed next. It is possible for the apparatus 100 to implement two or more of the ways at any one moment or within an inter-burst interval in order to ensure that the pulse 915 that is fired after an inter-burst interval has a spectral feature (for example, wavelength) that is desired by the lithography exposure apparatus 135. Thus, it is possible that one of the ways discussed below is not enough to ensure that this condition happens but the combination of two of the ways is enough.

Referring to FIG. 11, in one implementation, the spectral feature adjuster 105 is driven during the inter-burst interval (in between the production of bursts of pulses 915) at a frequency ω that is correlated with the pulse repetition rate Rp that is desired by and set by the lithography exposure apparatus 135. FIG. 11 shows a timing diagram 1100B that represents an implementation of how the apparatus 100 operates in between the production of bursts 120 of pulses 115 and also a corresponding block diagram of the apparatus 100 that relates to the timing diagram 1100B. The pulse repetition rate Rp is a part of the information H provided to the interface 145 and is equal to 1/τ (which is the time between the pulses 915). Thus, the frequency ω of the sinusoidal driving signal 1117 is such that there is a correlation between the frequency ω and the pulse repetition rate Rp: corr (ω, Rp). For example, as shown in FIG. 11, the frequency ω of the sinusoidal driving signal 1117 is one half of the pulse repetition rate Rp. The frequency ω is 1/κ, where κ is the period of the sinusoidal driving signal 1117. In this example, the period κ of the sinusoidal driving signal 1117 is twice the time τ between the pulses 915.

Even though the spectral feature adjuster 105 is driven at a frequency ω that is correlated with the pulse repetition rate Rp, it is still possible for there to be a mismatch in time between the production of the pulse 915 in the next burst of pulses that follows the inter-burst time interval T and the moment at which the spectral feature adjuster 105 reaches one of the discrete states 918a or 918b. This mismatch is shown in FIG. 11. The reason that this mismatch is still possible is that the optical apparatus 130 may not be able to predict or does not know when the lithography exposure apparatus 135 will send another electrical pulse 907 in the trigger signal 906 to the interface 145. To put it another way, the optical apparatus 130 does not know the duration of the trigger inter-burst time interval $T_L$. Because of this, the optical apparatus 130 would be unable to properly synchronize the moment at which the spectral feature adjuster 105 reaches one of the discrete states 918a or 918b with the moment that a pulse 915 in the next burst is produced.

Referring to FIG. 12, an implementation of a timing diagram 1200B is shown along with a block diagram of the apparatus 100 that corresponds to the timing diagram 1200B. In this implementation, the mismatch in time between the pulse 915 in the next burst of pulses that follows the inter-burst time interval T and the moment at which the spectral feature adjuster 105 reaches one of the discrete states 918a or 918b is removed. In this implementation, the trigger inter-burst time interval $T_L$, and therefore the inter-burst time interval T, is adjusted so that the inter-burst time interval T is an integer multiple of the time interval τ between pulses 915 at the current pulse repetition rate Rp. That is, T=τ×i, where i is an integer.

In the implementation of FIG. 11, a change in operation of the control apparatus 180 is needed in order to change how the spectral feature adjuster 105 is driven during the inter-burst interval. By contrast, in the implementation of FIG. 12, a change in operation of the lithography exposure apparatus 135 is needed in order to change the trigger inter-burst time interval $T_L$.

While FIG. 12 shows the inter-burst time interval τ as corresponding to a time interval between the production of the last pulse in the last burst and the first pulse in the next burst, it is possible for the inter-burst time interval to correspond to a time interval based on other pulses in the respective last burst and the next burst. For example, the inter-burst time interval τ could correspond to a time interval between the production of the laser pulse (such as pulse 115_12A of burst 120A in FIG. 2A) and a pulse that follows the first pulse of the next burst (such as a pulse that follows the pulse 115_1C of burst 120C in FIG. 2A).

Figure 13:
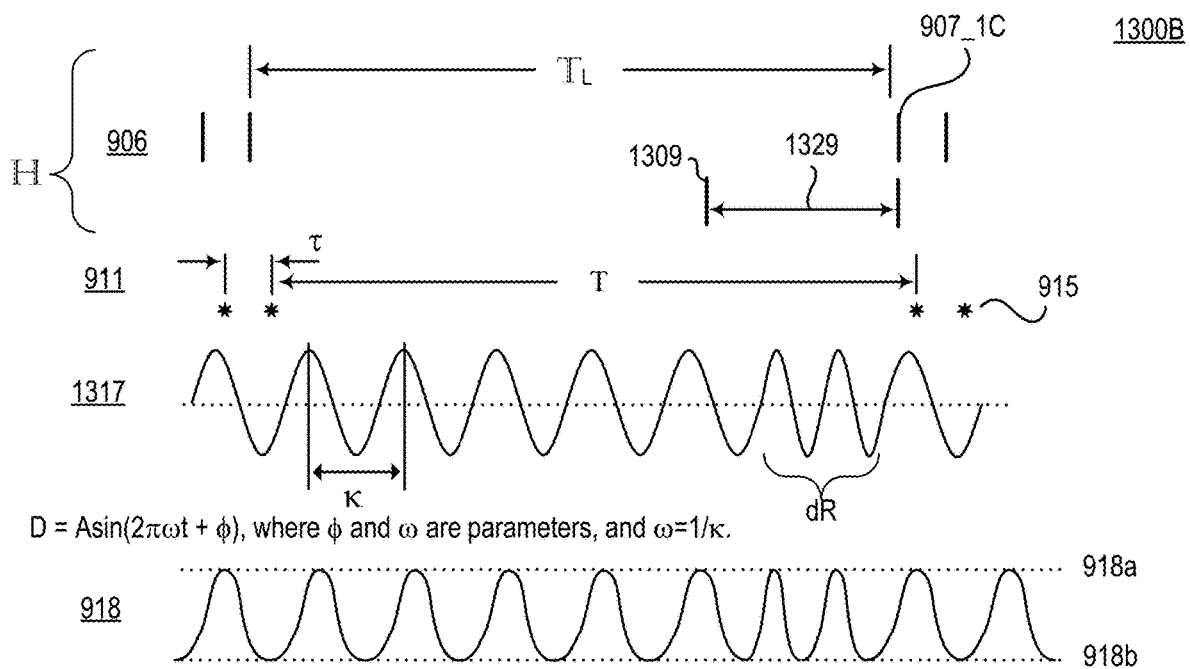
FIG. 13 is a timing diagram of an implementation of the apparatus of FIG. 1 operating in a manner that removes the mismatch in time between the pulse in the next burst of pulses that follows an inter-burst time interval and the moment at which the spectral feature adjuster reaches one of the discrete states, and also a corresponding block diagram of the apparatus that corresponds to the timing diagram.

Referring to FIG. 13, an implementation of a timing diagram 1300B is shown along with a block diagram of the apparatus 100 that corresponds to the timing diagram 1300B. The mismatch in time between the pulse 915 in the next burst of pulses that follows the inter-burst time interval T and the moment at which the spectral feature adjuster 105 reaches one of the discrete states 918a or 918b is removed.

In this implementation, the information H from lithography exposure apparatus 135 includes an indication 1309 about the time at which the lithography exposure apparatus 135 will send the first electrical trigger pulse 907_1C of the next burst of pulses to the interface 145. The indication 1309 is received by the control apparatus 180 in advance of the first electrical pulse 907_1C. With this additional information (the indication 1309), and assuming there is enough time between the indication 1309 and the first electrical trigger pulse 907_1C, the control apparatus 180 can determine if there would be a mismatch in time between the production of the pulse 915_1C in the next burst of pulses and the time at which the spectral feature adjuster 105 is in one of the discrete states 918a or 918b in the case that the driving signal 1317 provided to the spectral feature adjuster 105 is not modified. If the control apparatus 180 determines (based on the receipt of the indication 1309) that there would be a mismatch in time between the production of the pulse 915_1C in the next burst of pulses and the time at which the spectral feature adjuster 105 is in one of the discrete states 918a or 918b, then the control apparatus 180 can adjust the driving signal 1317 to the spectral feature adjuster 105. For example, the control apparatus 180 can adjust the driving signal 1317 by modifying one or more of the parameters P associated with the driving signal 1317, and such modification can account for the information provided by the lithography exposure apparatus 135. For example, if the driving signal 1317 is a sinusoidal waveform D, then it is generally governed by a set of parameters such as a phase ($\phi$) and the frequency $\omega$ of the driving signal 1317 as follows:

$$D = A\sin(2\pi\omega t + \phi), \text{ where } t \text{ is a time.}$$

The phase $\phi$ of the driving signal 1317 is the initial phase, which in the equation above is given in radians and corresponds to the position of the waveform D at an initial point in time. It can be referred to as a phase offset, phase shift, or phase factor. An instantaneous phase of the waveform D is given by $\omega t + \phi$.

Thus, the control apparatus 180 can modify the frequency $\omega$ of the driving signal 1317, the phase $\phi$ of the driving signal 1317 or both the frequency $\omega$ and the phase $\phi$ of the driving signal 1317. In the implementation shown in FIG. 13, the parameters (such as the frequency $\omega$) of the driving signal 1317 are modified in region dR. Additionally, if, in the region dR the frequency $\omega$ is modified, then it would be necessary to change the frequency $\omega$ back to be correlated with the pulse repetition rate Rp at the start of the next burst so that the driving signal 1317 can remain synchronized with the production of the pulses 915. The modification of the driving signal 1317 changes how the spectral feature adjuster 105 is driven as shown by changing the frequency and/or phase of the waveform 918.

The time delay 1329 between the receipt of the indication 1309 and the receipt of the electrical trigger pulse 907_1C is large enough to enable the control apparatus 180 to have enough time to modify the one or more parameters of the driving signal 1317 so that the spectral feature adjuster 105 is in one of the discrete states when the pulse 915 in the burst is produced. For example, the time delay 1329 can be about 25-35 milliseconds (ms).

Referring to FIG. 14, another implementation of a timing diagram 1400B is shown along with a block diagram of the apparatus 100 that corresponds to the timing diagram 1400B. The mismatch in time between the pulse 1415 in the next burst of pulses that follows the inter-burst time interval T and the moment at which the spectral feature adjuster 105 reaches one of the discrete states 918a or 918b is removed by adjusting aspects of a control signal 1481 provided to the optical source 150 to control the production of the pulses 1415 in the pulse train 1411. In this implementation, the control apparatus 180 drives the spectral feature adjuster 105 according to one or more fixed parameters P and these fixed parameters P do not need to be modified in this implementation.

The control apparatus 180 receives a request from the lithography exposure apparatus 135 (via the interface 145, which receives the information H) to produce the next burst of pulses 1415. The request is in the form of the first trigger pulse 1407_1 following the trigger inter-burst time interval $T_L$. As discussed above, in normal operation, the optical apparatus 130 produces the pulse 1415_1 after the time delay t1 following the receipt of the trigger pulse 1407_1. This time delay t1 is inherent in the design of the optical apparatus 130 because the optical apparatus 130 requires some amount of time to react to the trigger pulse 1407_1. For example, the control apparatus 180 processes (receives and analyzes) the trigger pulse 1407_1, and then provides a signal to the optical source 150 to produce the pulse 1415_1. The time it takes between the receipt of the trigger pulse 1407_1 and the production of the pulse 1415_1 of the amplified light beam 110 corresponds to this time delay t1.

In this implementation, however, instead of the control apparatus 180 providing an instruction in the control signal 1481 to the optical source 150 to produce the pulse 1415_1 in the next burst of pulses (as it would normally do) as soon as the control apparatus 180 receives the trigger pulse 1407_1, the control apparatus 180 provides an instruction in the control signal 1481 to delay, for a period of time Err greater than zero, the production of the pulse 1415_1 in the next burst of pulses 1415 relative to the receipt of the request (the trigger pulse 1407_1) from the lithography exposure apparatus 135. The control apparatus 180 determines the value of the delay Err that would ensure that the spectral feature adjuster 105 can be driven to one of the discrete states 918a or 918b when the pulse 1415 in the next burst of pulses is produced. The total time between the receipt of the trigger pulse 1407_1 and the production of the pulse 1415_1 is therefore t1+δτ.

Referring to FIG. 15, an implementation of a timing diagram 1500B is shown along with a block diagram of the apparatus 100 that corresponds to the timing diagram 1500B. The mismatch in time between the pulse 915 in the next burst of pulses that follows the inter-burst time interval T and the moment at which the spectral feature adjuster 105 reaches one of the discrete states 918a or 918b is removed. In this implementation, the optical apparatus 130, via the control apparatus 180 and the interface 145, sends a signal 1508 to the lithography exposure apparatus 135. The signal 1508 sent to the lithography exposure apparatus 135 includes information related to how the spectral feature adjuster 105 is being driven during the inter-burst time interval. In this way, the lithography exposure apparatus 135 can adjust a trigger signal 1506 in a manner that ensures that the time at which the pulse 915 in the next burst of pulses that follows the inter-burst time interval is produced is synchronized with the moment at which the spectral feature adjuster 105 reaches one of the discrete states 918a or 918b. For example, as shown, the trigger signal 1506 is adjusted to delay the first electrical pulse in the next burst after the trigger inter-burst time interval $T_L$ by an amount dt, and this delay dt propagates to the time at which the first pulse in the next burst of pulses is produced. Thus, the inter-burst time interval T is increased by dt.

Figure 16:
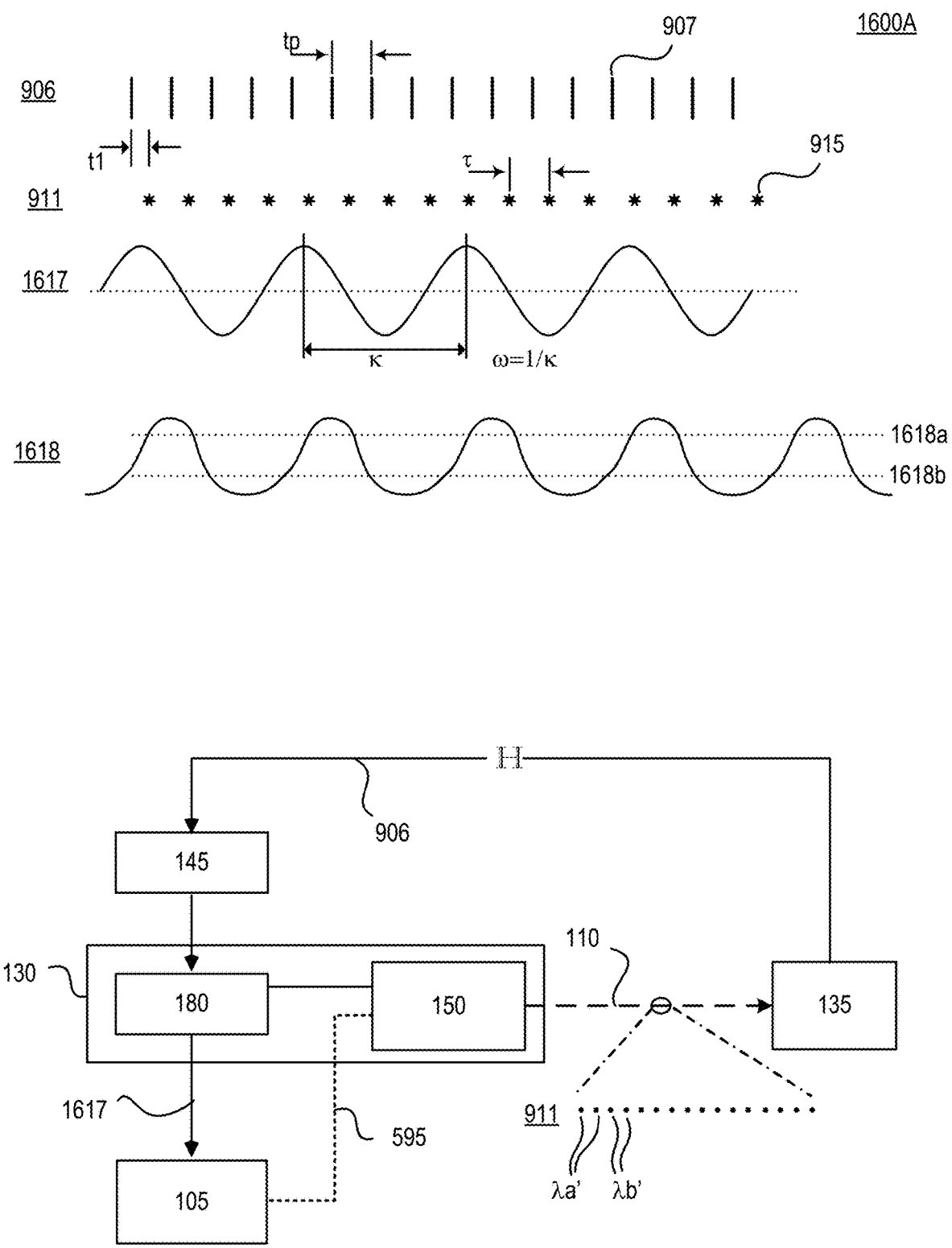
FIG. 16 is a timing diagram of an implementation of the apparatus of FIG. 1 operating in a manner in which the frequency of a sinusoidal driving signal provided to the spectral feature adjuster is one fourth of the pulse repetition rate.
Figure 17A:
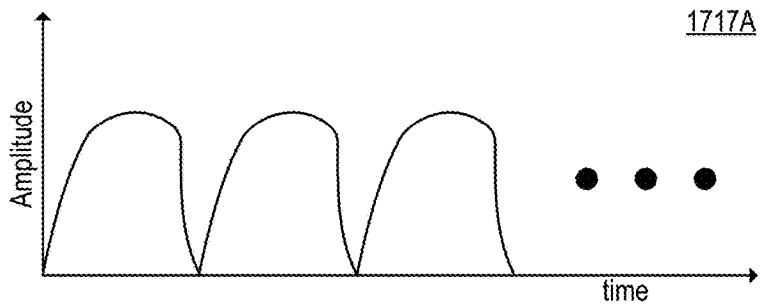
FIGS. 17A-17D are graphs of other implementations of a driving signal that the apparatus can provide to the spectral feature adjuster.
Figure 17B:
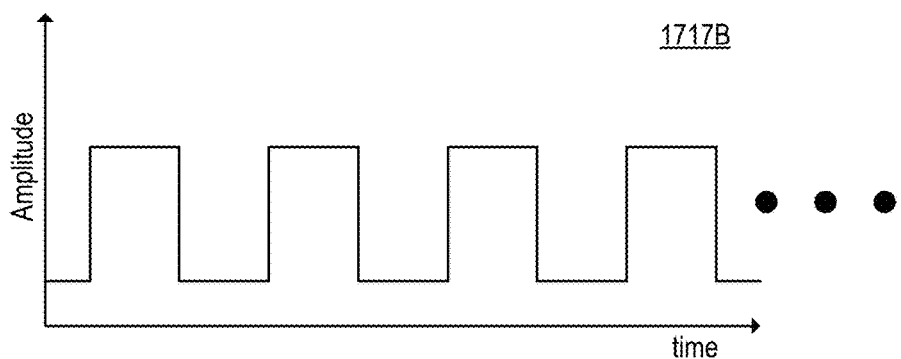
Figure 17C:
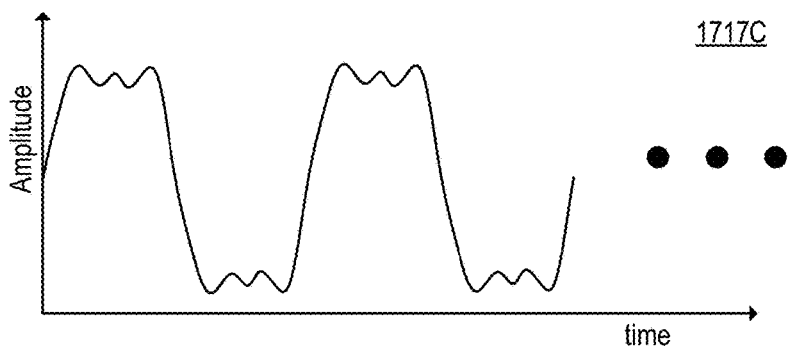
Figure 17D:
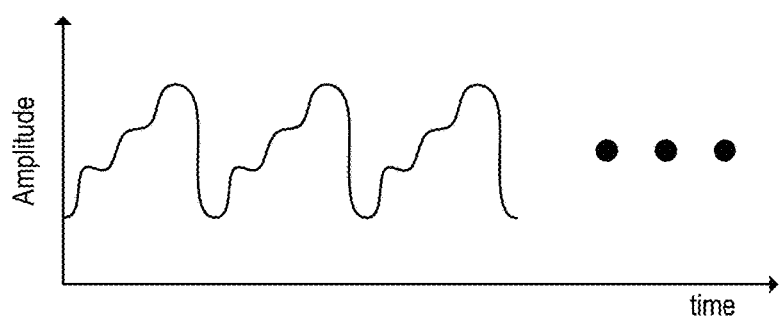

As discussed above with reference to FIG. 9, the frequency $\omega$ of the sinusoidal driving signal 917 is one half of the pulse repetition rate Rp, as shown in the timing diagram 900A. Referring to FIG. 16, in other implementations, the frequency $\omega$ of the sinusoidal driving signal 1617 is one fourth of the pulse repetition rate Rp, as shown in the timing diagram 1600A. The frequency $\omega$ is 1/κ, where κ is the period of the sinusoidal driving signal 1617, and thus, the period κ of the sinusoidal driving signal 1617 is four times the time τ between the pulses 915. The spectral feature adjuster 105 passes through two intermediate, but distinct and desired states 1618a and 1618b as it travels between two extreme states. Each of these intermediates states 1618a, 1618b corresponds to a respective distinct wavelength λa' and λb'. In this implementation, adjacent and consecutive pulses 915 have the wavelength λa' and the next two adjacent and consecutive pulses 915 have the wavelength λb' and this pattern repeats until the next inter-burst time interval or until the control apparatus 180 changes the driving signal 1617.

As mentioned above, the waveform of the driving signal 217, 917 can be different from a triangular or a sinusoidal shape and other waveforms are possible. The shape of the waveform of the driving signal 217, 917 impacts the shape of the waveform (such as 218 or 918) of the spectral feature adjuster 105. For example, other possible implementations of the waveform 1717A, 1717B, 1717C, and 1717D are shown, respectively, in FIGS. 17A, 17B, 17C, and 17D of the driving signal supplied to the spectral feature adjuster 105.

Figure 18:
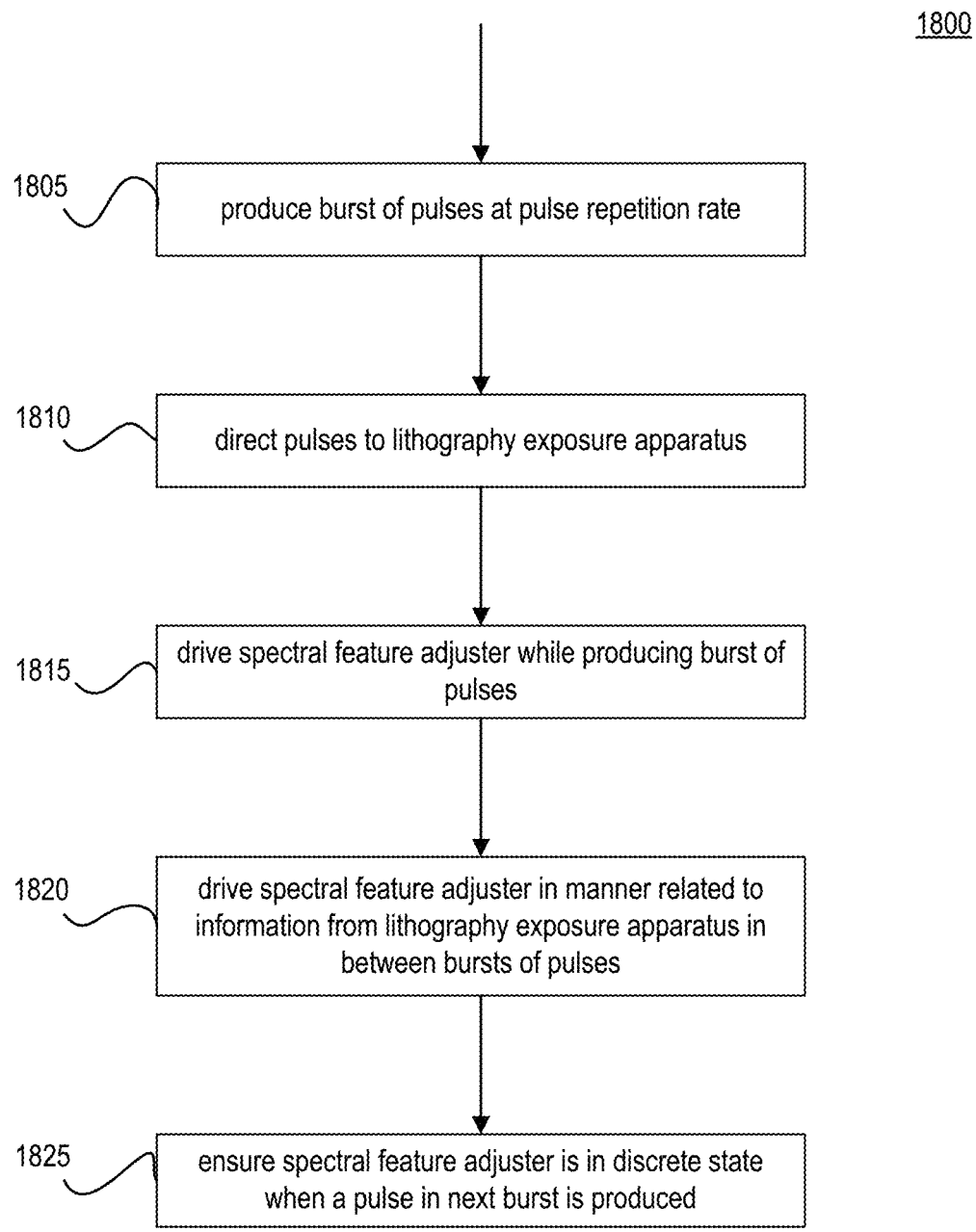
FIG. 18 is a procedure performed by the apparatus of FIG. 1 for ensuring that each pulse directed to the lithography exposure apparatus and produced after an inter-burst gap has a desired spectral feature (wavelength) from among a set of discrete and desired spectral features.

Referring to FIG. 18, a procedure 1800 is performed by the apparatus 100 for ensuring that each pulse 115 directed to the lithography exposure apparatus 135 and produced after an inter-burst gap 125 has a desired spectral feature (wavelength) from among a set of discrete and desired spectral features. Reference is also made to FIGS. 1-16 when discussing the steps of the procedure 1800.

The procedure 1800 includes producing the burst of pulses of an amplified light beam at a pulse repetition rate Rp (1805) and directing the pulses to the lithography exposure apparatus (1810). For example, the pulses 115 of the burst 120 are produced and directed to the lithography exposure apparatus 135, as shown in FIG. 1.

While producing the pulse burst 120, the spectral feature adjuster 105 is driven among the set of discrete states at a frequency correlated with the pulse repetition rate Rp (1815). For example, the control apparatus 180 sends a driving signal 217 to the spectral feature adjuster 105 to drive the spectral feature between discrete states 218a and 218b, as shown in FIGS. 2A and 2B, and the frequency ω of the driving signal 217 is correlated with the pulse repetition rate Rp of the pulse train 211. Each discrete state (such as discrete states 218a and 218b) corresponds to a discrete value of the spectral feature (for example, wavelength) of the amplified light beam 110 out of a plurality of pre-set discrete values of the spectral feature. In this way, each time a pulse 115 in the burst 120 is produced, the spectral feature adjuster 105 exists in one of the discrete states and the amplified light beam pulse 115 has a spectral feature that corresponds to that discrete state. For example, when the spectral feature adjuster 105 is in the state 918a, the wavelength of the pulse 915 is λa and when the spectral feature adjuster 105 is in the state 918b, the wavelength of the pulse 915 is λb, as shown in FIG. 9.

In between the production of the bursts of pulses and while no pulses are being produced, the spectral feature adjuster 105 is driven in a manner that is related to information received from the lithography exposure apparatus (1820). For example, as shown in FIGS. 2A and 2B, the control apparatus 180 continues to drive spectral feature adjuster 105 with the driving signal 217 even during the inter-burst time interval T, that is, between the production of the burst 120A and the burst 120C. The driving signal 217 has properties that are determined based on the information H received from the lithography exposure apparatus 135.

The procedure 1800 ensures that the spectral feature adjuster 105 is in one of the discrete states that corresponds to a discrete value of the spectral feature of the amplified light beam when a pulse in the next burst (following this inter-burst time interval T) is produced (1825). For example, the apparatus 100 ensures that the spectral feature adjuster 105 is in one of the states 218a or 218b when one of the pulses 115_iC in the next burst 120C is produced. As discussed above and with reference to FIGS. 9-16, there are different implementations to ensure that the spectral feature adjuster 105 is in one of the discrete states that corresponds to a discrete value of the spectral feature of the amplified light beam 110 when a pulse 115 in the next burst 120 (following this inter-burst time interval T) is produced (1825). Any one or more of these implementations can be utilized.

Referring to FIGS. 19A-19D, a set of respective graphs are shown for simulating the operation of the apparatus 100 and the procedure 1800. FIGS. 19A-19D each show a graph of the operation of the spectral feature adjuster 105 (in arbitrary units) versus time over six bursts of pulses (and five inter-burst gaps). Moreover, the graphs begin at a time at which the spectral feature adjuster 105 is in a rest state. Thus, the spectral feature adjuster 105 begins each simulation in a transition or intermediate operation in which it suffers from transients.

The gray waveform in each graph represents actual position or state of the spectral feature adjuster 105, and this is represented in terms of the actual spectral feature (since each state corresponds to a specific spectral feature of a light beam that interacts with the spectral feature adjuster 105 while it is in that state). The gray waveform therefore corresponds to the waveform 218 or 918. Each targeted discrete state of the spectral feature adjuster 105 is represented by state 1918a and 1918b. The dots on each graph indicate an instance at which a pulse 115 is produced and directed toward the lithography exposure apparatus 135. These simulations are performed for the implementations described in FIGS. 9-12, and in which the frequency ω of the sinusoidal driving signal 917 is one half of the pulse repetition rate Rp. The simulations are performed at the start of a burst after an inter-burst time interval T and at the start of performing the procedure 1800.

The location of the dot along the vertical axis (the spectral feature axis) indicates the location at which the pulse at that time (along the horizontal or time axis) samples the spectral feature. This location corresponds to the value of the spectral feature for the produced pulse that is sent to the lithography exposure apparatus 135.

In FIG. 19A, the operation of the apparatus 100 is simulated after performing only steps 1805-1815 of the procedure 1800 but without performing steps 1820 and 1825. As evident, the pulses 115 rarely coincide with the desired spectral features 1918a and 1918b, and thus, the pulses 115 directed to the lithography exposure apparatus 135 would not have the desired spectral feature for patterning of the substrate.

In FIG. 19B, the operation of the apparatus 100 is simulated while the apparatus 100 operates as shown in FIG. 11. In this case, the driving signal 1117 supplied to the spectral feature adjuster 105 has a frequency ω that is correlated with the pulse repetition rate Rp. It can be seen that there is some improvement in the results, but it is not as good as FIG. 19D.

In FIG. 19C, the operation of the apparatus 100 is simulated while the apparatus 100 operates as shown in FIG. 12 but it does not operate as shown in FIG. 11. In this case, the driving signal 1117 supplied to the spectral feature adjuster 105 has a frequency ω that is not necessarily correlated with the pulse repetition rate Rp. However, the inter-burst time interval T is set to be an integer multiple of the time interval τ between pulses 915. It can be seen that there is some improvement in the results, but it is not as good as FIG. 19D.

In FIG. 19D, the operation of the apparatus 100 is simulated after performing all of the steps of FIG. 18. In this case, it is ensured that the spectral feature adjuster 105 is in one of the discrete states 1918a or 1918b when a pulse in the next burst is produced. The apparatus 100 operates as shown in FIGS. 9 and 10, and it also operates using both of the techniques described in FIGS. 11 and 12.

FIGS. 20A-20D show the respective portions 20A, 20B, 20C, and 20D of the graphs of FIGS. 19A-19D. Details of the waveforms are more evident in FIGS. 20A-20D.

Figure 21:
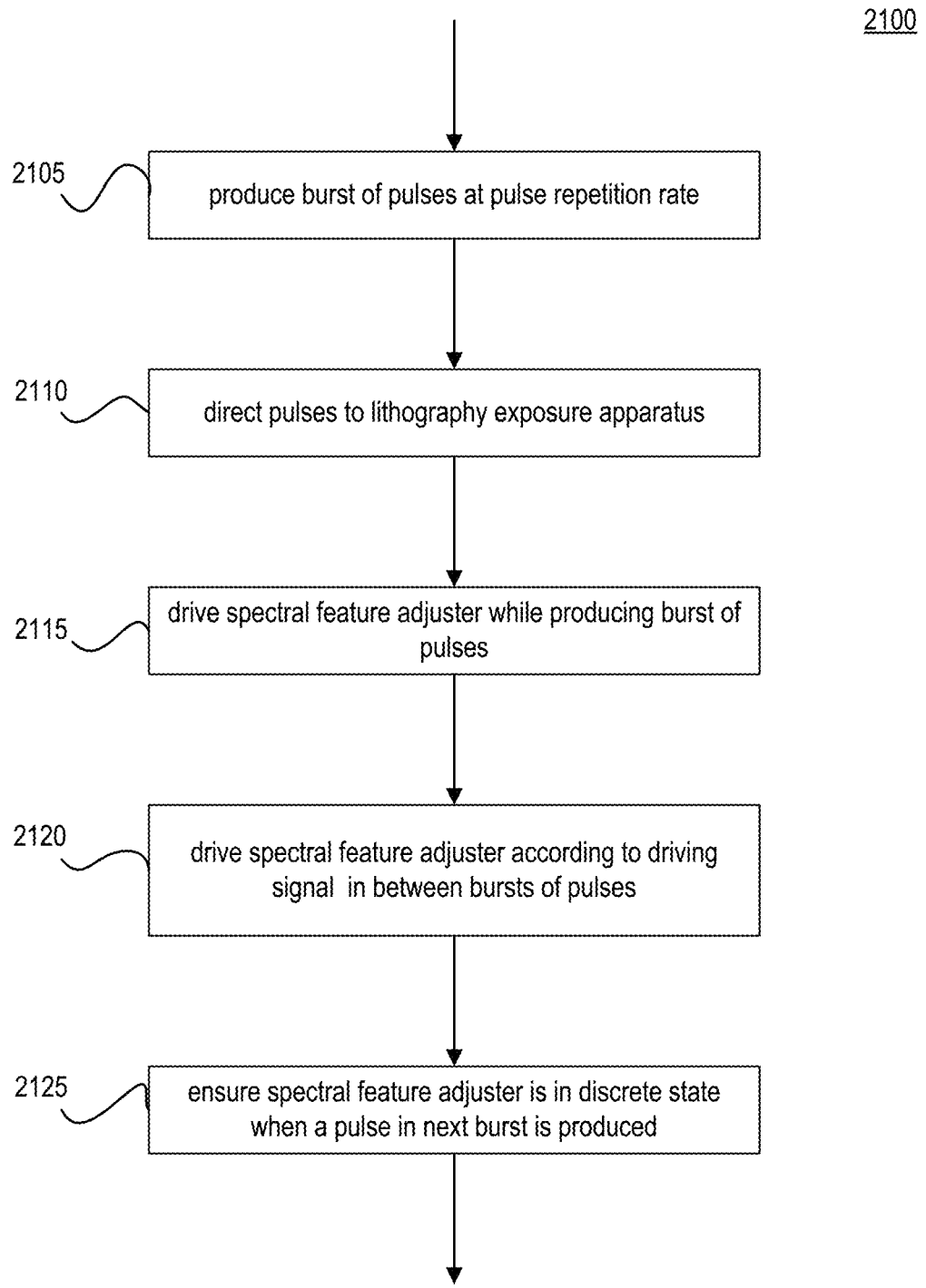
FIG. 21 is a procedure performed by the apparatus of FIG. 1 for ensuring that each pulse directed to the lithography exposure apparatus and produced after an inter-burst gap has a desired spectral feature (wavelength) from among a set of discrete and desired spectral features.

Referring to FIG. 21, in another implementation, a procedure 2100 is performed by the apparatus 100 (for example, under control of the control apparatus 180) for ensuring that each pulse 115 directed to the lithography exposure apparatus 135 and produced after an inter-burst gap 125 has a desired spectral feature (wavelength) from among a set of discrete and desired spectral features. Reference is also made to FIGS. 1-16 when discussing the steps of the procedure 2100.

The procedure 2100 includes the control apparatus 180 instructing the optical source 150 to produce the burst of pulses of the amplified light beam 110 at the pulse repetition rate Rp (2105). The pulses are directed to the lithography exposure apparatus (2110). For example, the pulses 115 of the burst 120 are produced and directed to the lithography exposure apparatus 135, as shown in FIG. 1.

While producing the pulse burst 120, the spectral feature adjuster 105 is driven among the set of discrete states at a frequency correlated with the pulse repetition rate Rp (2115). For example, the control apparatus 180 sends a driving signal 217 to the spectral feature adjuster 105 to drive the spectral feature between discrete states 218a and 218b, as shown in FIGS. 2A and 2B, and the frequency ω of the driving signal 217 is correlated with the pulse repetition rate Rp of the pulse train 211. Each discrete state (such as discrete states 218a and 218b) corresponds to a discrete value of the spectral feature (for example, wavelength) of the amplified light beam 110 out of a plurality of pre-set discrete values of the spectral feature. In this way, each time a pulse 115 in the burst 120 is produced, the spectral feature adjuster 105 exists in one of the discrete states and the amplified light beam pulse 115 has a spectral feature that corresponds to that discrete state. For example, when the spectral feature adjuster 105 is in the state 918a, the wavelength of the pulse 915 is λa and when the spectral feature adjuster 105 is in the state 918b, the wavelength of the pulse 915 is λb, as shown in FIG. 9.

In between the production of the bursts of pulses and while no pulses are being produced, the spectral feature adjuster 105 is driven in accordance with the parameters of the driving signal (2120). For example, as shown in FIGS. 2A and 2B, the control apparatus 180 continues to drive spectral feature adjuster 105 with the driving signal 217 even during the inter-burst time interval T, that is, between the production of the burst 120A and the burst 120C. The parameters of the driving signal 217 can be determined based on the information H received from the lithography exposure apparatus 135.

The procedure 2100 ensures that the spectral feature adjuster 105 is in one of the discrete states that corresponds to a discrete value of the spectral feature of the amplified light beam when a pulse in the next burst (following this inter-burst time interval T) is produced (2125). For example, the apparatus 100 ensures that the spectral feature adjuster 105 is in one of the states 218a or 218b when one of the pulses 115_iC in the next burst 120C is produced. The control apparatus 180 can adjust an instruction to the lithography exposure apparatus 135 (such as described with reference to FIG. 15) to ensure that the spectral feature adjuster 105 is in one of the discrete states that corresponds to a discrete value of the spectral feature of the amplified light beam when a pulse in the next burst (following this inter-burst time interval T) is produced (2125). The control apparatus 180 can adjust the driving signal to the spectral feature adjuster 105 (such as described with reference to FIG. 13) to ensure that the spectral feature adjuster 105 is in one of the discrete states that corresponds to a discrete value of the spectral feature of the amplified light beam when a pulse in the next burst (following this inter-burst time interval T) is produced (2125). The control apparatus 180 can adjust the instruction to the optical source 150 (such as described with reference to FIG. 14) to ensure that the spectral feature adjuster 105 is in one of the discrete states that corresponds to a discrete value of the spectral feature of the amplified light beam when a pulse in the next burst (following this inter-burst time interval T) is produced (2125).

The embodiments may further be described using the following clauses:

A1. A method comprising:

producing a burst of pulses of an amplified light beam at a pulse repetition rate and directing the pulses to a lithography exposure apparatus;

while producing the pulse burst, driving a spectral feature adjuster among a set of discrete states at a frequency correlated with the pulse repetition rate, with each discrete state corresponding to a discrete value of the spectral feature of the amplified light beam out of a plurality of pre-set discrete values of the spectral feature, such that, each time a pulse in the burst is being produced, the spectral feature adjuster is in one of the discrete states and the amplified light beam pulse has a spectral feature that corresponds to that discrete state;

in between the production of the bursts of pulses and while no pulses are being produced, driving the spectral feature adjuster in a manner that is related to information received from the lithography exposure apparatus; and ensuring that the spectral feature adjuster is in one of the discrete states that corresponds to a discrete value of the spectral feature of the amplified light beam when a pulse in the next burst is produced.

A2. The method of clause A1, wherein driving the spectral feature adjuster in the manner that is related to information received from the lithography exposure apparatus comprises driving the spectral feature adjuster at a frequency correlated with the pulse repetition rate.

A3. The method of clause A2, wherein ensuring that the spectral feature adjuster is in the discrete state when the pulse in the next burst is produced comprises adjusting an inter-burst time interval so that the inter-burst time interval is an integer multiple of the time interval between pulses for the pulse repetition rate.

A4. The method of clause A3, wherein the inter-burst time interval is the time interval between the last pulse in the burst and the first pulse in the next burst.

A5. The method of clause A2, wherein ensuring that the spectral feature adjuster is in the discrete state when the pulse in the next burst is produced comprises:

receiving an indication from the lithography exposure apparatus about the time at which it will request the production of the next burst; and if the received indication indicates a mismatch in time between the production of the first pulse in the next burst and the time at which the spectral feature adjuster is in the discrete state, then modifying one or more parameters associated with driving the spectral feature adjuster based on the received indication.

A6. The method of clause A5, wherein modifying the one or more parameters associated with driving the spectral feature adjuster comprises modifying one or more of a frequency and a phase of a driving signal associated with the spectral feature adjuster.

A7. The method of clause A6, further comprising, if the frequency at which the spectral feature adjuster is driven was modified due to a mismatch, then changing the frequency at which the spectral feature adjuster is driven at the start of the next burst to be correlated with the pulse repetition rate.

A8. The method of clause A1, wherein the spectral feature of the amplified light beam is a wavelength of the amplified light beam.

A9. The method of clause A8, wherein the wavelength of the amplified light beam is in the deep ultraviolet range.

A10. The method of clause A8, wherein driving the spectral feature adjuster among the set of discrete states at the frequency correlated with the pulse repetition rate comprises driving the spectral feature adjuster so that the wavelength of the amplified light beam changes for each pulse of the amplified light beam between two distinct wavelengths.

A11. The method of clause A8, wherein driving the spectral feature adjuster among the set of discrete states at the frequency correlated with the pulse repetition rate comprises driving the spectral feature adjuster so that the wavelength of the amplified light beam changes for every other pulse of the amplified light beam between two distinct wavelengths.

A12. The method of clause A1, wherein driving the spectral feature adjuster among the set of discrete states comprising driving the spectral feature adjuster according to a sinusoidal drive signal.

A13. The method of clause A1, wherein driving the spectral feature adjuster comprises moving an optic that interacts with a pre-cursor light beam between discrete locations, each discrete location of the optic corresponding to a discrete state, and the amplified light beam is formed from the pre-cursor light beam.

A14. The method of clause A13, wherein moving the optic that interacts with the light beam comprises rotating a prism through which the pre-cursor light beam travels.

A15. The method of clause A1, wherein the frequency at which the spectral feature adjuster is driven is one half of the pulse repetition rate.

A16. The method of clause A1, wherein the frequency at which the spectral feature adjuster is driven is one fourth of the pulse repetition rate.

A17. The method of clause A1, wherein ensuring that the spectral feature adjuster is in one of the discrete states when the pulse in the next burst is produced comprises ensuring that the spectral feature adjuster is in one of the discrete states when the initial pulse in the next burst is produced.

A18. The method of clause A1, wherein:
driving the spectral feature adjuster in the manner that is related to information received from the lithography exposure apparatus comprises driving the spectral feature adjuster according to one or more fixed parameters and receiving a request from the lithography exposure apparatus to produce the next burst of pulses; and
ensuring that the spectral feature adjuster is in a discrete state when the pulse in the next burst is produced comprises delaying, for a period of time greater than zero, the production of the next burst of pulses relative to the receipt of the request from the lithography exposure apparatus to produce the next burst of pulses.

A19. The method of clause A18, wherein delaying for the period of time the production of the next burst of pulses comprises delaying the next burst of pulses until the spectral feature adjuster can be driven to one of the discrete states that corresponds to a discrete value of the spectral feature of the amplified light beam when a pulse in the next burst of pulses is produced.

A20. The method of clause A1, wherein the information from the lithography exposure apparatus that is related to the manner in which the spectral feature adjuster is driven in between the production of the bursts of pulses and while no bursts of pulses are being produced is received prior to the end of the burst.

A21. The method of clause A1, wherein the information from the lithography exposure apparatus that is related to the manner in which the spectral feature adjuster is driven in between the production of the bursts of pulses and while no bursts of pulses are being produced is received in between the production of the bursts of pulses.

A22. The method of clause A1, wherein ensuring that the spectral feature adjuster is in one of the discrete states when a pulse in the next burst is produced comprises sending a signal to the lithography exposure apparatus, the signal including information related to how the spectral feature adjuster is being driven in between the production of the bursts of pulses and while no pulses are being produced.

A23. An apparatus comprising:
an interface configured to communicate with a lithography exposure apparatus, and to receive information from the lithography exposure apparatus;
a spectral feature adjuster; and
an optical apparatus in communication with the interface and the spectral feature adjuster, and configured to:
produce a burst of pulses of the amplified light beam at a pulse repetition rate for use by the lithography exposure apparatus for patterning a substrate;
while producing the pulse burst, drive the spectral feature adjuster among a set of discrete states at a frequency correlated with the pulse repetition rate, with each discrete state corresponding to a discrete value of the spectral feature of the amplified light beam out of a plurality of pre-set discrete values of the spectral feature, such that, each time a pulse in the burst is being produced, the spectral feature adjuster is in one of the discrete states and the amplified light beam pulse has a spectral feature that corresponds to that discrete state;
in between the production of the bursts of pulses and while no pulses are being produced, drive the spectral feature adjuster in a manner that is related to information received from the lithography exposure apparatus at the interface; and
ensure that the spectral feature adjuster is in one of the discrete states that corresponds to a discrete value of the spectral feature of the amplified light beam when a pulse in the next burst is produced.

A24. The apparatus of clause A23, wherein the spectral feature of the amplified light beam is a wavelength of the amplified light beam.

A25. The apparatus of clause A23, wherein the spectral feature adjuster includes a drive actuator in communication with the optical apparatus and configured to drive the spectral feature adjuster among the set of discrete states.

A26. The apparatus of clause A25, wherein the optical apparatus includes a control apparatus in communication with the interface and the drive actuator, and configured to:
receive indications from the interface regarding the requests from the lithography exposure apparatus that include the pulse repetition rate from the lithography exposure apparatus; and
send a driving signal to the drive actuator, wherein the driving signal is based on information received from the lithography exposure apparatus.

A27. The apparatus of clause A26, wherein the driving signal sent to the drive actuator is a sinusoidal driving signal.

A28. The apparatus of clause A23, wherein the spectral feature adjuster comprises an optical device that optically interacts with a pre-cursor light beam, and each discrete state of the optical device corresponds to a discrete state of the spectral feature adjuster.

A29. The apparatus of clause A28, wherein a discrete state of the optical device is a discrete location at which the optical device interacts with the pre-cursor light beam.

A30. The apparatus of clause A29, wherein the optical device includes a prism through which the pre-cursor light beam passes.

A31. The apparatus of clause A28, wherein the optical device is physically coupled to the drive actuator.

A32. The apparatus of clause A23, wherein the optical apparatus comprises:
a first gas discharge stage configured to generate a first pulsed light beam; and
a second gas discharge stage configured to receive the first pulsed light beam and to amplify the first pulsed light beam to thereby produce the amplified light beam from the optical apparatus.

A33. The apparatus of clause A32, wherein:
the first gas discharge stage includes a first gas discharge chamber housing an energy source and containing a gas mixture that includes a first gain medium; and
the second gas discharge stage includes a second gas discharge chamber housing an energy source and containing a gas mixture that includes a second gain medium.

A34. The apparatus of clause A23, wherein the optical apparatus is configured to drive the spectral feature adjuster in the manner that is related to information received from the lithography exposure apparatus at the interface by driving the spectral feature adjuster at the frequency correlated with the pulse repetition rate.

A35. The apparatus of clause A34, wherein the optical apparatus is configured to ensure that the spectral feature adjuster is in a discrete state when the pulse in the next burst is produced by adjusting an inter-burst time interval so that the inter-burst time interval is an integer multiple of the time interval between pulses for the pulse repetition rate, wherein the inter-burst time interval is the time interval between the last pulse and the pulse in the next burst.

A36. The apparatus of clause A34, wherein the optical apparatus is configured to ensure that the spectral feature adjuster is in a discrete state when the pulse in the next burst is produced by:
receiving an indication from the interface regarding the time at which the lithography exposure apparatus will request the production of the next burst; and
if the received indication indicates a mismatch in time between the production of the pulse in the next burst and the time at which the spectral feature adjuster is in the discrete state, then modifying one or more parameters associated with a driving signal that is sent to the spectral feature adjuster based on the received indication.

A37. The apparatus of clause A36, wherein the one or more parameters that are modified include one or more of a frequency and/or a phase of the driving signal supplied to a drive actuator of the spectral feature adjuster.

A38. The apparatus of clause A37, wherein the optical apparatus is configured to, if the frequency was modified due to a mismatch, then changing the frequency of the driving signal at the start of the next burst to be correlated with the pulse repetition rate.

A39. The apparatus of clause A23, wherein:
the optical apparatus is configured to drive the spectral feature adjuster in the manner that is related to information received from the lithography exposure apparatus at the interface by driving the spectral feature adjuster according to one or more fixed parameters and receiving a request from the lithography exposure apparatus to produce the next burst of pulses; and
the optical apparatus is configured to ensure that the spectral feature adjuster is in a discrete state when the pulse in the next burst is produced by delaying, for a period of time greater than zero, the production of the next burst of pulses relative to a receipt of a request received at the interface from the lithography exposure apparatus to produce the next burst of pulses.

A40. The apparatus of clause A39, wherein the optical apparatus is configured to delay the production of the next burst of pulses by delaying the production of the next burst of pulses until the spectral feature adjuster can be driven to one of the discrete states that corresponds to a discrete value of the spectral feature of the amplified light beam when a pulse in the next burst of pulses is produced.

A41. The apparatus of clause A23, wherein the optical apparatus includes an optical source having at least one amplification stage configured to output the amplified light beam.

A42. The apparatus of clause A41, wherein the spectral feature adjuster is a part of a spectral feature selection apparatus, the spectral feature selection apparatus receiving a pre-cursor light beam from the optical source and comprising:
a dispersive optical element arranged to interact with the pre-cursor light beam, and
a plurality of prisms arranged in the path of the pre-cursor light beam between the dispersive optical element and the optical source.

A43. The apparatus of clause A42, wherein the spectral feature adjuster is one of the prisms in the plurality of prisms and the set of discrete states of the spectral feature adjuster is a set of discrete positions of the prism at which the pre-cursor light beam interacts with the prism.

A44. The apparatus of clause A43, wherein the prism is driven among the set of discrete positions by being rotated about a prism axis to a set of discrete angles.

B1. A method comprising:
instructing an optical source to produce a burst of pulses of an amplified light beam at a pulse repetition rate;
directing the produced pulses to a lithography exposure apparatus;
while producing the pulse burst, driving a spectral feature adjuster among a set of discrete states at a frequency correlated with the pulse repetition rate, with each discrete state corresponding to a discrete value of the spectral feature of the amplified light beam out of a plurality of pre-set discrete values of the spectral feature;

in between the production of the bursts of pulses and while no pulses are being produced, driving the spectral feature adjuster according to a driving signal defined by a set of parameters;

ensuring that the spectral feature adjuster is in one of the discrete states that corresponds to a discrete value of the spectral feature of the amplified light beam when a pulse in the next burst is produced by adjusting one or more of: an instruction to the lithography exposure apparatus, the driving signal to the spectral feature adjuster, and/or the instruction to the optical source.

B2. The method of clause B1, wherein ensuring that the spectral feature adjuster is in one of the discrete states that corresponds to the discrete value of the spectral feature of the amplified light beam when the pulse in the next burst is produced comprises adjusting the driving signal to the spectral feature adjuster.

B3. The method of clause B2, further comprising receiving an indication from the lithography exposure apparatus about the time at which it will request the production of the next burst;

wherein, adjusting the driving signal to the spectral feature adjuster comprises modifying one or more of the parameters of the driving signal sent to the spectral feature adjuster based on the received indication from the lithography exposure apparatus.

B4. The method of clause B3, wherein modifying the one or more parameters of the driving signal sent to the spectral feature adjuster comprises modifying one or more of a frequency and a phase of the driving signal sent to the spectral feature adjuster.

B5. The method of clause B3, wherein the request received for the production of the next burst from the lithography exposure apparatus is delayed by enough time from the indication received from the lithography exposure apparatus in order to enable the modification of the one or more parameters so that the spectral feature adjuster is in one of the discrete states when the pulse in the next burst is produced.

B6. The method of clause B5, wherein the delay is about 25-35 milliseconds (ms).

B7. The method of clause B1, wherein ensuring that the spectral feature adjuster is in one of the discrete states that corresponds to the discrete value of the spectral feature of the amplified light beam when the pulse in the next burst is produced comprises adjusting the instruction to the optical source.

B8. The method of clause B7, wherein adjusting the instruction to the optical source comprises delaying, for a period of time greater than zero, the production of the next burst of pulses relative to the receipt of the request from the lithography exposure apparatus to produce the next burst of pulses so that the spectral feature adjuster is in one of the discrete states when the pulse in the next burst is produced.

B9. The method of clause B8, wherein delaying for the period of time the production of the next burst of pulses comprises delaying the next burst of pulses until the spectral feature adjuster can be driven to one of the discrete states that corresponds to a discrete value of the spectral feature of the amplified light beam when a pulse in the next burst of pulses is produced.

B10. The method of clause B7, wherein the spectral feature adjuster is continued to be driven in accordance with the driving signal defined by the set of parameters.

B11. The method of clause B1, wherein ensuring that the spectral feature adjuster is in one of the discrete states that corresponds to the discrete value of the spectral feature of the amplified light beam when the pulse in the next burst is produced comprises adjusting an instruction to the lithography exposure apparatus.

B12. The method of clause B11, wherein adjusting the instruction to the lithography exposure apparatus comprises sending a signal to the lithography exposure apparatus, the signal including information related to how the spectral feature adjuster is being driven in between the production of the bursts of pulses and while no pulses are being produced.

B13. The method of clause B11, further comprising receiving a trigger request for the production of the next burst from the lithography exposure apparatus, wherein the trigger request is based on the adjusted instruction to the lithography exposure apparatus and ensures that the time at which the pulse in the next burst of pulses is produced is synchronized with the moment at which the spectral feature adjuster reaches one of the discrete states.

B14. The method of clause B13, wherein the trigger request is adjusted to thereby delay an electrical pulse in the instruction to the optical source.

B15. The method of clause B 1, wherein the spectral feature of the amplified light beam is a wavelength of the amplified light beam.

B16. The method of clause B1, wherein each time a pulse in the burst is being produced, the spectral feature adjuster is in one of the discrete states and the amplified light beam pulse has a spectral feature that corresponds to that discrete state.

B17. The method of clause B1, wherein driving the spectral feature adjuster among the set of discrete states at the frequency correlated with the pulse repetition rate comprises driving the spectral feature adjuster so that the wavelength of the amplified light beam changes for each pulse of the amplified light beam between two distinct wavelengths.

B18. The method of clause B1, wherein driving the spectral feature adjuster among the set of discrete states at the frequency correlated with the pulse repetition rate comprises driving the spectral feature adjuster so that the wavelength of the amplified light beam changes for every other pulse of the amplified light beam between two distinct wavelengths.

B19. The method of clause B1, wherein driving the spectral feature adjuster among the set of discrete states comprising driving the spectral feature adjuster according to a sinusoidal driving signal.

B20. The method of clause B1, wherein driving the spectral feature adjuster comprises moving an optic that interacts with a pre-cursor light beam between discrete locations, each discrete location of the optic corresponding to a discrete state, and the amplified light beam is formed from the pre-cursor light beam.

B21. The method of clause B 1, wherein ensuring that the spectral feature adjuster is in one of the discrete states when the pulse in the next burst is produced comprises ensuring that the spectral feature adjuster is in one of the discrete states when the initial pulse in the next burst is produced.

B22. An apparatus comprising:

an interface configured to communicate with a lithography exposure apparatus;

a spectral feature adjuster;

an optical source; and a control apparatus in communication with the interface, the spectral feature adjuster, and the optical source and configured to:

instruct the optical source to produce a burst of pulses of the amplified light beam at a pulse repetition rate for use by the lithography exposure apparatus for patterning a substrate;

during the burst of pulses, drive the spectral feature adjuster among a set of discrete states at a frequency correlated with the pulse repetition rate, with each discrete state corresponding to a discrete value of the spectral feature of the amplified light beam out of a plurality of pre-set discrete values of the spectral feature;

in between the production of the bursts of pulses and while no pulses are being produced, drive the spectral feature adjuster according to a driving signal defined by a set of parameters; and ensure that the spectral feature adjuster is in one of the discrete states that corresponds to a discrete value of the spectral feature of the amplified light beam when a pulse in the next burst is produced by adjusting one or more of: an instruction to the lithography exposure apparatus, the driving signal to the spectral feature adjuster, and/or the instruction to the optical source.

B23. The apparatus of clause B22, wherein the control apparatus is configured to ensure that the spectral feature adjuster is in one of the discrete states that corresponds to the discrete value of the spectral feature of the amplified light beam when the pulse in the next burst is produced by adjusting the driving signal to the spectral feature adjuster.

B24. The apparatus of clause B23, wherein:

the control apparatus is configured to receive an indication from the lithography exposure apparatus about the time at which it will request the production of the next burst by way of the interface; and the control apparatus adjusts the driving signal to the spectral feature adjuster by modifying one or more of the parameters of the driving signal sent to the spectral feature adjuster based on the received indication from the lithography exposure apparatus.

B25. The apparatus of clause B24, wherein the control apparatus is configured to modify the one or more parameters of the driving signal sent to the spectral feature adjuster by modifying one or more of a frequency and a phase of the driving signal sent to the spectral feature adjuster.

B26. The apparatus of clause B22, wherein the control apparatus is configured to ensure that the spectral feature adjuster is in one of the discrete states that corresponds to the discrete value of the spectral feature of the amplified light beam when the pulse in the next burst is produced by adjusting the instruction to the optical source.

B27. The apparatus of clause B26, wherein the control apparatus adjusts the instruction to the optical source by delaying, for a period of time greater than zero, the production of the next burst of pulses relative to the receipt of the request from the lithography exposure apparatus to produce the next burst of pulses so that the spectral feature adjuster is in one of the discrete states when the pulse in the next burst is produced.

B28. The apparatus of clause B27, wherein the control apparatus delays for the period of time the production of the next burst of pulses by delaying the next burst of pulses until the spectral feature adjuster can be driven to one of the discrete states that corresponds to a discrete value of the spectral feature of the amplified light beam when a pulse in the next burst of pulses is produced.

B29. The apparatus of clause B27, wherein the control apparatus continues to drive the spectral feature adjuster according to the driving signal defined by the set of parameters.

B30. The apparatus of clause B22, wherein the control apparatus is configured to ensure that the spectral feature adjuster is in one of the discrete states that corresponds to the discrete value of the spectral feature of the amplified light beam when the pulse in the next burst is produced by adjusting an instruction to the lithography exposure apparatus.

B31. The apparatus of clause B30, wherein the control apparatus adjusts the instruction to the lithography exposure apparatus by sending a signal to the lithography exposure apparatus, the signal including information related to how the spectral feature adjuster is being driven in between the production of the bursts of pulses and while no pulses are being produced.

B32. The apparatus of clause B30, wherein the control apparatus is configured to receive a trigger request for the production of the next burst from the lithography exposure apparatus, the trigger request being based on the adjusted instruction to the lithography exposure apparatus and ensuring that the time at which the pulse in the next burst of pulses is produced is synchronized with the moment at which the spectral feature adjuster reaches one of the discrete states.

B33. The apparatus of clause B22, wherein the spectral feature of the amplified light beam is the wavelength of the amplified light beam.

B34. The apparatus of clause B22, wherein the spectral feature adjuster includes a drive actuator in communication with the control apparatus and configured to drive the spectral feature adjuster among the set of discrete states.

B35. The apparatus of clause B34, wherein the spectral feature adjuster comprises an optical device that optically interacts with a pre-cursor light beam, and each discrete state of the optical device corresponds to a discrete state of the spectral feature adjuster.

B36. The apparatus of clause B35, wherein a discrete state of the optical device is a discrete location at which the optical device interacts with the pre-cursor light beam.

B37. The apparatus of clause B35, wherein the optical device includes a prism through which the pre-cursor light beam passes.

B38. The apparatus of clause B35, wherein the optical device is physically coupled to the drive actuator.

B39. The apparatus of clause B35, wherein the optical source comprises:

a first gas discharge stage configured to generate a first pulsed light beam; and a second gas discharge stage configured to receive the first pulsed light beam and to amplify the first pulsed light beam to thereby produce the amplified light beam from the optical source.

B40. The apparatus of clause B22, wherein the optical source includes at least one amplification stage configured to output the amplified light beam.

B41. The apparatus of clause B22, wherein the spectral feature adjuster is a part of a spectral feature selection apparatus, the spectral feature selection apparatus receiving a pre-cursor light beam from the optical source and comprising:

a dispersive optical element arranged to interact with the pre-cursor light beam, and a plurality of prisms arranged in the path of the pre-cursor light beam between the dispersive optical element and the optical source.

B42. The apparatus of clause B41, wherein the spectral feature adjuster is one of the prisms in the plurality of prisms and the set of discrete states of the spectral feature adjuster is a set of discrete positions of the prism at which the pre-cursor light beam interacts with the prism.

B43. The apparatus of clause B42, wherein the prism is driven among the set of discrete positions by being rotated about a prism axis to a set of discrete angles.

Other implementations are within the scope of the following claims.

What is claimed is:

1. A method comprising:
   while producing a burst of pulses of an amplified light beam at a pulse repetition rate in response to a trigger signal, the amplified light beam supplied to a lithography exposure apparatus, driving a spectral feature adjuster among a set of discrete states, with each discrete state corresponding to a discrete value of the spectral feature of the amplified light beam;
   in between the production of the bursts of pulses and while no trigger signal is being received, driving the spectral feature adjuster; and
   ensuring that the spectral feature adjuster is in one of the discrete states that corresponds to a discrete value of the spectral feature of the amplified light beam when a pulse in the next burst is produced by one or more of:
      adjusting a trigger inter-burst time interval such that an inter-burst time interval is an integer multiple of a time interval between pulses of the amplified light beam;
      adjusting one or more parameters associated with driving the spectral feature adjuster in between the production of the bursts of pulses based on an indication from the lithography exposure apparatus about the time at which it will request the production of the next burst;
      delaying, for a period of time greater than zero, the production of the next burst of pulses relative to a request from the lithography exposure apparatus to produce the next burst of pulses; and
      sending a signal to the lithography exposure apparatus, the signal including information related to how the spectral feature adjuster is being driven in between the production of the bursts of pulses.

2. The method of claim 1, wherein driving the spectral feature adjuster among the set of discrete states comprises driving the spectral feature adjuster at a frequency correlated with the pulse repetition rate.

3. The method of claim 1, wherein each discrete value of the spectral feature of the amplified light beam is selected out of a plurality of pre-set discrete values of the spectral feature.

4. The method of claim 1, wherein the trigger signal is supplied from the lithography exposure apparatus.

5. The method of claim 1, wherein, in between the production of the bursts of pulses and while no trigger signal is being received, driving the spectral feature adjuster comprises driving the spectral feature adjuster in a periodic manner that is related to information received from the lithography exposure apparatus.

6. The method of claim 5, wherein driving the spectral feature adjuster in the periodic manner that is related to information received from the lithography exposure apparatus comprises driving the spectral feature adjuster at a frequency that is correlated with the pulse repetition rate.

7. The method of claim 1, wherein a pulse in the burst that is produced when the spectral feature adjuster is in one of the discrete states has a spectral feature that corresponds to that discrete state.

8. The method of claim 1, wherein ensuring that the spectral feature adjuster is in one of the discrete states that corresponds to a discrete value of the spectral feature of the amplified light beam when a pulse in the next burst is produced includes adjusting the trigger inter-burst time interval such that the inter-burst time interval is an integer multiple of the time interval between pulses of the amplified light beam; and the inter-burst time interval is the time interval between the last pulse in the burst and the first pulse in the next burst or a pulse that follows the first pulse in the next burst.

9. The method of claim 1, wherein ensuring that the spectral feature adjuster is in one of the discrete states that corresponds to a discrete value of the spectral feature of the amplified light beam when a pulse in the next burst is produced includes adjusting one or more parameters associated with driving the spectral feature adjuster in between production of the bursts of pulses based on the indication from the lithography exposure apparatus about the time at which it will request production of the next burst; and adjusting one or more parameters associated with driving the spectral feature adjuster in between the production of the bursts of pulses based on the indication from the lithography exposure apparatus about the time at which it will request the production of the next burst comprises modifying one or more of a frequency and a phase of a driving signal associated with the spectral feature adjuster.

10. The method of claim 9, further comprising, if the frequency at which the spectral feature adjuster is driven is modified due to a mismatch, then changing the frequency at which the spectral feature adjuster is driven at the start of the next burst to be correlated with the pulse repetition rate.

11. The method of claim 1, wherein ensuring that the spectral feature adjuster is in one of the discrete states that corresponds to a discrete value of the spectral feature of the amplified light beam when a pulse in the next burst is produced includes delaying, for a period of time greater than zero, the production of the next burst of pulses relative to a request from the lithography exposure apparatus to produce the next burst of pulses; and delaying, for a period of time greater than zero, the production of the next burst of pulses relative to the request from the lithography exposure apparatus to produce the next burst of pulses comprises delaying the next burst of pulses until the spectral feature adjuster can be driven to one of the discrete states that corresponds to a discrete value of the spectral feature of the amplified light beam when a pulse in the next burst of pulses is produced.

12. The method of claim 1, wherein ensuring that the spectral feature adjuster is in one of the discrete states that corresponds to a discrete value of the spectral feature of the amplified light beam when a pulse in the next burst is produced includes sending a signal to the lithography exposure apparatus, the signal including information related to how the spectral feature adjuster is being driven in between the production of the bursts of pulses; the method further comprising receiving an adjusted trigger signal, the adjusted trigger signal being based on the signal sent to the lithography exposure apparatus, the signal including information related to how the spectral feature adjuster is being driven in between the production of the bursts of pulses.

13. The method of claim 12, wherein the adjusted trigger signal causes an increase in an inter-burst time interval.

14. The method of claim 1, wherein ensuring that the spectral feature adjuster is in one of the discrete states when the pulse in the next burst is produced comprises ensuring that the spectral feature adjuster is in one of the discrete states when the initial pulse in the next burst is produced.

15. A method comprising:
while producing a burst of pulses of an amplified light beam at a pulse repetition rate in response to a trigger signal, the amplified light beam supplied to a lithography exposure apparatus, driving a spectral feature adjuster among a set of discrete states, with each discrete state corresponding to a discrete value of the spectral feature of the amplified light beam;
in between the production of the bursts of pulses and while no trigger signal is being received, driving the spectral feature adjuster; and
ensuring that the spectral feature adjuster is in one of the discrete states that corresponds to a discrete value of the spectral feature of the amplified light beam when a pulse in the next burst is produced by adjusting a trigger inter-burst time interval such that an inter-burst time interval is an integer multiple of a time interval between pulses of the amplified light beam and adjusting one or more parameters associated with driving the spectral feature adjuster in between the production of the bursts of pulses based on an indication from the lithography exposure apparatus about the time at which it will request the production of the next burst.

16. A method comprising:
while an optical source is producing a burst of pulses of an amplified light beam at a pulse repetition rate in response to a trigger signal, the amplified light beam supplied to a lithography exposure apparatus, driving a spectral feature adjuster among a set of discrete states based on a driving signal, with each discrete state corresponding to a discrete value of the spectral feature of the amplified light beam such that a pulse in the burst that is produced when the spectral feature adjuster is in one of the discrete states has a spectral feature that corresponds to that discrete state;
in between the production of the bursts of pulses and while no trigger signal is being received, continuing to drive the spectral feature adjuster in a manner that is related to information received from the lithography exposure apparatus; and
adjusting one or more of: an instruction to the lithography exposure apparatus, the driving signal to the spectral feature adjuster, and the instruction to the optical source to thereby produce a pulse in the next burst at the moment when the spectral feature adjuster is in one of the discrete states.

17. The method of claim 16, wherein:
adjusting an instruction to the lithography exposure apparatus comprises sending a signal to the lithography exposure apparatus, the signal including information related to how the spectral feature adjuster is being driven in between the production of the bursts of pulses or adjusting a trigger inter-burst time interval such that an inter-burst time interval is an integer multiple of a time interval between pulses of the amplified light beam;
adjusting the instruction to the optical source comprises delaying, for a period of time greater than zero, the production of the next burst of pulses relative to a request from the lithography exposure apparatus to produce the next burst of pulses; and
adjusting the driving signal to the spectral feature adjuster comprises adjusting one or more parameters associated with driving the spectral feature adjuster in between the production of the bursts of pulses based on an indication from the lithography exposure apparatus about the time at which it will request the production of the next burst.

18. The method of claim 17, wherein the inter-burst time interval is the time interval between the last pulse in the burst and the first pulse in the next burst or a pulse that follows the first pulse in the next burst.

19. The method of claim 16, wherein producing the pulse in the next burst at the moment when the spectral feature adjuster is in one of the discrete states comprises producing the initial pulse in the next burst when the spectral feature adjuster is in one of the discrete states.

20. An apparatus comprising:
an interface configured to communicate with a lithography exposure apparatus, and to receive information from the lithography exposure apparatus;
a spectral feature adjuster; and
an optical apparatus comprising an optical source and a control apparatus, the optical apparatus being in communication with the interface and the spectral feature adjuster, and configured to:
using the optical source, produce a burst of pulses of an amplified light beam at a pulse repetition rate for use by the lithography exposure apparatus for patterning a substrate;
while producing a burst of pulses of the amplified light beam at a pulse repetition rate in response to a trigger signal, the amplified light beam supplied to the lithography exposure apparatus, using the control apparatus, drive the spectral feature adjuster among a set of discrete states, with each discrete state corresponding to a discrete value of the spectral feature of the amplified light beam;
in between the production of the bursts of pulses and while no trigger signal is being received, using the control apparatus, drive the spectral feature adjuster; and
using the control apparatus, ensure that the spectral feature adjuster is in one of the discrete states that corresponds to a discrete value of the spectral feature of the amplified light beam when a pulse in the next burst is produced by one or more of:
adjusting a trigger inter-burst time interval such that an inter-burst time interval is an integer multiple of a time interval between pulses of the amplified light beam;
adjusting one or more parameters associated with driving the spectral feature adjuster in between the production of the bursts of pulses based on an indication from the lithography exposure apparatus about the time at which it will request the production of the next burst;
delaying, for a period of time greater than zero, the production of the next burst of pulses relative to a request from the lithography exposure apparatus to produce the next burst of pulses; and
sending a signal to the lithography exposure apparatus, the signal including information related to how the spectral feature adjuster is being driven in between the production of the bursts of pulses.

* * * * *